(12) United States Patent
Robichaud et al.

(10) Patent No.: US 11,387,804 B2
(45) Date of Patent: Jul. 12, 2022

(54) ELECTROMECHANICALLY DAMPED RESONATOR DEVICES AND METHODS

(71) Applicants: Alexandre Robichaud, Montreal (CA); Paul-Vahe Cicek, Montreal (CA); Dominic Deslandes, Chambly (CA); Frederic Nabki, Montreal (CA)

(72) Inventors: Alexandre Robichaud, Montreal (CA); Paul-Vahe Cicek, Montreal (CA); Dominic Deslandes, Chambly (CA); Frederic Nabki, Montreal (CA)

(73) Assignee: ECOLE TECHNOLOGIE SUPERIEURE, Montreal (CA)

( * ) Notice: Subject to any disclaimer, the term of this patent is extended or adjusted under 35 U.S.C. 154(b) by 0 days.

(21) Appl. No.: 16/867,080

(22) Filed: May 5, 2020

(65) Prior Publication Data

US 2020/0358420 A1   Nov. 12, 2020

Related U.S. Application Data

(60) Provisional application No. 62/843,686, filed on May 6, 2019.

(51) Int. Cl.
| | |
|---|---|
| *H03H 9/09* | (2006.01) |
| *H03H 9/24* | (2006.01) |
| *H03H 9/02* | (2006.01) |
| *H03H 3/007* | (2006.01) |

(52) U.S. Cl.
CPC ............ *H03H 9/09* (2013.01); *H03H 3/0072* (2013.01); *H03H 9/02338* (2013.01); *H03H 9/2436* (2013.01)

(58) Field of Classification Search
CPC .. H03H 9/09; H03H 9/02436; H03H 9/02338; H03H 3/0072; B60B 1/0666
See application file for complete search history.

(56) References Cited

U.S. PATENT DOCUMENTS

2019/0193116 A1 * 6/2019 Horsley ................ G10K 9/122

* cited by examiner

*Primary Examiner* — Jeffrey M Shin
(74) *Attorney, Agent, or Firm* — Rosenberg, Klein & Lee

(57) ABSTRACT

Micro-machined acoustic and ultrasonic transducer (MAUT), particularly piezoelectric MAUT (PMAUT), performance tradeoffs have meant reasonable pixel depth resolution necessitated low quality factor (Q) transducers with power distributed over a large bandwidth yielding modest imaging ranges whilst high-Q transducers providing higher acoustic power output for longer imaging ranges exhibit extended ringing limiting pixel depth information. Accordingly, the inventors have established MAUTs supporting high-Q transducers for long-range high-resolution imaging by integrating electromechanical actuators (dampers) which can be selectively engaged to mechanically damped the MAUT. In several applications PMAUT arrays are required where all transducer elements should have almost identical resonant frequencies. However, prior art fabrication processes have tended to produce PMAUTs with large inter-chip and inter-wafer variances. Prior art methodologies to reduce inter-wafer process variations do not address intra-wafer or inter-chip process variations and accordingly the inventors have established manufacturing methodologies and design solutions to address these for the PMAUT resonant frequency.

21 Claims, 32 Drawing Sheets

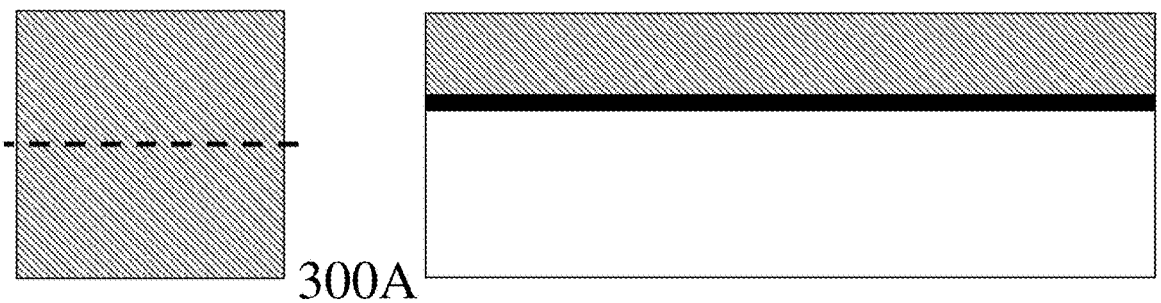
300A
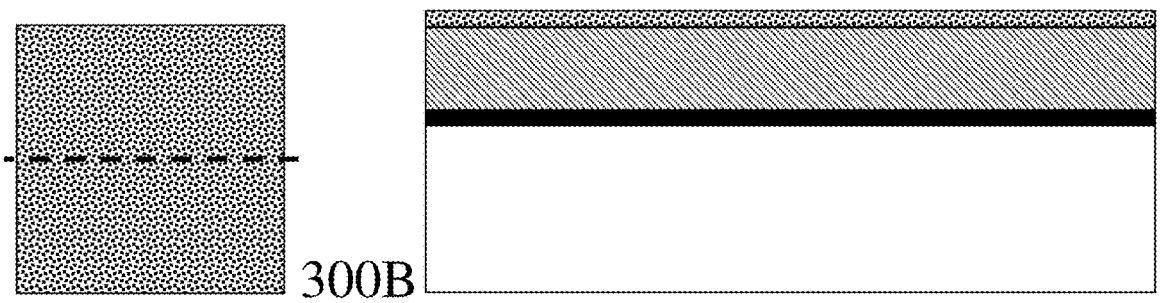
300B
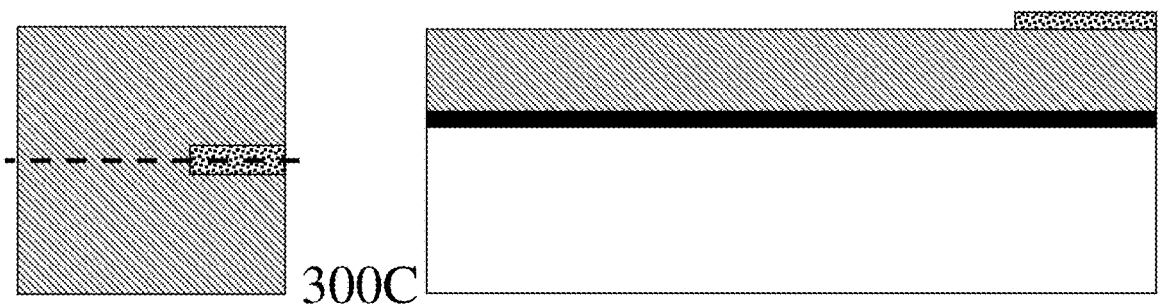
300C
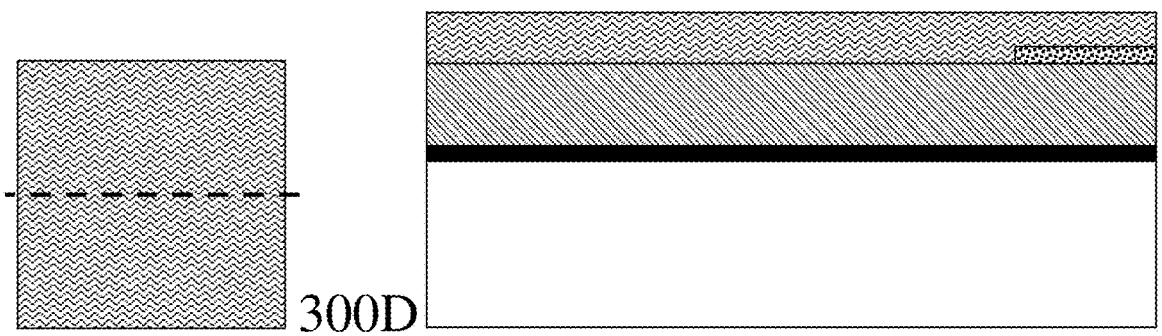
300D
Figure 3A  Silicon  Resist  Substrate  Resist
         Pad Oxide  Aluminum  Aluminum Nitride

1000A

1000B

1000C

1000D

| Silicon | Resist | Substrate | Resist |
| Pad Oxide | Aluminum | Aluminum Nitride | Parylene-C |

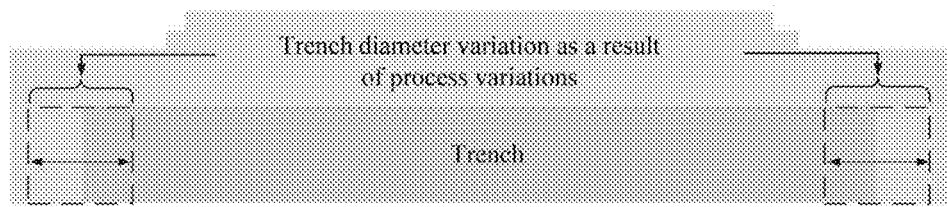
Figure 21A
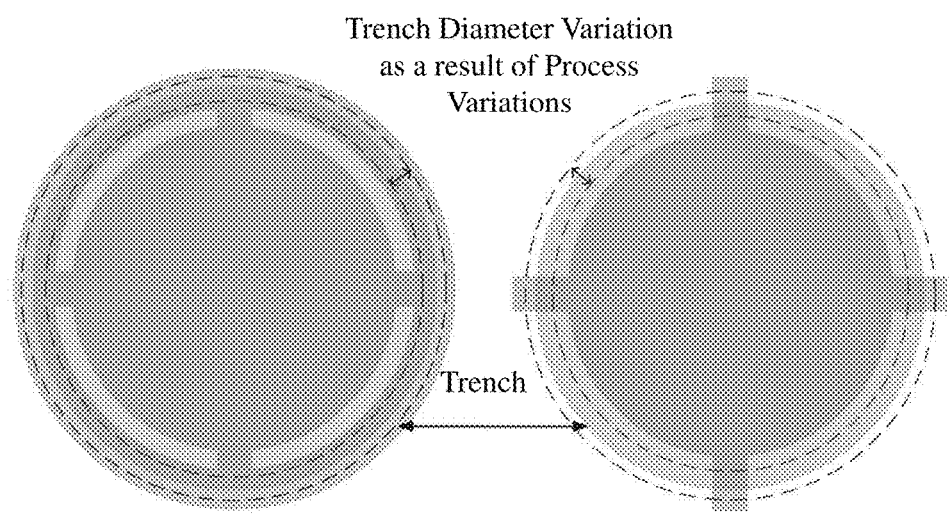
Figure 21B          Figure 21C
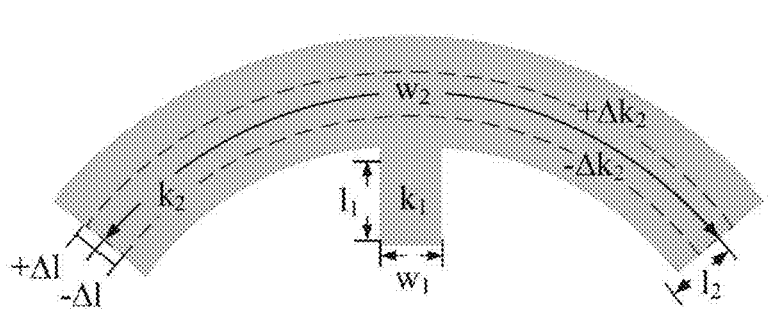          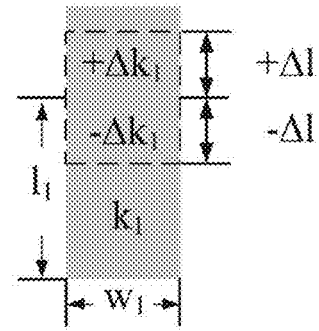
Figure 21D          Figure 21E

ELECTROMECHANICALLY DAMPED RESONATOR DEVICES AND METHODS

CROSS-REFERENCE TO RELATED APPLICATIONS

This application claims the benefit of priority from U.S. Provisional Patent Application 62/843,686 entitled "Electromagnetically Damped Resonator Devices and Methods" filed May 6, 2019; the entire contents of which are incorporated herein by reference.

FIELD OF THE INVENTION

This patent application relates to microelectromechanical systems (MEMS) resonators and more particularly methods for and devices exploiting electromechanical damping.

BACKGROUND OF THE INVENTION

There has been growing interest in micro-machined acoustic and ultrasonic transducers (referred to within this specification as MAUTs) as a low-cost and efficient alternative to conventional acoustic and ultrasonic transducer devices. Beneficially, MAUTs offer the potential to be integrated monolithically with silicon or other semiconductor integrated circuits (ICs) since they are typically fabricated using similar processes. This also makes it possible for their fabrication through high volume semiconductor production facilities allowing mass production at low cost. A MAUT can be implemented, typically, to rely either upon capacitive (CMAUT) or piezoelectric (PMAUT) transduction however techniques for multiple transduction mechanisms also exist. A CMAUT typically consists of a suspended conductive membrane separated from an electrode by an air gap. The CMAUT device is biased using a DC voltage and driven by an AC signal to make the membrane vibrate, thus producing acoustic waves. In order to maximize ultrasound generation, the CMAUT is usually biased close to its electrostatic pull-in voltage, increasing the likelihood of device failure. Furthermore, optimal air gap size is different for transmission and reception modes. Further, to achieve strong transmission, the air gap should be large to allow for driving the device with a high-amplitude signal without electrostatic collapse, whereas, for sensitive reception, the air gap should be narrow in order to maximize capacitive coupling. As such, optimal performance relying on CMAUT design methodologies may impose the use of two distinct sets of device parameters for transmitter and receiver.

In contrast a PMAUT relies upon the piezoelectric effect. Accordingly, no DC bias voltage is required, and the same structure can thus be used for optimal ultrasonic transmission and reception. Moreover, the signal to noise ratio is generally superior for PMAUT. Within the prior art PMAUTs have successfully been demonstrated in several applications including, for example distance sensing, gesture recognition and medical imaging.

Within imaging in air, an important application of MAUT transducers, an array of transducer elements is employed for which two of the critical system performance parameters are:

pixel depth resolution, determined by the duration of the acoustic signal emitted by a transducer element wherein shorter signal duration allows for higher transverse resolution due to the reduced spread of the emitted pulse; and imaging range, which depends upon the power of the acoustic signal emitted by a transducer element wherein higher output power offers the ability to perform imaging at a longer imaging range.

In order to achieve reasonable pixel depth resolution, typical ultrasonic imaging systems have no option but to resort to low quality factor (Q) transducers in order to minimize the ringing that would otherwise significantly increase the duration of the produced acoustic pulse. However, because of their distribution of power over a large bandwidth, low-Q transducers exhibit a modest imaging range, thus placing a limit on possible applications. Alternatively, a high-Q transducer, driven by a continuous-wave signal at its resonance frequency, would provide significantly higher acoustic power output, but could not be used in time-of-flight measurements, which typically require pulsed operation.

Accordingly, it would be beneficial to provide designers with resonator designs that combine aspects of both domains. Accordingly, the inventors have established innovative design concepts for MAUTs allowing the use of high-Q transducers in long-range and/or high-resolution imaging. The inventive concepts established by the inventors relate to the integration of electromechanical actuators (dampers) within the design of the MAUTs allowing for selective control of the Q of the transducer over time.

In several applications PMAUT arrays are required. However, the fabrication of state-of-the-art PMAUT arrays presents several challenges, as they require a large number of elements. Further, all transducer elements are expected to have almost identical resonant frequencies. Conventional fabrication processes use a silicon on insulator (SOI) substrate and release the PMAUT's membrane by using a deep reactive-ion etch (DRIE) process to etch trenches through the entire thickness of the substrate wafer. However, the disadvantage of this is that the resonant frequency of the PMAUT is now dependent upon the trench diameter and thus process variations. As a result, this prior art approach tends to produce PMAUTs having resonant frequencies with large inter-chip variance.

Other solutions within the prior art to remove the requirement for deep etching a trench through the bottom silicon wafer, such as releasing the membrane by etching an underlying sacrificial layer requires that not only is a high quality piezoelectric film deposited but this film should have low internal residual stress. Alternatively, other methodologies to tune the resonators are beneficial for reducing inter-wafer process variations but do not address intra-wafer process variations.

Accordingly, it would be beneficial to provide PMAUT designers and PMAUT manufacturers with manufacturing processes and design solutions which address these prior art limitations and provides improved inter-chip reproducibility of the PMAUT resonant frequency.

Other aspects and features of the present invention will become apparent to those ordinarily skilled in the art upon review of the following description of specific embodiments of the invention in conjunction with the accompanying figures.

SUMMARY OF THE INVENTION

It is an object of the present invention to mitigate limitations within the prior art relating to microelectromechanical systems (MEMS) resonators and more particularly methods for and devices exploiting electromechanical damping.

In accordance with an embodiment of the invention there is provided a method comprising:
providing a microelectromechanical systems (MEMS) resonator for generating an acoustic signal;
providing a plurality of masses;
providing a plurality of actuators, each actuator coupled to a predetermined mass of the plurality of masses; wherein
in a first configuration the plurality of actuators are each in a first state such the predetermined mass of the plurality of masses to which they are coupled are into physical contact with the MEMS resonator; and
in a second configuration the plurality of actuators are each in a second state such the predetermined mass of the plurality of masses to which they are coupled are moved out of physical contact with the MEMS resonator.

In accordance with an embodiment of the invention there is provided a device comprising:
a microelectromechanical systems (MEMS) resonator for generating an acoustic signal;
a plurality of masses;
a plurality of actuators, each actuator coupled to a predetermined mass of the plurality of masses; wherein
in a first configuration the plurality of actuators are each in a first position relative to the MEMS resonator such the predetermined mass of the plurality of masses to which they are coupled are into physical contact with the MEMS resonator; and
in a second configuration the plurality of actuators are each in a second position relative to the MEMS resonator such the predetermined mass of the plurality of masses to which they are coupled are moved out of physical contact with the MEMS resonator.

In accordance with an embodiment of the invention there is provided a method comprising:
fabricating a microelectromechanical systems (MEMS) resonator;
establishing a resonance frequency of a predetermined mode of the MEMS resonator;
depositing a predetermined thickness of a conformal layer of a predetermined material to the top and sides of a resonant membrane of the MEMS resonator; wherein
the predetermined thickness of the conformal layer of the predetermined material is established in dependence upon a difference between the established resonance frequency of the MEMS resonator and a target resonant frequency of the MEMS resonator.

In accordance with an embodiment of the invention there is provided a method comprising:
fabricating a plurality of microelectromechanical systems (MEMS) resonators across a substrate;
establishing a resonance frequency of a predetermined mode of a subset of the plurality of MEMS resonators;
establishing a map relating to one or more of the frequencies, frequency offsets, and damping factors of the plurality of MEMS resonators across the substrate;
establishing a plurality of regions within the frequency offset map, each region defining one or more of a predetermined frequency offset range, a mean frequency offset, and a damping factor range of the MEMS resonators within that region from a target resonant frequency;
depositing a plurality of predetermined thicknesses of a conformal layer of a predetermined material to the top and sides of a resonant membrane of each MEMS resonator of the plurality of MEMS resonators; wherein
each predetermined thickness of the plurality of predetermined thicknesses of the conformal layer is established in dependence upon a region of the plurality of regions and applied to that region of the plurality of regions; and
each predetermined thickness of the plurality of predetermined thicknesses of the conformal layer is established in dependence upon at least one of a difference between the mean frequency offset for that region of the plurality of regions and the target resonant frequency and the damping factor for that region of the plurality of regions.

In accordance with an embodiment of the invention there is provided a device comprising:
a microelectromechanical systems (MEMS) resonator having a first resonance frequency of a predetermined mode of the MEMS resonator; wherein
the MEMS resonator has a second resonance frequency of the predetermined mode of the MEMS resonator absent a conformal coating forming part of a resonant membrane of the MEMS resonator.

Other aspects and features of the present invention will become apparent to those ordinarily skilled in the art upon review of the following description of specific embodiments of the invention in conjunction with the accompanying figures.

BRIEF DESCRIPTION OF THE DRAWINGS

Embodiments of the present invention will now be described, by way of example only, with reference to the attached Figures, wherein:

FIGS. 3A to 3C depict an exemplary process flow for fabricating a PMAUT according to an embodiment of the invention exploiting the PiezoMUMPs™ process flow;

FIGS. 21A to 21E depict a toroidal anchoring methodology for PMAUTS according to an embodiment of the invention;

DETAILED DESCRIPTION

Figure 1A:
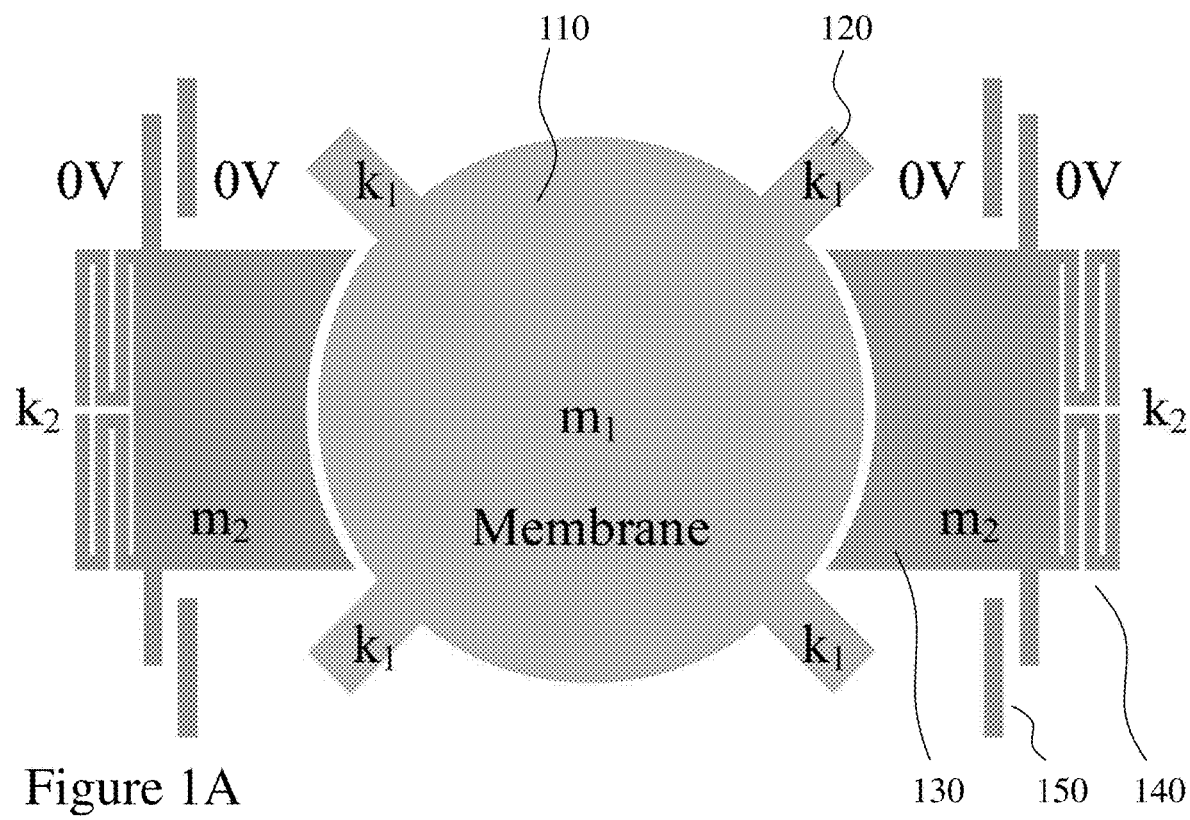
FIG. 1A depicts a schematic of a PMAUT according to an embodiment of the invention when no voltage is applied to the electromechanical actuators.

The present invention is directed to microelectromechanical systems (MEMS) resonators and more particularly methods for and devices exploiting electromechanical damping.

The ensuing description provides representative embodiment(s) only, and is not intended to limit the scope, applicability or configuration of the disclosure. Rather, the ensuing description of the embodiment(s) will provide those skilled in the art with an enabling description for implementing an embodiment or embodiments of the invention. It being understood that various changes can be made in the function and arrangement of elements without departing from the spirit and scope as set forth in the appended claims. Accordingly, an embodiment is an example or implementation of the inventions and not the sole implementation. Various appearances of "one embodiment," "an embodiment" or "some embodiments" do not necessarily all refer to the same embodiments. Although various features of the invention may be described in the context of a single embodiment, the features may also be provided separately or in any suitable combination. Conversely, although the invention may be described herein in the context of separate embodiments for clarity, the invention can also be implemented in a single embodiment or any combination of embodiments.

Reference in the specification to "one embodiment", "an embodiment", "some embodiments" or "other embodiments" means that a particular feature, structure, or characteristic described in connection with the embodiments is included in at least one embodiment, but not necessarily all embodiments, of the inventions. The phraseology and terminology employed herein is not to be construed as limiting but is for descriptive purpose only. It is to be understood that where the claims or specification refer to "a" or "an" element, such reference is not to be construed as there being only one of that element. It is to be understood that where the specification states that a component feature, structure, or characteristic "may", "might", "can" or "could" be included, that particular component, feature, structure, or characteristic is not required to be included.

Reference to terms such as "left", "right", "top", "bottom", "front" and "back" are intended for use in respect to the orientation of the particular feature, structure, or element within the figures depicting embodiments of the invention. It would be evident that such directional terminology with respect to the actual use of a device has no specific meaning as the device can be employed in a multiplicity of orientations by the user or users.

Reference to terms "including", "comprising", "consisting" and grammatical variants thereof do not preclude the addition of one or more components, features, steps, integers or groups thereof and that the terms are not to be construed as specifying components, features, steps or integers. Likewise, the phrase "consisting essentially of", and grammatical variants thereof, when used herein is not to be construed as excluding additional components, steps, features integers or groups thereof but rather that the additional features, integers, steps, components or groups thereof do not materially alter the basic and novel characteristics of the claimed composition, device or method. If the specification or claims refer to "an additional" element, that does not preclude there being more than one of the additional element.

1: De-Tuning Microelectromechanical Systems Resonators

1A: Background

As noted above it would be beneficial to provide designers of systems exploiting MAUTs and/or MAUTs themselves with resonator designs that provide the beneficial aspects of high Q resonators in order to provide higher acoustic output and low Q resonators to reduce the duration of the generated acoustic pulses. Accordingly, the inventors have established innovative design concepts for MAUTs allowing the use of high-Q transducers in long-range and/or high-resolution imaging. The inventive concepts established by the inventors relate to the integration of electromechanical dampers (actuators) within the design of the MAUTs allowing for selective control of the Q of the transducer over time.

Within the prior art filters and electromagnetic resonators have been reported that are tunable using MEMS techniques. For example, a thermal actuator or RF-MEMS switches have been employed to tune band-stop filters. Alternatively, a MEMS comb-drive has been employed to implement a frequency-tunable slot antenna whilst within other prior art the frequency of electromagnetic cavity resonators has been tuned using electrostatically-actuated thin diaphragms. Further, within other prior art the coupling regime of a silicon micro-disk optical resonator has been tuned using MEMS actuation.

Within other prior art actuators have similarly been used to tune the frequency of energy harvesters. For example, the resonant frequency of a piezoelectric energy harvester has been reported where axially compressing the structure lowered the resonant frequency, yielding a frequency shift of 24%. Alternatively, an energy harvester employing an actuator and a control unit has been reported wherein based upon the ambient vibration, the control unit adjusts the frequency of the harvester by enabling the actuator. Within other prior art the frequency of a resonator is tuned by applying mechanical stress by means of piezoelectric actuation or the frequency of an energy harvester is tuned using a movable mass exploiting a non-MEMS based technology.

However, within the target applications it is desirable for the resonator to be "damped" rapidly in order for the emitted acoustic pulse to be terminated rather than shifted in frequency. Accordingly, it would be beneficial to integrate a MEMS based electrostatically-controlled actuator to quickly dampen the oscillation of a PMAUT device in order to decrease the pulse duration in the time domain. This, thereby, allowing the PMAUT to provide improved axial resolution for imaging or ranging applications without sacrificing acoustic power transmission. Within Section 1B a brief theoretical background is provided whilst Section 1C and Section 1D present exemplary designs and experimental results for PMAUTs with actuators according to embodiments of the invention.

1B: Theoretical Background

Figure 1B:
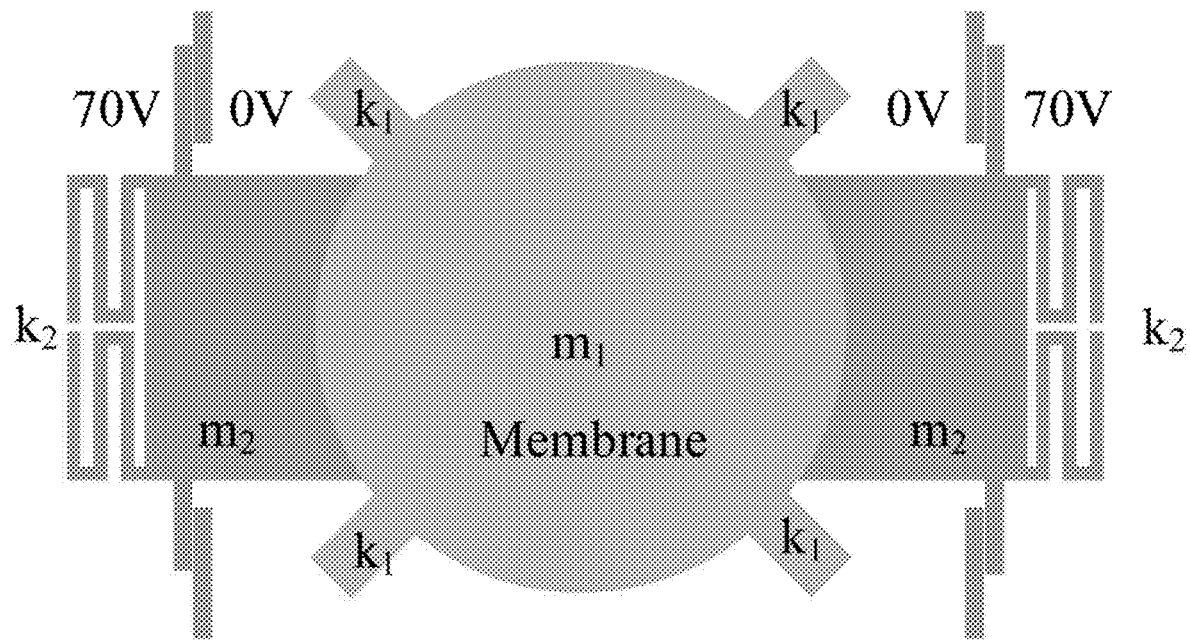
FIG. 1B depicts a schematic of a PMAUT according to an embodiment of the invention when a voltage is applied to the electromechanical actuators.

Referring to FIGS. 1A and 1B respectively there are depicted schematics for a PMAUT according to an embodiment of the invention when no voltage is applied to the electromechanical actuators (FIG. 1A) and a voltage is applied to the electromechanical actuators (FIG. 1B). Accordingly, the PMAUT with no voltage applied as depicted in FIG. 1A is not damped by the electromechanical actuators and hence can move thereby generating an acoustic or ultrasonic signal according to its designed operating frequency regime. However, in FIG. 1B the PMAUT with a voltage applied to the electromechanical actuators is damped such that it no longer moves. It would be evident that within alternate embodiments of the invention the electromechanical actuators may be implemented such that the PMAUT is dampened when no voltage is applied to the electromechanical actuator and the electromechanical actuators removed allowing the PMAUT to move by the application of a voltage. Optionally, within other embodiments of the invention the electromechanical actuator may be biased to a position between the two "operating" positions such that a first voltage of a first polarity moves the electromechanical actuator to dampen the PMAUT and a second voltage of the reverse polarity moves the electromechanical actuator further away to allow movement of the PMAUT.

Referring to FIGS. 1A and 1B the exemplary PMAUT employs a membrane 110 which is connected to four support arms 120, which are connected to the substrate, but these aspects are omitted for clarity. Such a design being similar to that reported by the inventors within Robichaud et al. "Frequency Tuning Technique of Piezoelectric Ultrasonic Transducers for Ranging Applications" (J. Microelectromechanical Systems, Vol. 27, No. 3, pp. 570-579) and Robichaud et al. in "A Novel Topology for Process Variation Tolerant Piezoelectric Micromachined Ultrasonic Transducers" (J. Microelectromechanical Systems, Vol. 27, No. 6, pp. 1204-1212) which are contained essentially below in respect of Sections 2 and 3 respectively. Disposed adjacent to the membrane 110 are two masses 130 which are spring-mounted by springs 140 which can be displaced by two electrostatic actuators, not depicted for clarity, allowing the masses 130 to be moved away from the membrane 110 allowing it move (FIG. 1A) or exert mechanical force onto the membrane 110 (FIG. 1B). Also depicted is a mechanical stop 150 which limits motion of a mass 130 towards the membrane 110. Optionally, a second stop may be employed to limit motion of a mass away from the membrane 110.

1B1: Operating Principle

Whilst high-Q transducers are more efficient energy-wise, they also produce acoustic pulses with a longer ring-out time than lower-Q transducers. Accordingly, this has previously limited their application in systems where this longer ring-out time yields a negative impact on the axial resolution which can be defined as the minimum distance between two reflectors on the travelling axis of an acoustic pulse that allows for the two pulse reflections to be properly discriminated when using high-Q transducers. This is simply given by Equation (1) where Δt is the pulse duration and c is the speed of sound within the medium, e.g. air.

$$\text{Res}_{ax} = (\Delta t \cdot c)/2 \tag{1}$$

Figure 2A:
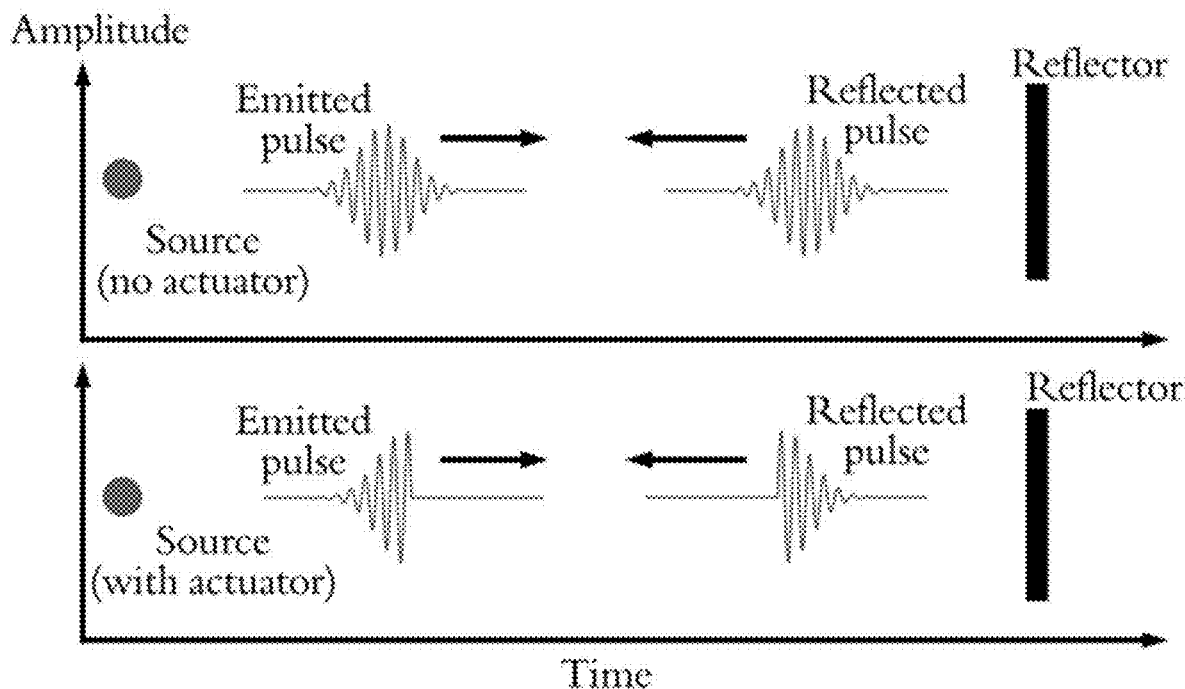
FIG. 2A depicts a schematic representation of the influence of the electromechanical actuator on the acoustic pulse from a PMAUT according to an embodiment of the invention.

Within prior art transducers a damping layer is commonly employed in order to reduce their quality factor and therefore increase axial resolution. However, this is achieved at the expense of transmission power efficiency. Accordingly, the innovative design methodology established by the inventors reduces the duration of the acoustic pulse by dynamically using an electromechanical damper allowing axial resolution to be maintained whilst preserving the superior power transmission efficiency of a higher Q resonator. This electromechanical damper can be activated at any point in time to quickly stop the ringing of the PMAUT membrane. FIG. 2A illustrates the potential effect of the actuator in the time domain. When no actuator is used then the acoustic pulse is long as depicted in the upper section of FIG. 2A. However, when using the actuator, the pulse from the resonator can be shortened as depicted on the bottom section of FIG. 2A whilst minimizing impact to the efficiency of the resonator. Accordingly, this method may be employed to provide MAUTs supporting high efficiency, high precision acoustic imaging. Within a practical application, it would be necessary to synchronize activation of the MAUT and of the actuator in order to modulate a pulse of the desired length to achieve the target resolution.

1B2: Influence of Mechanical Damper on Resonant Frequency

In order to establish a baseline understanding of the influence of the actuated dampers on the structure described and depicted in FIGS. 1A and 1B the inventors initially considered modeling in a lumped element manner without consideration of tribological properties of the structure. Accordingly, when no voltage is applied at the driving terminals of the two electrostatic actuators, the PMAUT can resonate freely and is not influenced by the dampers. In this case, its resonant frequency in the first transverse mode can be expressed as Equation (2) where $k_1$ is the total spring constant of the four supports and $m_1$ the mass of the PMAUT. It should be noted that Equation (2) assumes minimal impact of the membrane's flexing/flexure on the resonant frequency.

When the electrostatic actuators are activated, masses $m_2$ move towards the PMAUT membrane until they come into full mechanical contact with it. The electrostatic gap width between the driving electrodes of the actuators is carefully chosen to be slightly larger than the displacement required to collapse the masses into the membrane, in order to prevent short-circuits after the motion is complete.

$$f_{0,1} = \frac{1}{2\pi}\sqrt{\frac{k_1}{m_1}} \tag{2}$$

$$f_{0,2} = \frac{1}{2\pi}\sqrt{\frac{k_1+k_2}{m_1+m_2}} \tag{3}$$

$$\frac{k_1}{m_1} > \frac{k_2}{m_2} \tag{4}$$

$$f_{0,1} > f_{0,2} \tag{5}$$

When both masses come into contact with the membrane (see FIG. 1B), it is assumed that the electrostatic force keeps them in contact in such a way that they all resonate together as a single structure. In this case, the influence of the spring constant and the mass of the actuator on the overall resonant frequency can be estimated by Equation (3) where $k_2$ is the spring constant of the electrostatic actuator's spring. Provided that the condition defined by Equation (4) is met then we obtain the result given by Equation (5). Alternatively, when the condition defined by Equation (6) is met we have the result given by Equation (7).

$$\frac{k_1}{m_1} < \frac{k_2}{m_2} \tag{6}$$

$$f_{0,1} < f_{0,2} \tag{7}$$

Figure 2B:
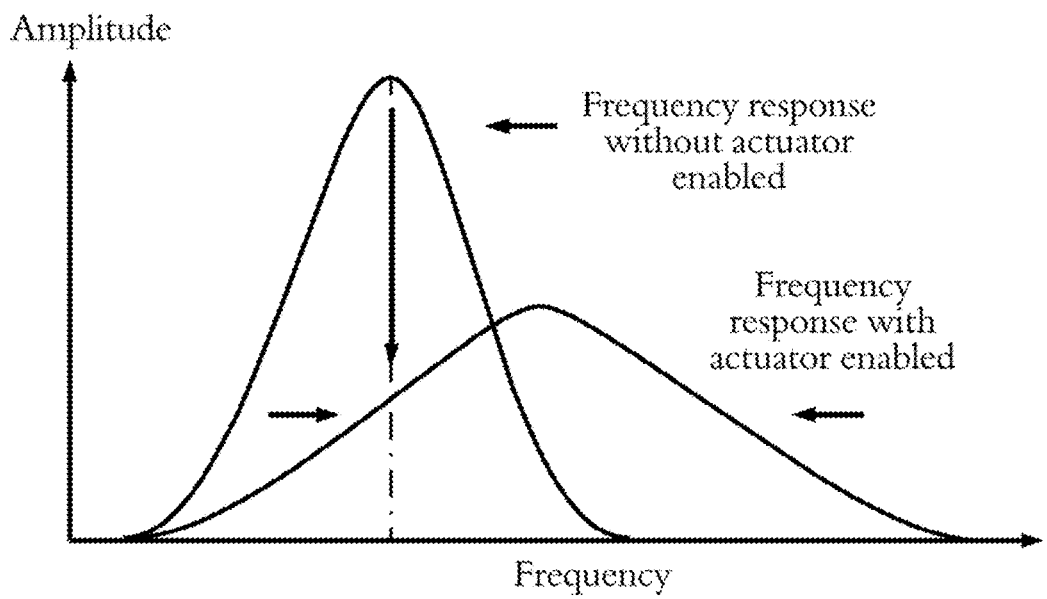
FIG. 2B depicts a schematic representation of the influence of the electromechanical actuator on the PMAUT resonant frequency for a PMAUT according to an embodiment of the invention.

Hence, the resonant frequency will either increase or decrease depending on the ratio of the spring constant and masses between the PMAUT and actuator. In theory, by appropriate design of the spring constant and mass of the actuator, the PMAUT's resonant frequency can be tuned away from the working frequency (i.e. the base resonant frequency of the PMAUT membrane) when the electrostatic actuator is pulled into contact with the PMAUT membrane. This decreases the effective membrane displacement amplitude at the working frequency, an effect that is further amplified by the damping action of the actuator, as depicted in FIG. 2B.

Accordingly, the dampers can be used to shorten the pulse length in the time domain whilst when the dampers are not enabled whilst the PMAUT benefits from a higher Q and higher efficiency.

1B3: Key Parameters for Stiffnesses $k_1$ and $k_2$ and Masses $m_1$ and $m_2$

The thickness of the membrane is generally set by the manufacturing technology selected for fabricating the PMAUT and accordingly, once this technology has been selected, is considered as fixed and cannot be modified. To increase $k_1$ therefore the length of the anchor has to be reduced or its width increased. To decrease $k_1$ the opposite holds. To increase $k_2$ either the width of the beam forming the spring can be increased or the number of folded sections within the spring reduced. To decrease $k_2$ the opposite holds. Furthermore, to increase $m_2$ the surface area of $m_2$ has to be increased, while to decrease it, its surface area may be decreased. Finally, $k_1$ has a direct influence on the quality factor of the device. In fact, $k_1$ is damping the movement of the membrane and therefore, a higher value of $k_1$ results in a lower quality factor and vice versa.

1B4: Influence of Mechanical Damper on Displacement Amplitude at Resonance

Placing the dampers in contact with the PMAUT membrane adds stiffness and mass to the compound structure, while also increasing the effective anchored perimeter of the membrane, which are all expected to introduce mechanical damping and reduce the displacement amplitude. Furthermore, even though the electrostatic force attracts both structures and keeps them in contact, the interface is likely to experience some degree of slippage, introducing friction and other tribological phenomena. These effects might be expected to further increase damping. Finally, when the actuator is active, a mechanical force is applied on the membrane which in turn can have an impact of the membrane stress and consequently on the resonant frequency of the PMAUT. In order to mitigate this effect, the inventors within the exemplary embodiments of the invention described below and for which results are presented intentionally designed the stiffness of the damper springs to be much lower than the in-plane stiffness of the ultrasonic membrane.

1C: Design
1C1: Fabrication Process

Figure 3B:
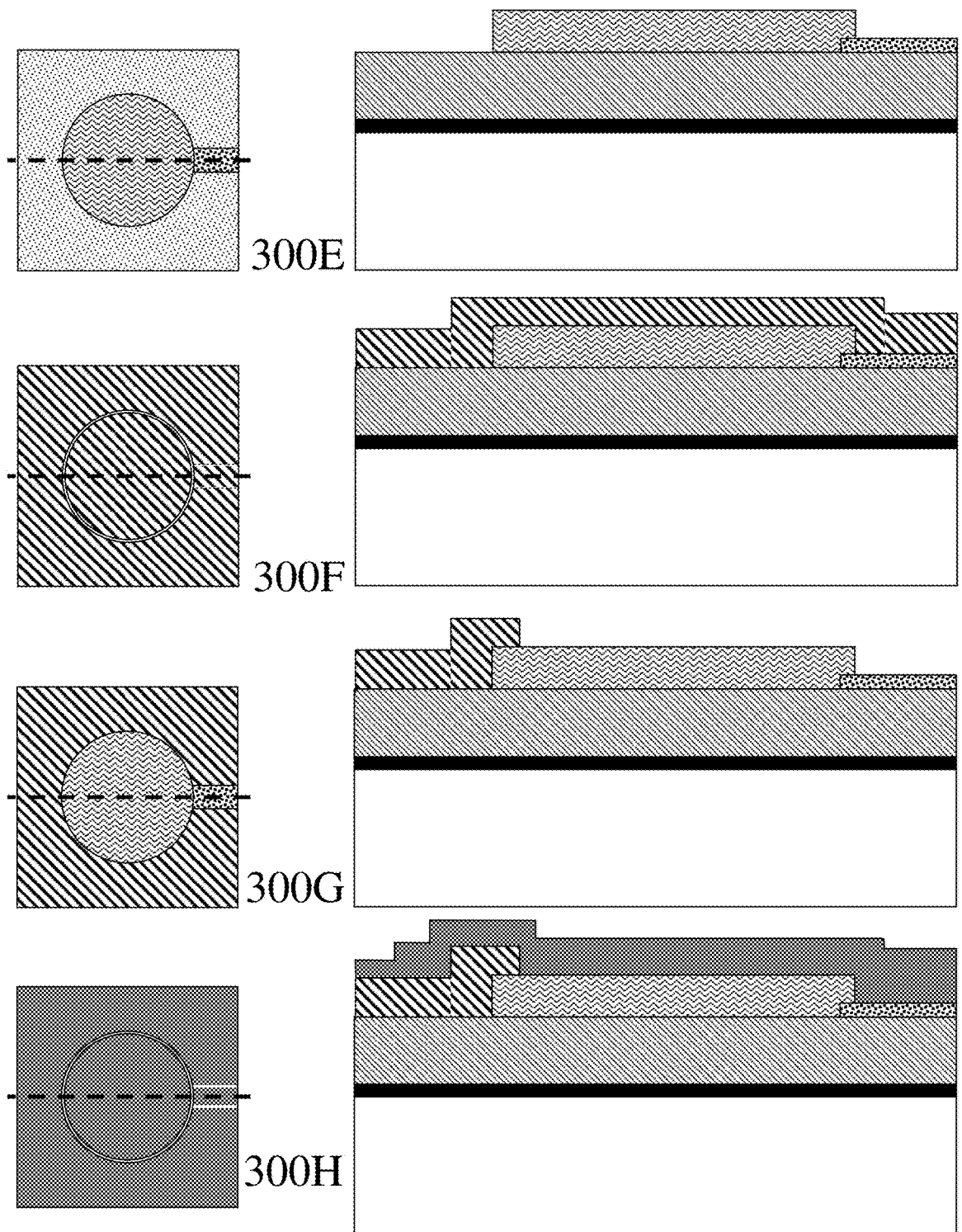

Devices designed by the inventors to exploit the mechanical damper concepts described above in respect of Section 1B were fabricated using the commercial PiezoMUMPs™ process from MEMSCAP Inc. Accordingly, the devices were fabricated using the sequence of process stages illustrated in FIGS. 3A to 3C, respectively. Referring to FIG. 3A the first to fourth process stages 300A to 300D are depicted comprising:

First process stage 300A wherein a SOI wafer is covered with a 400 nm thick insulator layer and a 10 µm thick silicon device layer. The wafer is doped using a phosphosilicate glass (PSG) layer deposited onto the wafer and annealed for 1 hour at around 1000° C. before being wet etched;

Second process stage 300B wherein a pad oxide layer of approximate thickness 200 nm is thermally grown onto the wafer;

Third process stage 300C wherein photoresist is applied and patterned using standard photolithography techniques (e.g., wet etching) wherein the oxide layer prevents short circuits between the doped silicon layer acting as the bottom electrode and the aluminum top electrode subsequently deposited; and Fourth process stage 300D wherein a 500 nm aluminium nitride piezoelectric layer is deposited by sputtering.

Referring to FIG. 3B the fifth to eighth process stages 300E to 300H are depicted comprising:

Fifth process stage 300E wherein the aluminum nitride layer is patterned using standard lithography and wet etching in order to produce a circular membrane of 200 µm diameter as well as forming the dampers and actuators;

Sixth process stage 300F wherein photoresist is deposited on the top surface in preparation for lift-off of the aluminum pads;

Seventh process stage 300G wherein the photoresist is patterned through standard photolithography; and Eighth process stage 300H wherein a 1 µm thick aluminum layer is deposited by e-beam evaporation.

Figure 3C:
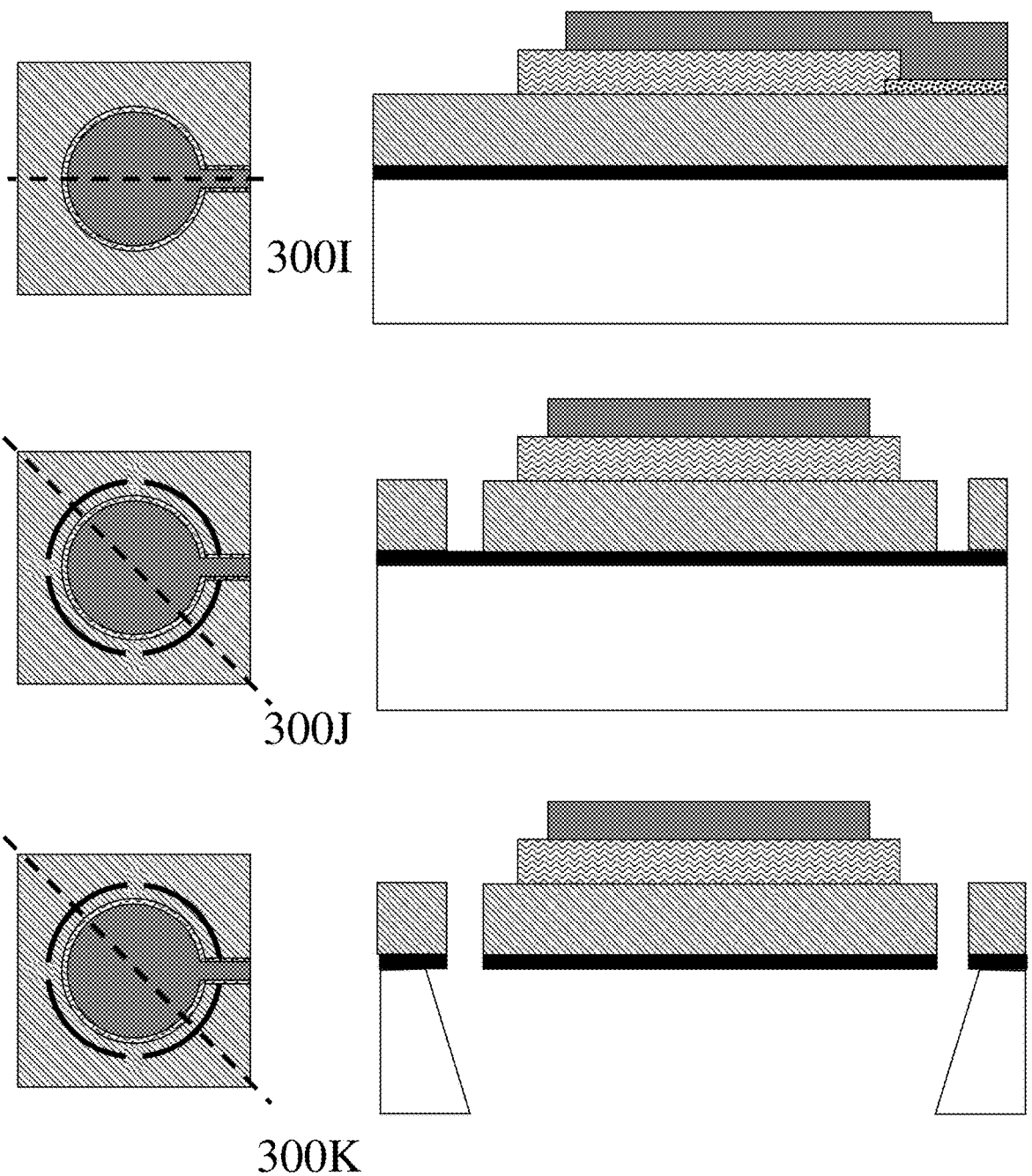

Referring to FIG. 3C the ninth to eleventh process stages 300I to 300K are depicted comprising:

Ninth process stage 300I wherein the resist is removed lifting off the aluminum leaving a circular aluminum layer with a 190 µm diameter and aluminum rectangles allowing electrical connections to the PMAUT and actuator. The diameter of the aluminum circle is smaller than that of the aluminum nitride in order to prevent contact to the bottom electrode.

Tenth process stage 300J wherein the silicon device layer is etched by Deep Reactive Ion Etching (DRIE) resulting in a circular silicon membrane and four supports embedded with two actuators on the sides. The diameter of the silicon structure is made larger than the aluminum nitride to ensure no overhang of the piezoelectric material.

Eleventh process stage 300K wherein the membrane is released by etching a trench from the back of the handle wafer by DRIE and wet etch to remove the oxide.

The 200 µm diameter of the aluminum nitride layer corresponds to the minimum achievable size conforming to the fabrication process design rules. This was chosen by the inventors also to provide the most compact device, an important consideration when considering arrays of PMAUT devices. This choice therefore establishes the resonant frequency of the PMAUTs fabricated. Further, the design rules of the commercial PiezoMUMPs™ process from MEMSCAP Inc. require that the aluminum must enclose the aluminum nitride by at least 5 µm, which corresponds to the 95% coverage.

Figure 4:
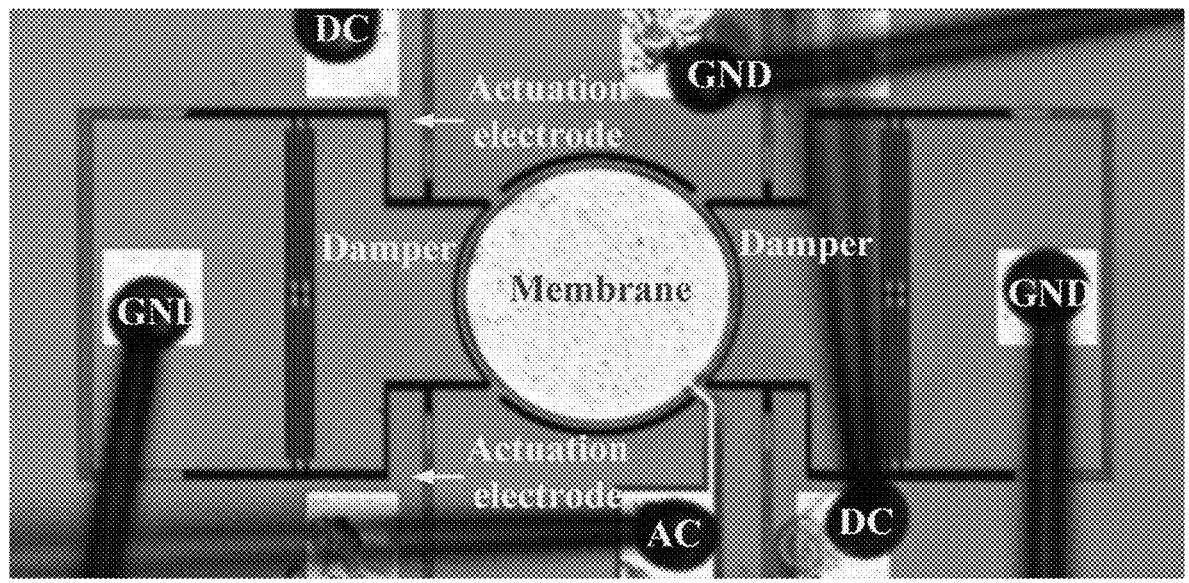
FIG. 4 depicts an optical micrograph of a PMAUT according to embodiment of the invention with its actuators and masses as fabricated using the process flow depicted in FIGS. 3A to 3C respectively.

Referring to FIG. 4 there is depicted an optical micrograph of a fabricated PMAUT with electrostatically actuated mechanical dampers according to an embodiment of the invention showing the PMAUT membrane, actuation electrodes and dampers with spring and masses outlined.

1C2: Finite-Element Simulations

Figure 5A:
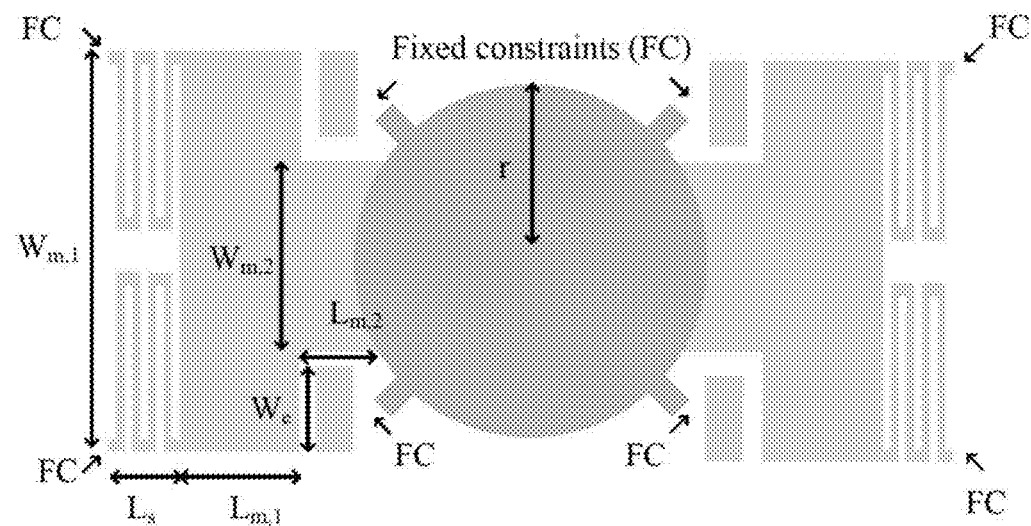
FIG. 5A depicts a schematic of a simulated structure for a PMAUT according to an embodiment of the invention with actuators and masses as a single structure with its design dimensions.

The inventors have employed the finite-element simulator COMSOL Multiphysics to simulate PMAUTs according to embodiments of the invention and for device design. Simulations were performed using the specified physical parameters of the PiezoMUMPs™ technology. As a first step, a design target for the activation voltage was set to about 100 V, and the spring was designed to reach a full collapse into the membrane at this voltage. Referring to FIG. 5A there is depicted a schematic of the simulated structure with the important dimensions. First, a PMAUT radius r of 100 µm was selected. Then, the width of masses $m_2$, $W_{m,2}$, were chosen to cover the entire perimeter between two membrane anchors, in order to maximize contact area under collapse. Finally, the width of mass and the number of spring sections were varied. A higher value of $W_{m,1}$ increases the overall length of the electrode and therefore increases the electrostatic force and reduces the activation voltage. A higher number of spring sections reduces the total spring constant and the activation voltage. The PMAUT device dimensions selected for initial PMAUTs designed and fabricated are given in Table 1 below.

TABLE 1

PMAUT Dimensions for Initial Prototypes

| Parameter | Value |
|---|---|
| $W_{m,1}$ | 365 µm |
| $W_{m,2}$ | 180 µm |
| $L_{m,2}$ | 50 µm |
| $W_e$ | 92.5 µm |
| Total Length of Spring | 18 µm |

Figure 5B:
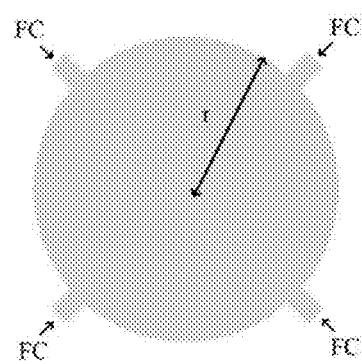
FIG. 5B depicts schematic of a simulated structure for a PMAUT according to an embodiment of the invention without actuators or masses.

In addition, simulations were undertaken to predict the behavior of the structure under the effect of the dampers. In the case when the actuator is not activated, the structure was modeled as a PMAUT with four anchors as depicted in FIG. 5B. Further, to quantify the effect of the dampers on the resonant frequency in the case when the actuator is enabled, a perfect contact between the dampers and PMAUT membrane was assumed. In that case, both the dampers and the PMAUT membrane were modeled as a single solid structure, as depicted in FIG. 5A.

Figure 6A:
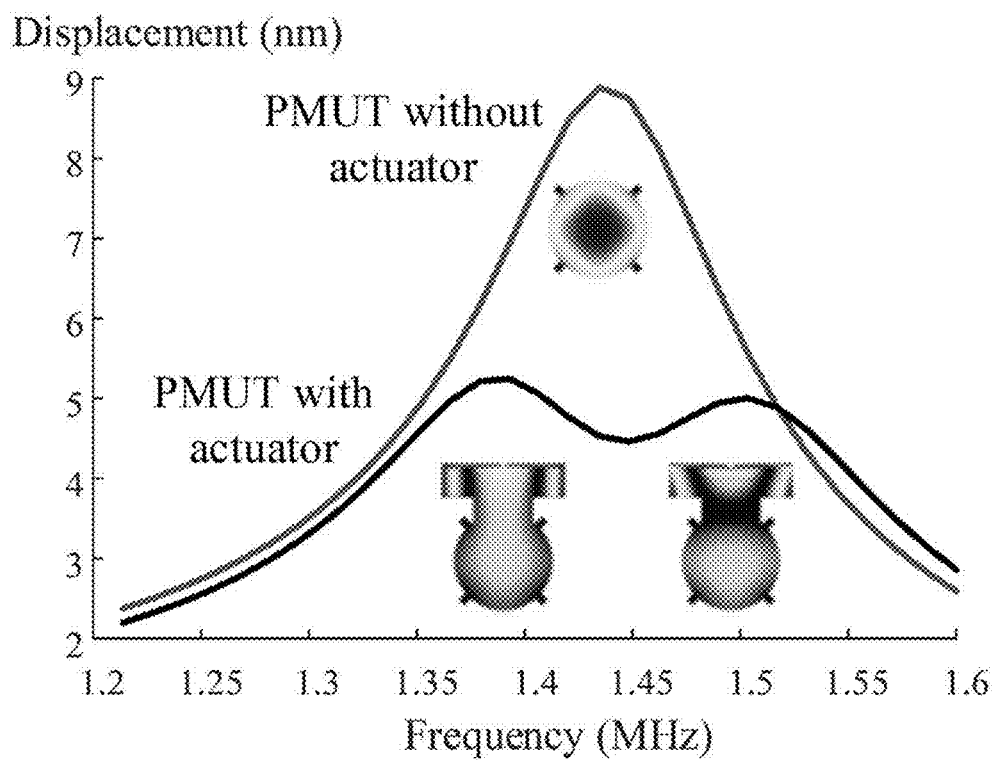
FIG. 6A depicts the simulated displacement versus frequency for a PMAUT according to an embodiment of the invention as simulated according to the designs depicted in FIGS. 5A and 5B.

Eigenfrequency simulations for both actuator states were undertaken in order to estimate the resonant frequencies and the mode shapes. Subsequently, frequency domain simulations were carried-out for both cases. FIG. 6A depicts the results of these simulations. With this simplified model, the dampers are shown to indeed effectively decrease displacement amplitude at the original working frequency. In fact, the dampers and PMAUT membrane act as coupled resonators, exhibiting a frequency response that is composed of two close resonant peaks, leaving a notch at the original working frequency.

Figure 6B:
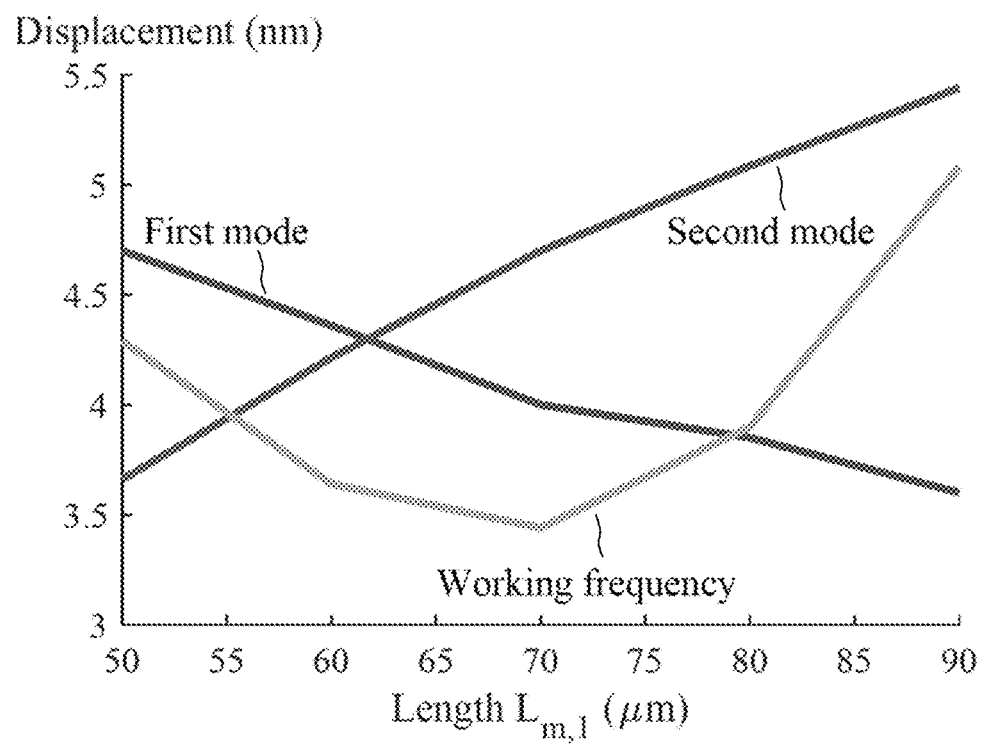
FIG. 6B depicts the simulated maximum displacement versus the length of the masses forming part of the actuators for a PMAUT according to an embodiment of the invention as simulated according to the designs depicted in FIGS. 5A and 5B.

Furthermore, as stated in Section 1B, the spring constant and mass, and therefore the dimensions of the dampers, play a key role in the effect of the dampers on the resonant frequency. Hence, for the structure depicted in FIG. 5A, length $L_{m,1}$ was swept between 50 µm and 90 µm in order to quantify the influence of this parameter and select its optimal value. FIG. 6B depicts the influence of $L_{m,1}$ on the displacement amplitude of the vibration at the working frequency and at the frequency of the first and second modes. The displacement amplitude at the frequency of the first mode decreases with an increase of $L_{m,1}$, and the opposite effect occurs at the frequency of the second mode. Also, the intersection of the two coincides with the minimum of the amplitude at the working frequency. This is consistent with FIG. 6A, where the same phenomenon can be observed. This minimum, the design optimum at which dampers are most effective at damping displacement at the working frequency, is obtained for a value of $L_{m,1}$ about 70 µm.

Figure 6C:
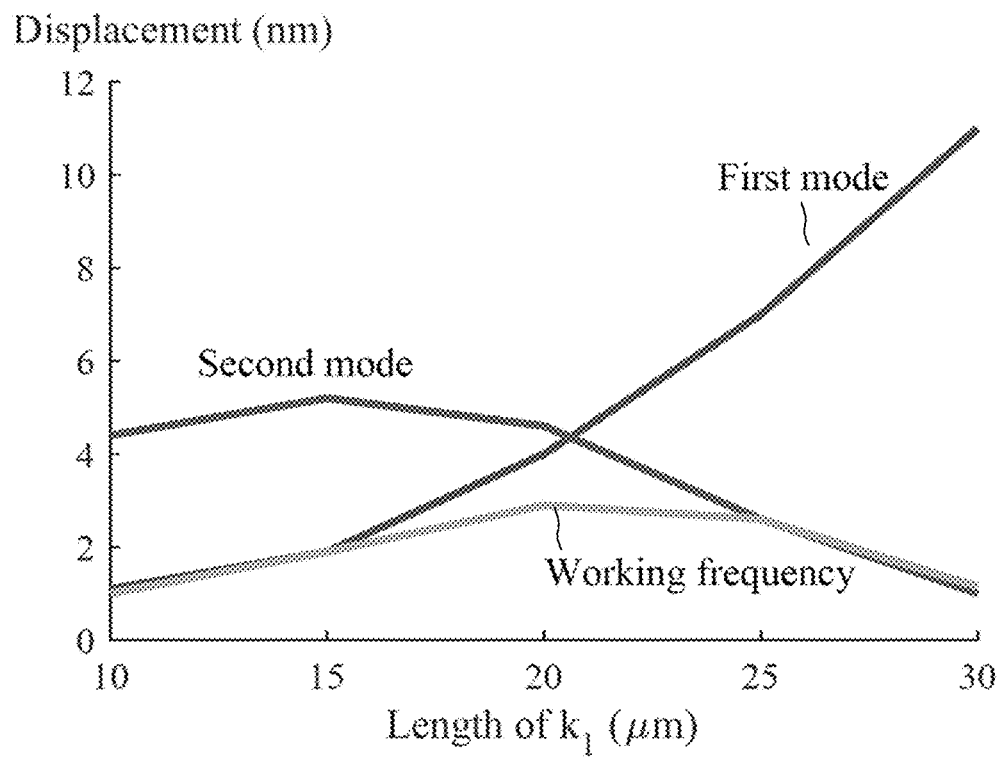
FIG. 6C depicts the simulated maximum displacement versus spring constant of the PMAUT supports for a PMAUT according to an embodiment of the invention as simulated according to the designs depicted in FIGS. 5A and 5B.

In order to quantify and vary $k_1$ the length of the anchors was varied between 10 µm and 30 µm. FIG. 6C depicts the results wherein it can be seen that by varying $k_1$, the first and second mode resonant frequencies vary, causing a working frequency variation. From the trend evident in FIG. 6C, it is expected that the displacement will be lower for any variation of $k_1$ from the optimum. Indeed, for any value lower or higher than 20 µm (i.e. the value for which the resonant frequency is 1.4 MHz), the deflection at 1.4 MHz (i.e. the working frequency) is reduced.

Figure 6D:
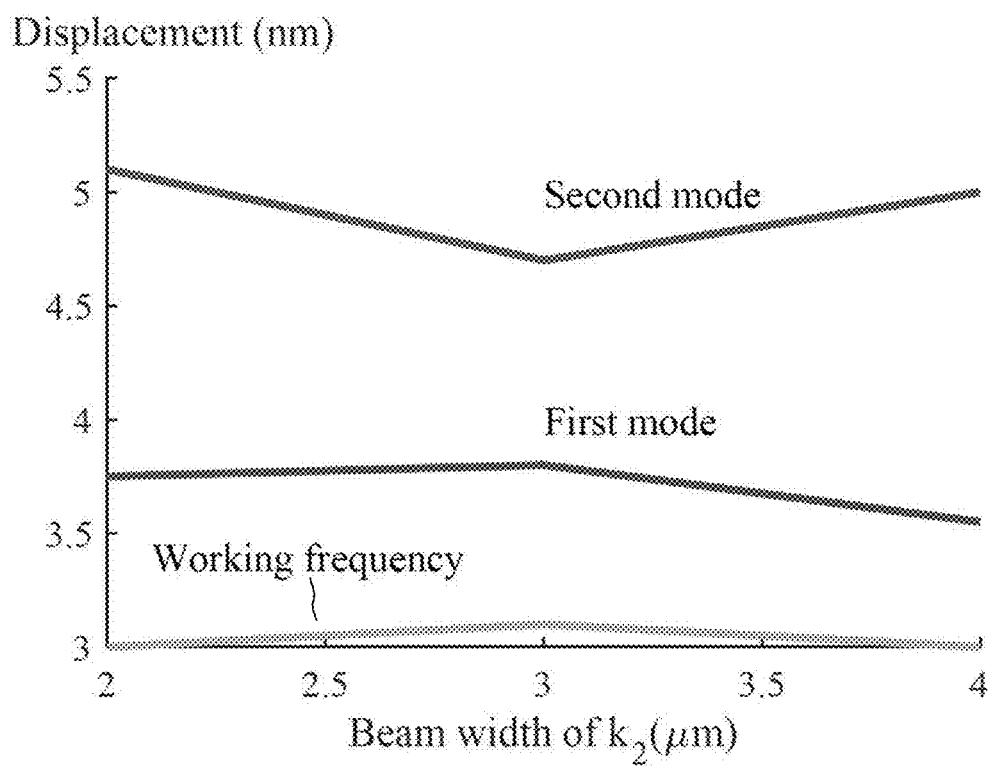
FIG. 6D depicts the simulated maximum displacement versus the spring constant of the electrostatic actuator springs according to an embodiment of the invention as simulated according to the designs depicted in FIGS. 5A and 5B.

Subsequently, the width of the beam implementing $k_2$ was varied from 2 µm to 4 µm for which the results are presented in FIG. 6D. The lower limit of 2 µm corresponded to the minimum width of the manufacturing technology selected. The upper limit was chosen to be reasonably large in order to keep the activation voltage low enough. As can be seen, over the considered range of values, the influence of $k_2$ is minimal.

1D: Measurement Results

The dimensions for the fabricated device of FIG. 4 were selected based on the simulation results, as presented in Table 1. The actuator was driven using a high voltage power supply wherein the required activation voltage was found experimentally to be about 80 V.

1D1: Time Domain

In order to perform time domain measurements, a Polytec OFV-5000 vibrometer was employed wherein the laser of the vibrometer was targeted at the center of the PMAUT membrane in order to measure the time-varying transverse velocity at that point.

Initial measurements addressed the time required for the membrane to stop ringing was measured. To make the PMAUT vibrate, an 18 V peak to peak signal at a frequency of 730 kHz was applied at its terminals while the vibrometer was performing continuous recording of the velocity. The signal driving the PMAUT was then deactivated, with the resulting PMAUT transition shown in FIG. 7A wherein it is evident that it took 57 µs for the membrane to reach half of its original velocity amplitude, also corresponding to a halving of the output acoustic power.

Figure 7A:
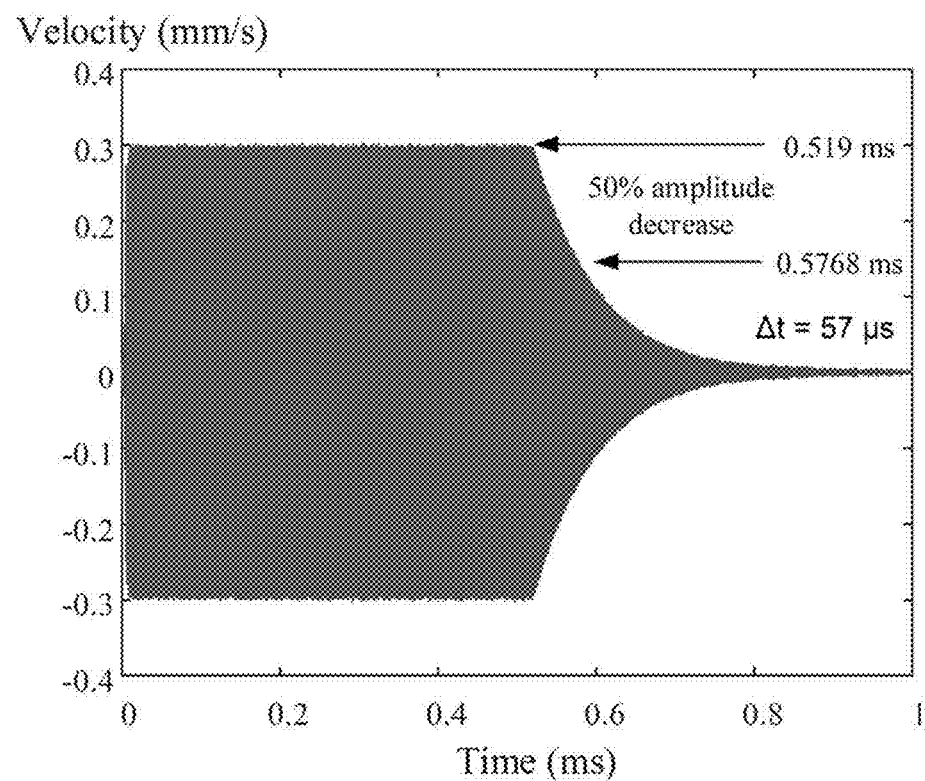
FIG. 7A depicts a plot of velocity versus time for a PMAUT according to an embodiment of the invention when the actuator is disabled but the excitation signal is turned off.

The quality factor was calculated using the ring-down method based upon the results of FIG. 7A using Equation (8) where n is the number of cycles needed for the signal to reach half of its amplitude. Using Equation (8) the calculated value for the quality factor was found to be approximately 180.

$$Q=[(n \cdot \pi)/\ln(2)] \tag{8}$$

Figure 7B:
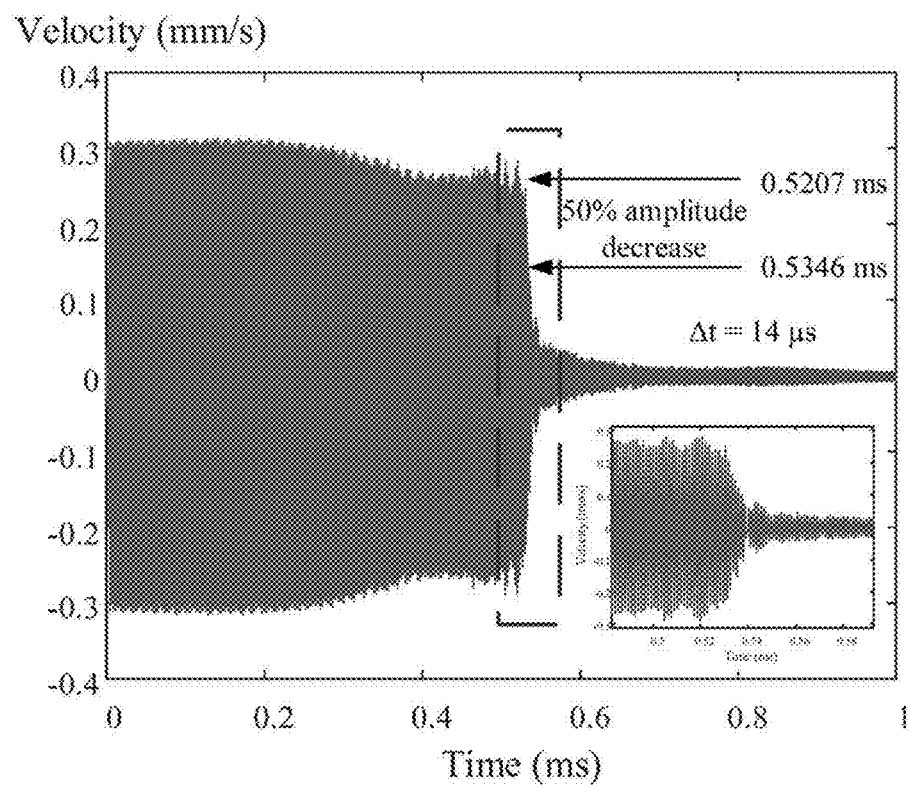
FIG. 7B depicts a plot of velocity versus time for a PMAUT according to an embodiment of the invention when the actuator is enabled.

This baseline was then compared with the use of the actuator to stop the membrane. In this case, the vibrometer was used to perform continuous recording in exactly the same way as previously, but followed by activating the actuator instead of shutting down the driving signal. FIG. 7B shows the transient velocity of the membrane during this process wherein the actuator was kept enabled during the process. Further, when the PMAUT was not damped by the dampers, the deflection was approximately 200 nm and, when damped by using the dampers, it was approximately 8 nm. Accordingly, the time now required to decrease the velocity amplitude to half of its original velocity amplitude is reduced to 14 µs. Accordingly, the use of the damper increases the shutdown speed by a factor of approximately 4. In principle, the proposed method could therefore provide a fourfold improvement in range or precision, with respect to a PMAUT without the proposed electromechanical damping. The inventors note that no other transient effects than the extinguishing of the membrane vibration were observed after the actuation of the dampers.

Figure 7C:
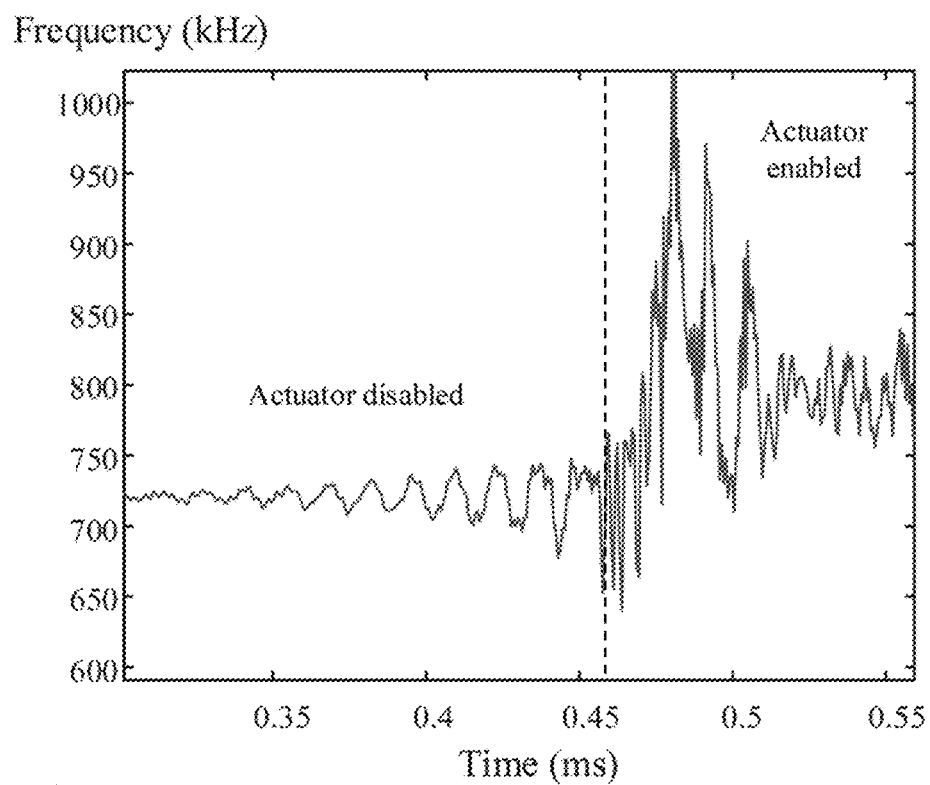
FIG. 7C depicts a measurement of resonant frequency for a PMAUT according to an embodiment of the invention as a function of time during activation of the damper.

Furthermore, referring to FIG. 7C there is depicted the variation of vibration frequency as a function of time. It is evident that when the actuator is enabled, the frequency shifts to a higher value. Also, frequency undergoes relatively large variations during this transition which again emphasizes the non-linearity of the phenomenon.

Figures 8A, 8B:
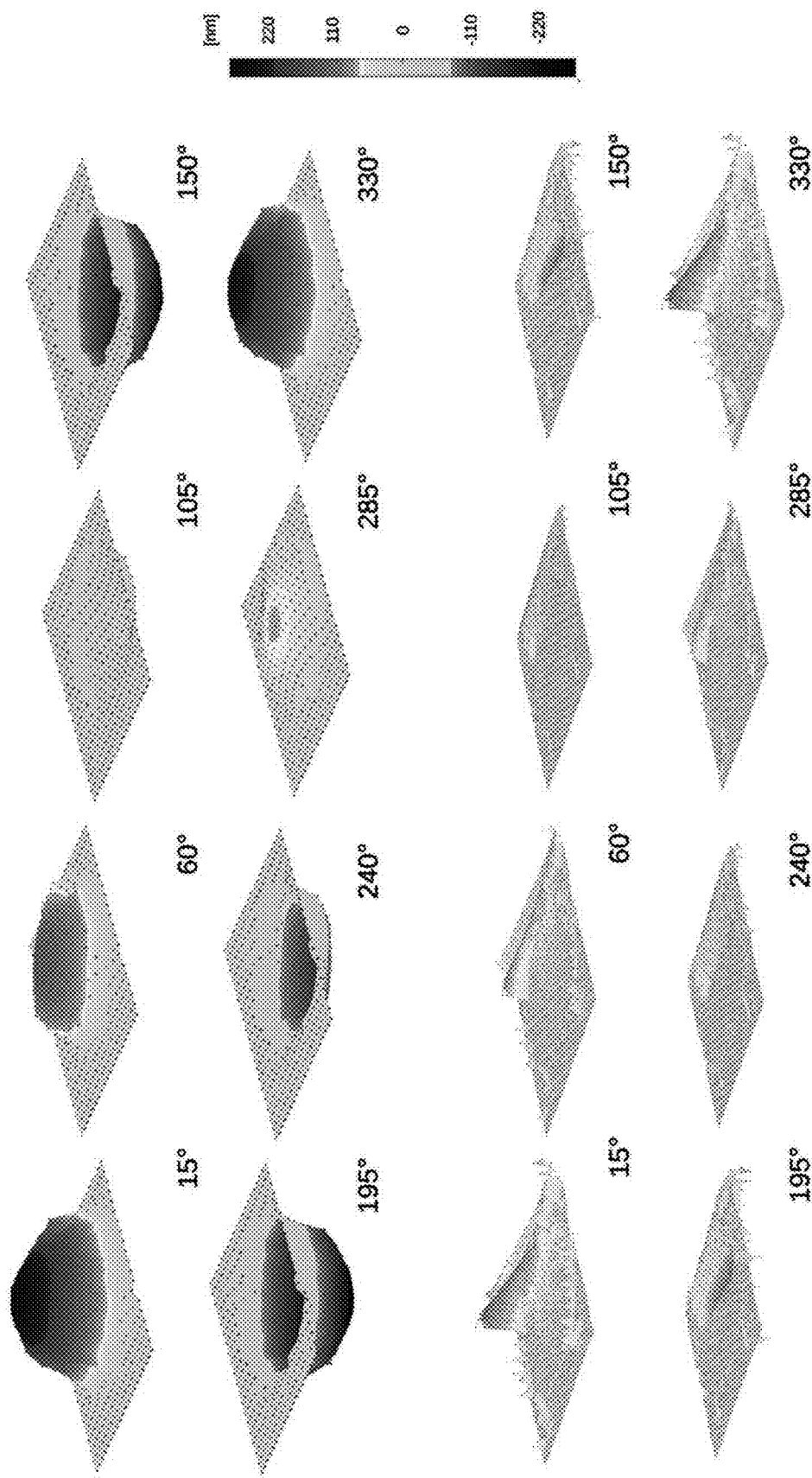
FIGS. 8A and 8B depict the mode shape of a PMAUT according to an embodiment of the invention at eight (8) different phases of the vibration cycle with actuators disabled and enabled respectively.
Figure 9:
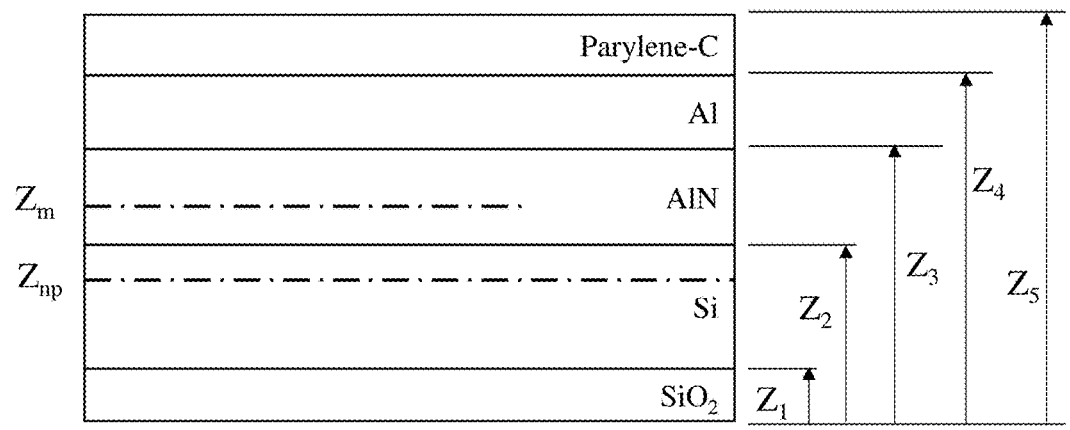
FIG. 9 depicts a representation of the multi-layer PMAUT for the calculation of the neutral plane.

Subsequently, the inventors mapped the mode shape of the PMAUTs using the vibrometer. FIG. 8A depicts the results obtained for 8 different phases of the resonance cycle, outlining the symmetry of the mode and the displacement amplitude of approximately 200 nm. FIG. 8B depicts the results for the same 8 phases of the resonator cycle but with actuator enabled. Accordingly, it is evident that one side of the PMAUT is fully anchored whilst the other side is partially anchored. However, the measurements still show that the displacement amplitude of the membrane remains limited after activating the actuator, even though the membrane is still being driven by the same periodic excitation signal. This indicates that the electrostatic force is sufficient to maintain contact between the actuator and the membrane. It would be apparent therefore the even lower displacement of the membrane could be expected with both sides fully anchored.

The inventors noted that the anchor not fully anchored did not fit perfectly alongside the PMAUT for which process variation induced asymmetry is one explanation. However, the results do show that the membrane and actuator are coupled together after actuation. Importantly, the structure behaved in a binary fashion such that when pull-in of the damper was seen, no performance variation was observed at different actuation voltage levels, indicating, potentially, that once pull-in is achieved the structures are mechanically coupled.

1D2: Frequency Domain

Figure 7D:
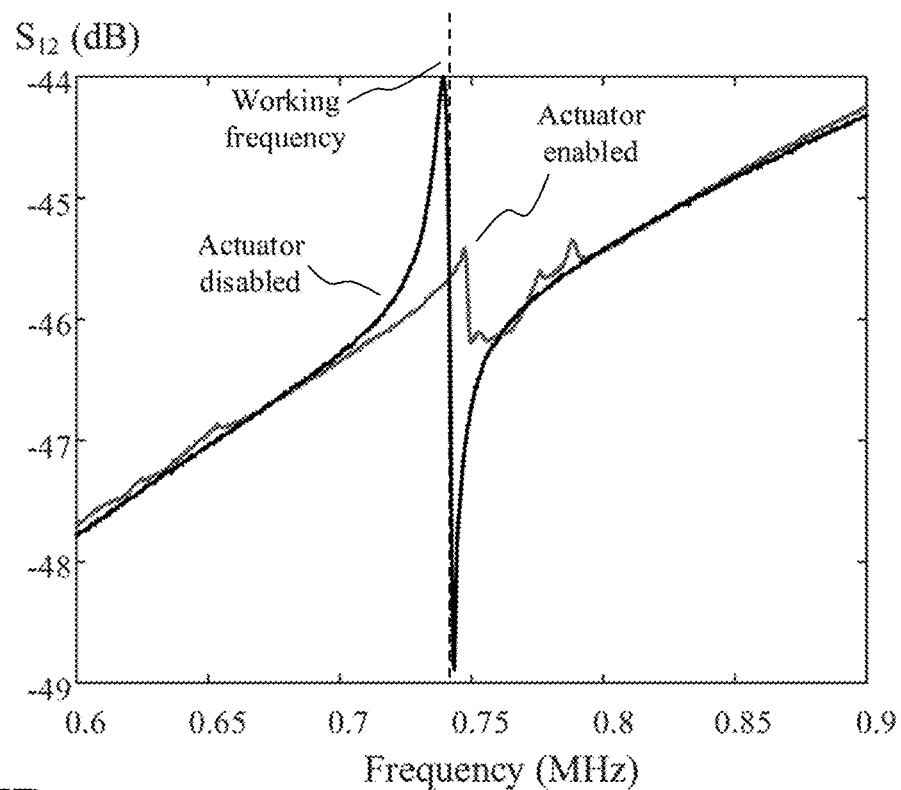
FIG. 7D depicts a measurement of the transmission characteristic, S12, of a PMAUT according to an embodiment of the invention with and without the actuator enabled.

The resonant frequency of the devices was acquired by measuring the $S_{12}$ scattering parameter between the PMAUT membrane electrodes. These measurements were performed using a probe station in conjunction with a network analyzer in combination with Ground-Signal-Ground probes. Referring to FIG. 7D the scattering parameter measurements are presented for the baseline and actuated cases. These results also confirm that the damper is able to effectively dampen the PMAUT at its original working frequency. Also, the damped resonant frequency is shown to be translated by more than 100 kHz, which contributes to a further reduction in the amplitude at the working frequency. Overall, this electrical response is reduced by more than 2 dB through electromechanical damping. It was noted by the inventors that capacitive feedthrough on the devices made quantifying this attenuation precisely difficult. However, as indicated by the time domain measurements, the anchor's impact on the response of the PMAUT reduces its resonance almost entirely. By using the calculated displacement values before and after the actuator is enabled, the acoustic pressure attenuation can be approximated to 14 dB.

The inventors identified some discrepancies between simulation and measurements. First, measured resonant frequency was found to be about 740 kHz which was lower than that expected from simulation. This is most likely caused by a larger trench size than expected, due to inherent process variations. Hence, the PMAUT anchors are effectively longer, which in turn causes a decrease of the resonant frequency. Indeed, as can be seen in FIG. 4, the trench of the actuator occupies an area underneath the anchors that is larger than expected, since process variations of the Piezo-MUMPs™ technology for the DRIE steps are relatively large. The PiezoMUMPs technology design guide states that the in process variations can be as high as 100 µm. To verify this hypothesis, simulation of a structure with longer anchors was also carried out. It was found that an increase in trench size of 35 µm would result in a structure with a resonant frequency of 750 kHz. Although the presented structure represents a proof of concept of a new actuation method, a custom fabrication process could be used instead to improve control of critical process variations and improve fabrication accuracy relative to a standard commercial process.

Furthermore, in simulation, the structure presents two resonant frequencies spaced by a few hundred kHz (see FIG. 6A) when the dampers are actuated, which is not observed in the experimental measurements. In fact, only one resonant frequency was detected in the initial experiments. In simulation, the lower resonant mode shape could only be produced if both structures were effectively combined as one single solid structure. Only in this fashion can the axial bending outlined in this mode be achieved. As the actuated mass structure is not rigidly connected to the membrane, this mode is not likely to be favored in practice because it would cause significant strain at the contact interface and both structures are likely to slide on one another. The damper is thus not believed to bend with the PMAUT but rather to exert friction at the interface, favoring the higher frequency simulated mode.

Finally, the transmission characteristics for the PMAUT after actuation are atypical. The resonant peak is sharp, and the overall shape is degenerated. This can be explained by the fact that the contact, as explained in Section 1B, is exposed to non-linear effects between the structures. However, a detailed explanation of these phenomena is beyond the scope of this patent application.

Whilst the PMAUT devices were designed for in-air application(s) the inventors also validated that they were functional in water.

The damper is used to shorten the pulse length in the time domain. When the damper is not enabled, the PMAUT is completely unaffected and benefits from a higher Q-factor and a higher resonance efficiency. The damper is actuated to quickly reduce the PMAUT vibration such that the acoustic power is significantly lower. Accordingly, the dynamic use of the damper allows for a shorter pulse width in the time domain whilst keeping the same peak pressure.

Accordingly, the inventors have established a novel technique for stopping the resonance of PMAUTs using a mechanical damper controlled by electrostatic actuators.

Within the embodiments of the invention described and depicted a relatively low complexity manufacturing sequence and design was employed in respect of proof of principle devices. In these the electrostatic actuators push the masses against the resonant membrane of the PMAUT.

It would be evident that within other embodiments of the invention the number of masses engaging the PMAUT membrane may be varied according to the design of the PMAUT resonator itself. For example, within the design depicted in FIG. 4 an additional pair of masses and actuators could be employed orthogonal to the pair depicted. In other designs with square, rectangular, elliptical, hexagonal etc. membranes the engaging masses may be appropriately shaped to engage a face or predetermined portion of the membrane surface.

Optionally, within other embodiments of the invention electrostatic actuation may be replaced by another MEMS actuation methodology such as piezoelectric actuation, piezoelectric bimorphs, magnetic actuation, or thermal actuation for example. Optionally, within other embodiments of the invention the MEMS resonator may be capacitive/electrostatically actuated. Optionally, within other embodiments of the invention the MEMS resonator may be a piezoelectric bulk mode disk resonator, a clamped-clamped (C-C) beam resonator, a tuning fork resonator, or a Lame mode resonator for example. Optionally, within other embodiments of the invention the MEMS resonator may employ flexural modes, bulk modes, shear modes, or torsional modes for example. Optionally, within other embodiments of the invention the MEMS resonator may employ a single resonator or multiple coupled resonators.

Optionally, within other embodiments of the invention the actuators may move the mass into contact with the upper and/or lower surfaces of the PMAUT membrane rather than the sides of the PMAUT membranes. For example, one or more bimorph actuators may move a mass up against the lower surface of the PMAUT membrane or down against the upper surface of the PMAUT surface.

2: Frequency Tuning Microelectromechanical Systems Resonators

2A: Background

As noted above fabrication of state-of-the-art PMAUT arrays presents challenges through the large number of elements required and that all transducer elements are expected to have almost identical resonant frequencies. As previously noted, the conventional fabrication process exploiting a DRIE process to etch trenches through the entire thickness of the substrate wafer results in the resonant frequency becoming dependent upon the trench diameter and thus process variations. Whilst it is possible to reduce this effect by using a two-step DRIE process this increases complexity as two masks are now necessary, and the required fabrication process becomes more complex and costly.

Alternatively, within the prior art a technique based upon cavitySOI wafers has been reported fabricate suspended membranes. CavitySOI wafers are provided with pre-fabricated cavities between the insulating and silicon layers, with accurate dimensions that can be selected. Whilst suitable for producing high quality PMAUTs it is more expensive. Alternative to releasing the membrane from below it is also possible to release the membrane by etching from above. To do so, an opening must be made in the membrane to allow a selective etchant to remove a sacrificial layer from underneath the membrane, but this does affect membrane geometry. Furthermore, it has been shown that a trench going through the substrate can be used to improve acoustic power transmission if designed to act as an acoustic waveguide, which is not possible with the aforementioned top-side release approach.

The quality (Q) factor of PMAUTs is generally higher than their capacitive counterparts. Accordingly, without decreasing their Q-factor, PMAUTs are not ideal candidates for pulse echo imaging with high axial resolution, for which a wide transducer bandwidth is desirable to reduce the acoustic pulse duration. Within the prior art effective techniques to increase the bandwidth of an ultrasonic transducer have been proposed, such as the deposition of a damping layer or signal processing like pulse compression. Alternatively, the inventors have established an alternate design methodology as described in Section A above through the use of mechanical dampers which are electrostatically actuated. On the other hand, PMAUTs generally produce high acoustic power which makes them appealing for distance ranging or continuous wave imaging despite their high Q-factor. Generally, the resonance frequency of a high Q-factor device must be precisely adjusted to meet the specifications of the driving electronics so as to maximize efficiency.

Accordingly, to address these issues the inventors have established a PMAUT design solution for ranging applications wherein the PMAUT device provides maximized output acoustic power at the target frequency, resulting in a PMAUT with a relatively high Q-factor. Accordingly, it is essential for the PMAUT to have its resonant frequency match the application frequency to reduce path loss and achieve maximum power transfer. Accordingly, the inventors have established a novel low cost technique for frequency tuning PMAUTs fabricated using a low cost SOI commercial fabrication process, e.g. PiezoMUMPs™. With the base technology, membranes are released by DRIE and suffer from the frequency matching issues detailed earlier. However, through a single additional post-processing step exploiting a conformal deposition of a thin layer, e.g. Parylene-C($C16H12C2$), on top of the PMAUT. No additional photolithography or patterning is necessary, and the effect on the resonant frequency can be accurately predicted.

Whilst the application cases described and addressed for the proposed method focus on single transducer devices or small arrays thereof as the conformal deposition simultaneously occurs on all elements of a chip it results in a uniform frequency tuning of all exposed elements. However, as the additional processing can be efficiently integrated into MEMS batch production processes, with no extra photolithographic mask requirements, then it would be evident that the innovative solution can be integrated into MEMS resonator manufacturing with marginal cost impact with respect to baseline device fabrication.

Within Section 2B the theory and modeling of the PMAUT with the conformal coating is analysed whilst Section 2C subsequently describes the PMAUT design and fabrication and Section 2D outlines experimental measurement results on initial prototypes exploiting the innovative process.

Within the following description with respect to embodiments of the invention the thin conformal layer is considered to be Parylene-C. However, it would be evident to those of skill in the art that this thin conformal layer may be implemented using other materials which meet the requirements of the manufacturing and design processes in respect of compatibility to the PMAUT, cost, performance etc. Accordingly, other materials for the thin conformal film may include, but not be limited to, an insulator such as silicon dioxide, silicon nitride, silicon oxynitride; a photoresist or photoresists; a metal such as aluminium for example suitably patterned to avoid short circuiting active elements such as the piezoelectric layer for example; and a ceramic such as silicon or silicon carbide for example.

Within embodiments of the invention the innovative conformal layer tuning methodology may be employed upon the entire wafer to allow for coarse tuning of the average resonant frequency of all the PMAUTs. This may be sufficient for many use cases or where intra-wafer process variations are relatively low. However, in other use cases of where intra-wafer process variations are higher or requiring more precise tuning, the gradient of the resonant frequency over a wafer could be estimated by sampling the characteristics of a PMAUT device in a given region, with the region size depending on the level of tuning precision required, and repeating the process to cover the entire wafer. Accordingly, in a subsequent wafer level processing stage multiple conformal coating thicknesses may be selectively deposited, or different areas exposed to additional coating processes etc. Alternatively, at the assembly stage, dies from the wafer could be separated and categorized by region, with each subset tuned independently using the conformal layer deposition. In this latter scenario, a designer would need to set a trade-off between tuning accuracy and overall calibration costs. For extreme accuracy, each PMAUT could be tuned independently, although at the expense of parallelization and costs.

2B: Theory and Modeling

A PMAUT is a multi-layer device that can be modeled as a clamped circular plate. The silicon layer acts as a structural membrane and as the bottom electrode, an aluminum nitride layer acts as the piezoelectric layer and an aluminum layer as the top electrode. Also, a layer of Parylene-C within the initial prototypes is deposited on top of the device to adjust the resonant frequency. However, it would be evident that alternate piezoelectric materials may be employed for the piezoelectric material, different metallizations for the top electrode, different materials may be employed for the conformal layer to tune the resonant frequency and that within other embodiments of the invention a lower metallization layer may be employed where either the substrate is insulating or the resonator is formed atop an insulating layer upon a conductive substrate to meet the overall MEMS design requirements in conjunction with other MEMS devices and/or optical devices and/or integrated electronics. Accordingly, within the exemplary designs simulated the PMAUT has a total of 4 layers, as depicted in FIG. 1. The neutral plane $Z_{np}$, i.e. the plane of the device where internal stress is zero, is calculated as a function of the Young's modulus and Poisson ratio of each layer as given by Equation (8) where $z_n$ is the z position of the upper part, $Y_n$ the Young's modulus, $v_n$ the Poisson ratio, and $t_n$ the thickness of layer n. Accordingly, using Equation (8), the flexural rigidity and the mass per area as a function of the neutral plane can be expressed by Equations (9) and (10) respectively.

$$Z_{np} = \frac{1}{2}\left[\sum\left(\frac{Y_n(z_n^2 - z_{n-1}^2)}{1 - v_n^2}\right) \Big/ \sum\left(\frac{Y_n t_n}{1 - v_n^2}\right)\right] \quad (8)$$

$$D = \frac{1}{3}\sum Y_n \frac{(z_n - Z_{np})^3 - (z_{n-1} - Z_{np})^3}{3(1 - v_n^2)} \quad (9)$$

$$\mu = \sum \rho_n t_n \quad (10)$$

$$f_0 = \frac{\lambda^2}{2\pi r^2}\sqrt{\frac{D}{\mu}} \quad (11)$$

The resonance frequency can be calculated using Equation (11) where $\lambda^2$ is the root of Bessel functions for a specific resonance mode. Examples of values for different modes of interest are presented in Table 2.

TABLE 2

| $\lambda_{ij}$ for Selected Modes | | | |
|---|---|---|---|
| $\lambda_{ij}$ | i = 0 | i = 1 | i = 2 |
| j = 0 | 10.2158 | 21.26 | 34.88 |
| j = 1 | 39.771 | 60.82 | 84.58 |

The PMAUTs presented with respect to the prototype devices exploiting embodiments of the invention are partially anchored using beams. This anchoring topology leads to a reduction of flexural rigidity. Indeed, a smaller anchored perimeter results in lower flexural rigidity. Hence, a correction factor, $D_{corr}$, representing the portion of the membrane that is anchored, is defined by Equation (12) by taking the ratio of the anchored perimeter to the total perimeter of the membrane as defined by Equations (13) and (14) where $P_{anc}$ is the anchored perimeter, $P_{tot,ex}$ is the total perimeter, $A_l$ is the length of the anchors, $N_{anc}$ is the number of anchors, and $A_w$ is the width of the anchors. Accordingly, through Equations (11) to (14) a corrected resonant frequency can be given by Equation (15). This corrected frequency, as will be shown below, provides a reasonable approximation of the impact of the anchors' rigidity.

$$D_{corr} = \frac{P_{anc}}{P_{tot,ex}} \quad (12)$$

$$P_{tot,ex} = 2\pi(r + A_l) \quad (13)$$

$$P_{anc} = N_{anc} A_w \quad (14)$$

$$f_{0,corr} = f_o \sqrt{D_{corr}} \quad (15)$$

2C: Design and Fabrication

Figure 10A:
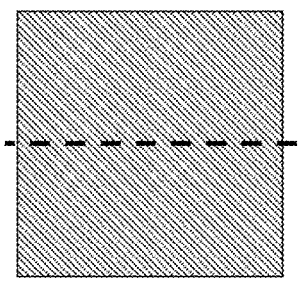
FIGS. 10A to 10C depict the PiezoMUMPs™ process flow for the fabrication of a PMAUT and post-processing for PMAUTs according to embodiments of the invention PMAUTs according to embodiments of the invention.
Figure 10A:
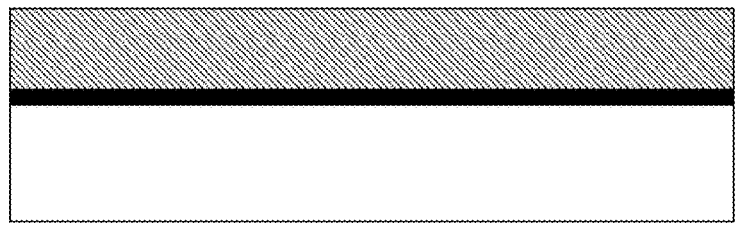
Figure 10A:
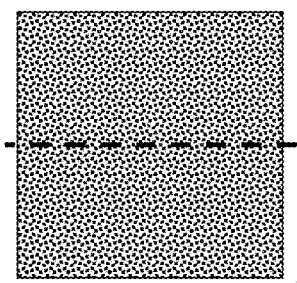
Figure 10A:
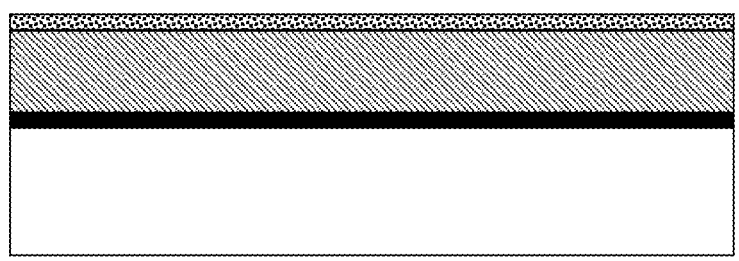
Figure 10A:
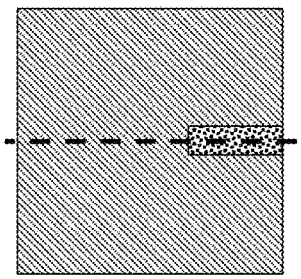
Figure 10A:
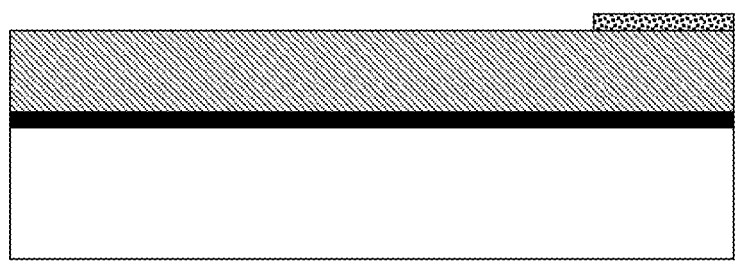
Figure 10A:
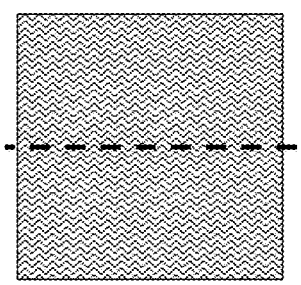
Figure 10A:
Figure 10B:
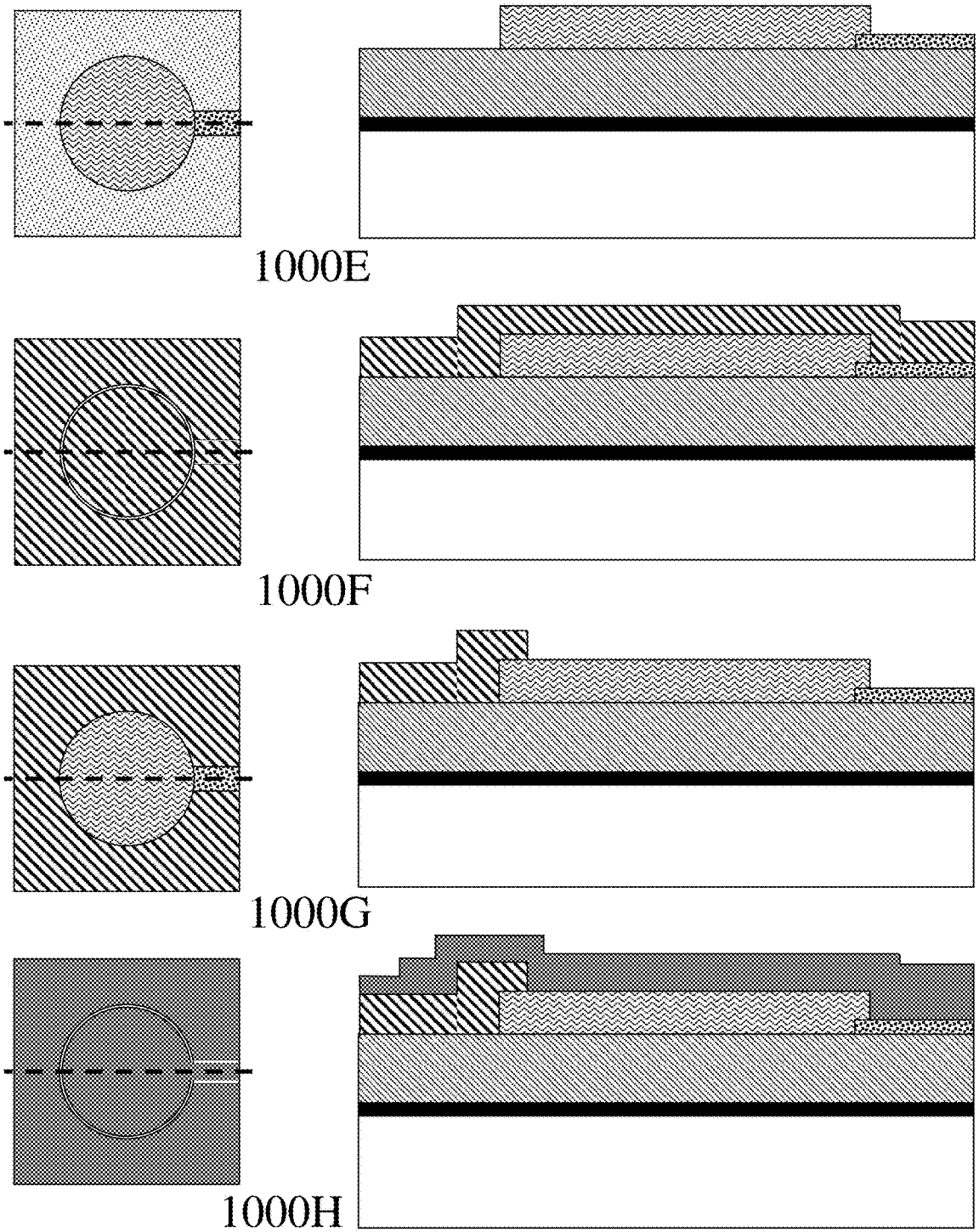
Figure 10C:
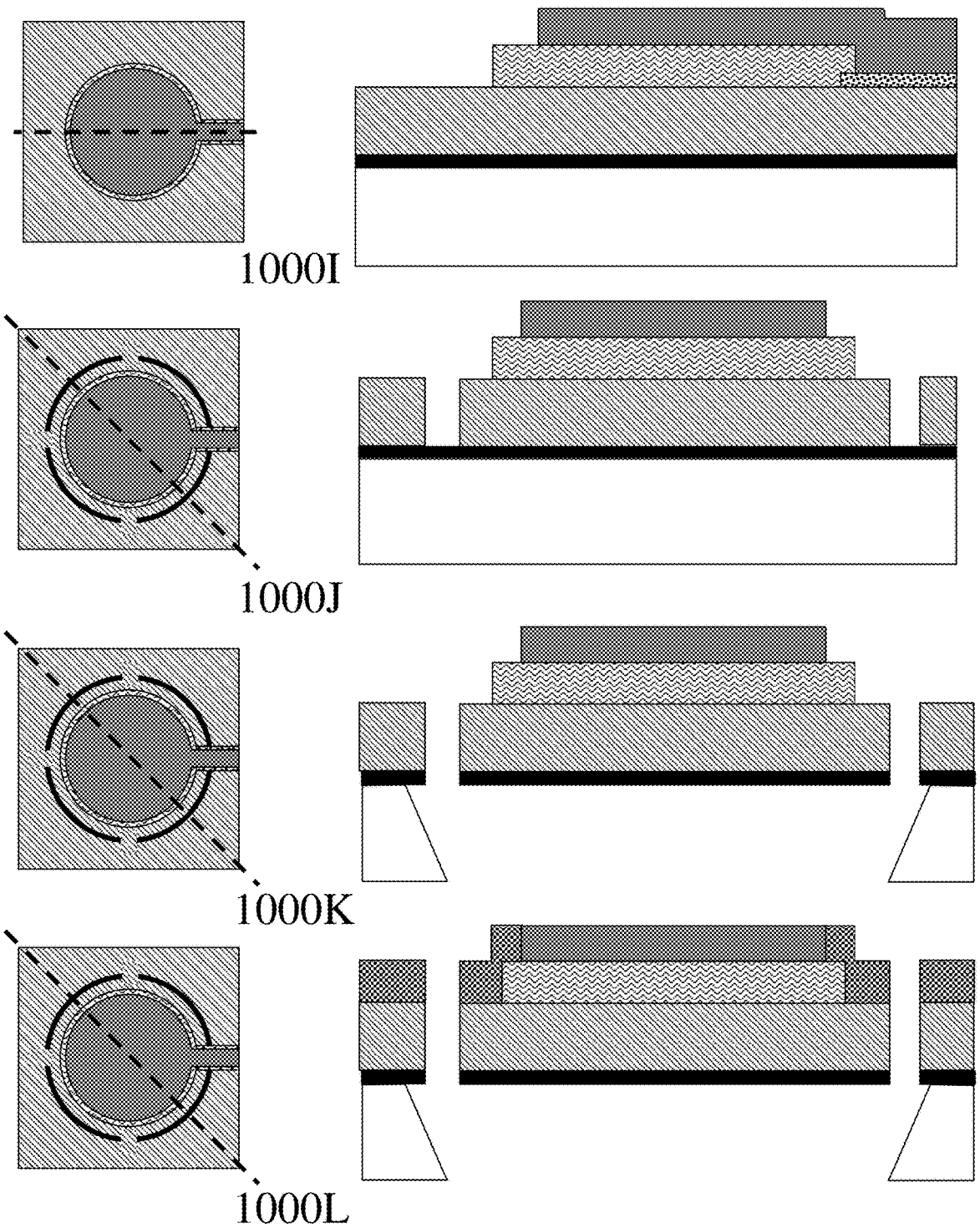

The PMAUT devices were fabricated using the PiezoMUMPs™ process which provides a commercial process with a 5-mask technology. FIGS. 10A to 10C respectively depict first to twelfth process stages 1000A to 1000L using this process to fabricate PMAUT devices. As the PiezoMUMPs process is a standard commercial technology the layer thickness is defined and cannot be customized. Accordingly, referring to FIG. 10A there are depicted first to fourth process stages 1000A to 1000D comprising:

First process stage 1000A wherein a SOI wafer is employed with a 400 nm thick insulator and a 10 μm device layer wherein the wafer is doped using a phosphosilicate glass (PSG) layer deposited onto the wafer and annealed for 1 hour at around 1000° C. before being wet etched such that after doping, the resistivity of the silicon wafer lies between 1 and 10 ohm·cm.

Second process stage 1000B comprises provisioning the pad oxide layer, thickness 200 nm, which is thermally grown onto the wafer.

Third process stage 1000C depicts the result after a photoresist is applied and patterned using standard photolithography, wherein the oxide layer is then patterned by wet etching. This oxide layer prevents short circuits between the doped silicon layer acting as the bottom electrode and the aluminum top electrode later deposited.

Fourth process stage 1000D depicts the point after the oxide layer has been etched and a 500 nm aluminum nitride piezoelectric layer has been deposited by sputtering.

Now referring to FIG. 10B there are depicted fifth to eighth process stages 1000E to 1000G respectively, wherein Fifth process stage 1000E wherein the aluminum nitride layer is patterned using standard lithography and wet etching in order to produce a circular membrane of 200 μm diameter.

Sixth process stage 1000F wherein a resist layer is then deposited on top in preparation for lift-off of the aluminum pads.

Seventh process stage 1000G wherein the resist is patterned through standard photolithography.

Eighth process stage 1000H wherein a 1 μm thick aluminum layer is deposited by electron beam (e-beam) evaporation.

Now referring to FIG. 10C there are depicted ninth to twelfth process stages 1000I to 1000L respectively wherein:

Ninth process stage 1000I wherein after lift off a circular aluminum layer atop the aluminum nitride membrane of diameter 190 μm is provided together with aluminum pads for electrical connections to the device. The diameter of the aluminum circle is set smaller than that of the aluminum nitride in order to ensure no overlap with the bottom electrode.

Tenth process stage 1000J wherein the silicon device layer is etched by deep reactive-ion etching (DRIE), resulting in a circular silicon membrane and four anchors. The diameter of the silicon structure is larger than the aluminum nitride to ensure no overhang.

Eleventh process stage 1000K wherein the membrane is released by etching a trench from the back of the handle wafer by DRIE followed by a wet oxide etch using a polyimide coating serving as protection material. Note that a front side protection material is used during this step.

Twelfth process stage 1000L wherein the device (or wafer or part-wafer) is post-processed to apply a variable thickness Parylene-C film onto it in order to tune the resonant frequency of the resonator, as will be detailed later.

Figure 11A:
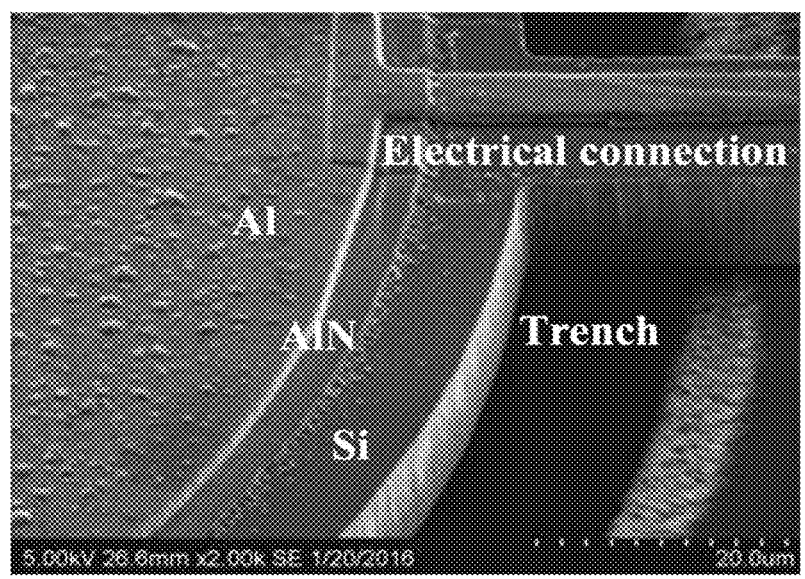
FIGS. 11A and 11B depict SEM micrographs of the fabricated PMAUTs according to embodiments of the invention.
Figure 11B:
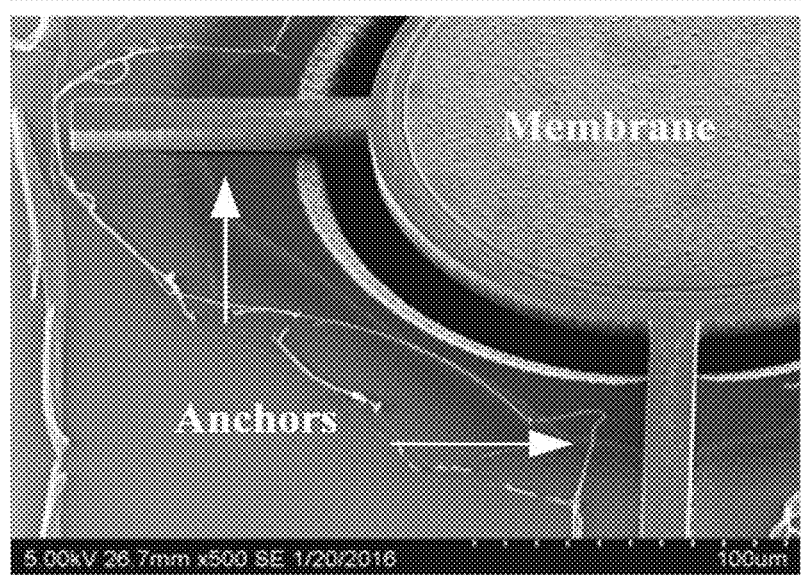
Figure 11C:
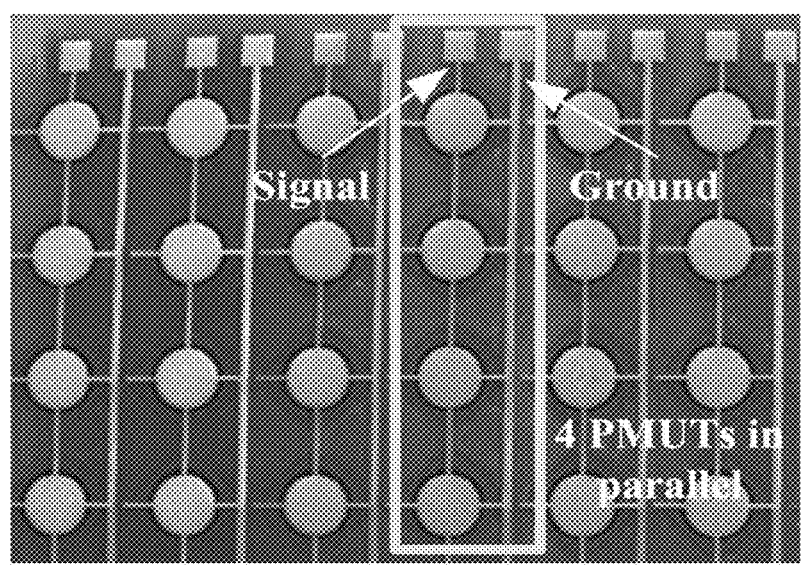
FIG. 11C depicts an SEM micrograph of a fabricated PMAUT array PMAUTs according to embodiments of the invention.

Now referring to FIGS. 11A to 11B respectively there are depicted SEM micrographs of a fabricated PMAUT device whilst FIG. 11C depicts an SEM micrograph of a PMAUT matrix. The fabricated PMAUT devices comprising a 200 µm-radius suspended membrane anchored by four orthogonal beams. The anchors have a width of 20 µm and a length of 15 µm. A set of 4 PMAUTs are connected in parallel as evident in FIG. 11C. The doped silicon serves as the bottom electrode and is grounded. The aluminum layer constitutes the top electrode and is fed with the input signal.

2C1: Simulations

Finite-element simulations were undertaken with COMSOL Multiphysics using the following physical parameters of the PiezoMUMPs™ technology: Young's modulus ($Y_n$), Poisson's ratio ($v_n$), density ($p_n$), thickness ($t_n$), piezoelectric constant ($d_{31}$), dielectric constant ($\varepsilon_{33}$) and transverse piezoelectric constant ($e_{31,f}$). These parameters are listed in Table 3.

TABLE 3

Material Parameters for Transducer Simulations

| Parameter | Si | AlN | Al | Parylene-C |
|---|---|---|---|---|
| $Y_n$ (GPa) | 180 | 348 | 69 | 400 |
| $v_n$ | 0.22 | 0.24 | 0.346 | 0.4 |
| $p_n$ (g/cm³) | 2.329 | 3.6 | 2.7 | 1.289 |
| $t_n$ (µm) | 10 | 0.5 | 1 | 0-10 |
| $d_{31}$ (nC/N) | — | $-1.9e^{-12}$ | — | — |
| $\varepsilon_{33}$ | — | 9 | — | — |
| $e_{31,f}$ (C/m²) | — | -0.58 | — | — |

Figure 12:
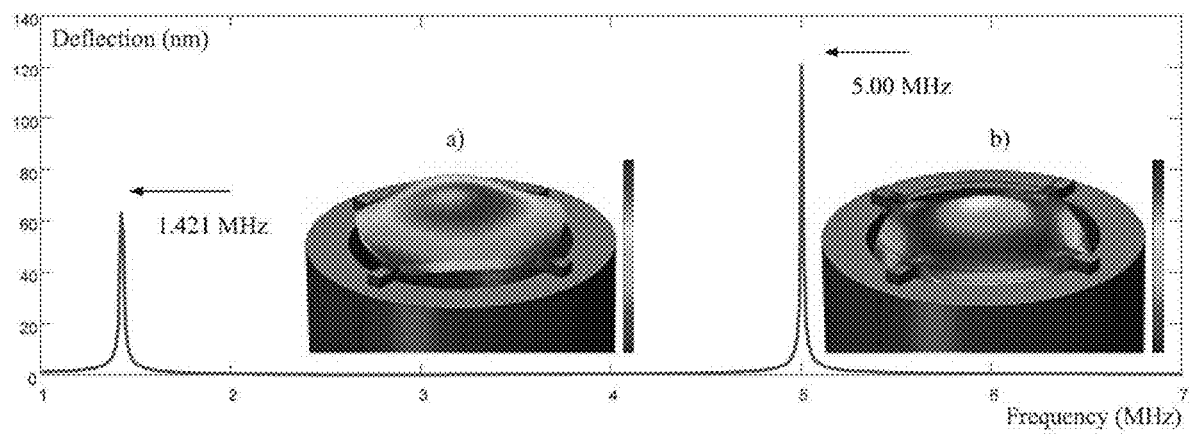
FIG. 12 depicts harmonic simulation at the center of the membrane and eigenvalue simulation for the first and second modes of resonance of the PMUT without Parylene-C.

In order to reduce simulation time while remaining accurate, the substrate was modeled as a tube of 400 µm thickness with an inner radius of 107 µm and an outer radius of 165 µm. A fixed displacement constraint was assigned to the outer perimeter of the tube. A 10 µm thick silicon membrane with 4 anchors of 20 µm width and 15 µm lengths was positioned above the tube. Finally, a 500 nm thin film of AlN and a 1 µm thin film of aluminum were positioned on top of the membrane. However, because of process variations, the dimensions of the fabricated devices were slightly different than designed. As such, an over etching of the membrane and trench of 2 µm and 6 µm respectively were estimated and taken into account in the simulations. Harmonic simulations of the deflection at the center of the membrane (i.e. r=0) over a range of frequencies were performed in order to identify the resonance modes with high deflection and consequently high acoustic pressure output. Then, eigenfrequency simulations were carried-out for the determined resonance mode in order to identify the mode shape. FIG. 12 shows the results for the first and second modes of resonance.

Figure 13A:
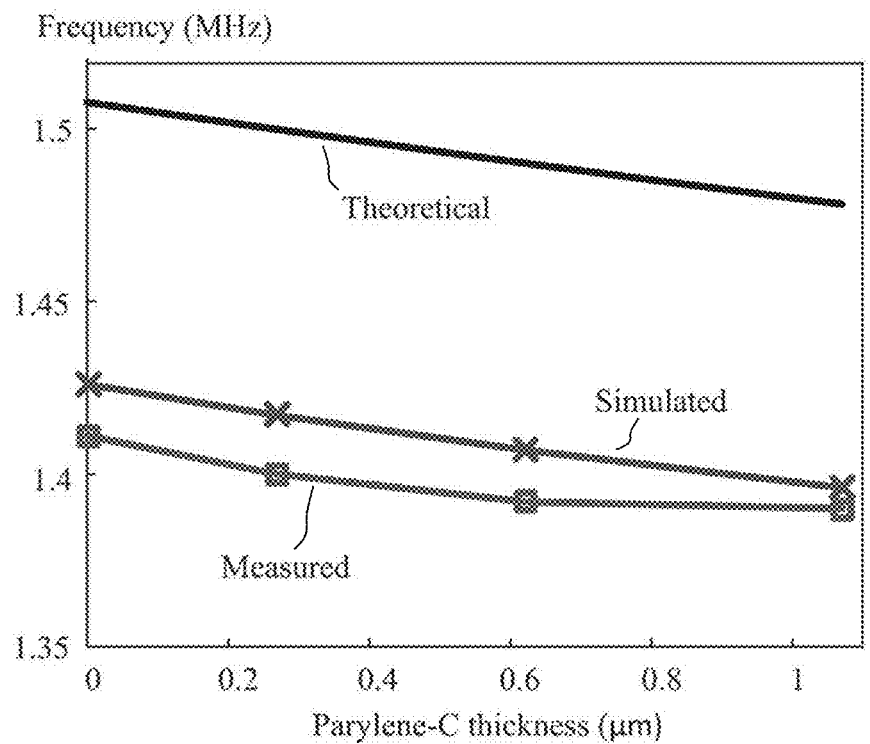
FIGS. 13A and 13B depict a comparison between theoretical, simulated and measured resonant frequencies as a function of Parylene-C thickness for the first mode and second mode of resonance respectively for PMAUTs according to embodiments of the invention.
Figure 13B:
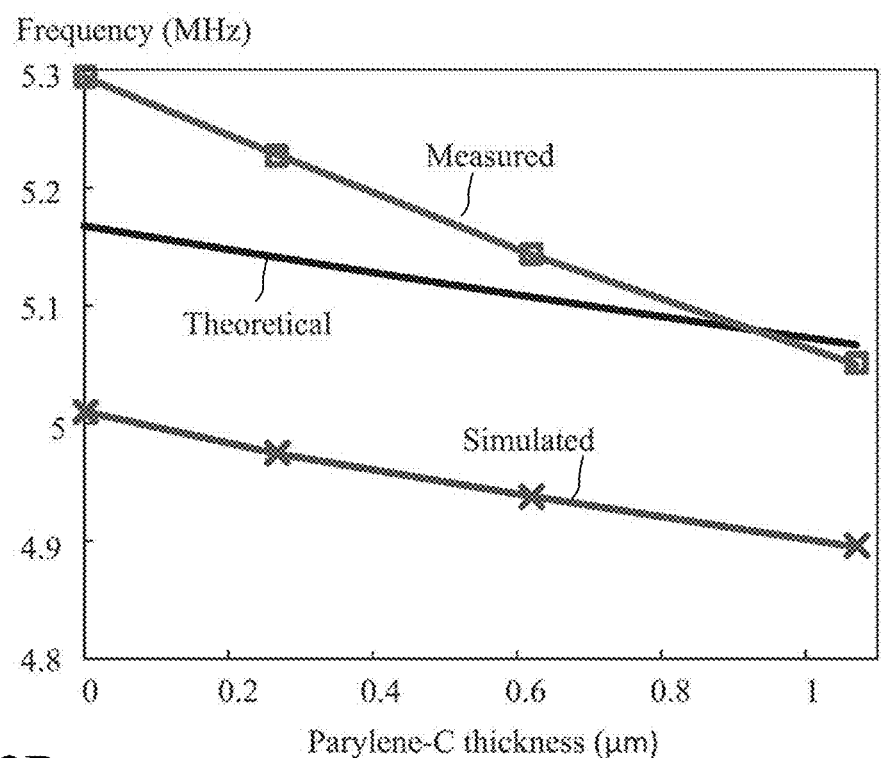

In order to evaluate the impact of Parylene-C deposition on the PMAUT resonance frequency, a thin film of Parylene-C was modeled on the top and sides of the suspended membrane. Four eigenfrequency simulations were performed with varying Parylene-C thicknesses of up to 1070 nm. FIGS. 13A and 13B depict the comparison between simulated, theoretical and measured values. Measured values will be discussed in Section 2D. The theoretical calculations were performed following the procedure explained for modes (0,0) and (0,1). It is evident that the simulated and calculated values are in reasonable agreement, with the slopes of the graphs almost identical. However, the calculated values are slightly higher than the simulated ones, which may be related to the simplified frequency correction factor applied and also to the fact that the resonant modes do not correspond exactly to the modes of a perfectly clamped circular plate. Nonetheless, the theoretical approach remains a useful tool for initial approximation. Finally, one can see that, in simulation, that by using up to only 1 µm of Parylene-C, the frequency of the first and second modes can be tuned over a range of 40 kHz and 100 kHz, respectively.

2D: Electrical Characterisation Results

2D1: Effect of Parylene-C on Eigenfrequency

Characterization was undertaken on 16 fabricated dies (totaling 128 sets of 4 PMAUTs devices connected in parallel) using a probe station in conjunction with a network analyser wherein ground-signal-ground (GSG) probes were employed. The power transferred (i.e. measured via the $S_{12}$ scattering parameter) between both electrodes was measured in order to identify the resonant frequency. Due to process variations, significant inter-chip frequency deviation occurs. Indeed, according to the speciation of the PiezoMUMPs™ technology, the trench size created by DRIE etching can vary by up to 50 µm. While variations to this extent were not observed during this work, trench dimension size variations of multiple micrometers were observed across different chips. To quantify the frequency variation between chips, the standard deviation between the average frequency of the 16 dies was calculated. This value was 0.199 MHz for an average frequency of 1.3136 MHz. However, on a single die, trench size variation between different PMAUT devices was moderate, resulting in a relatively precise resonant frequency with a standard deviation of 0.007 MHz.

Figure 14A:
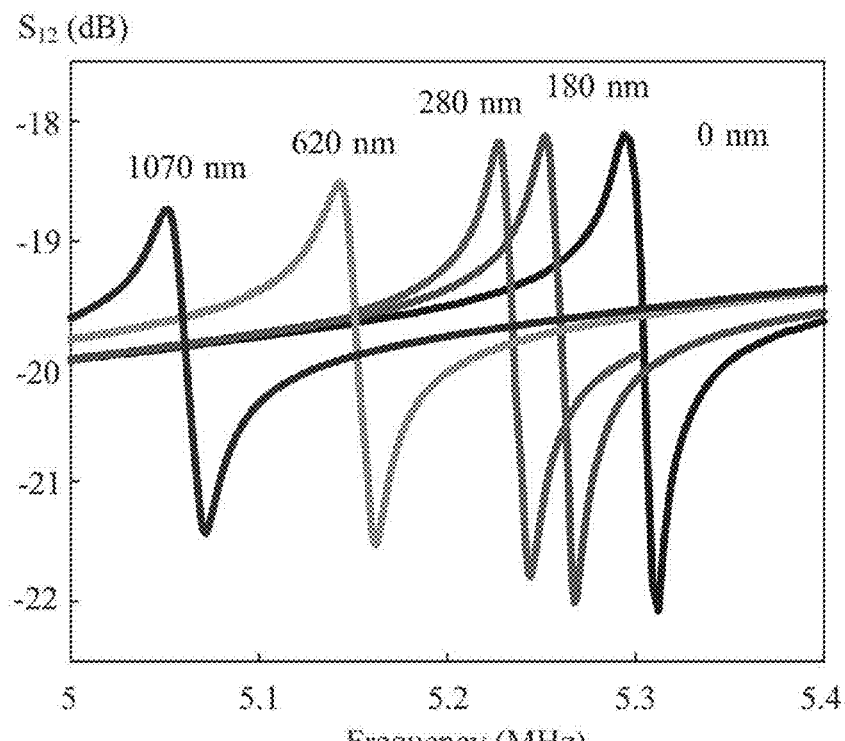
FIGS. 14A and 14B depicts the measured resonance frequency for different Parylene-C thicknesses for the first mode and the second mode of resonance respectively for PMAUTs according to embodiments of the invention.
Figure 14B:
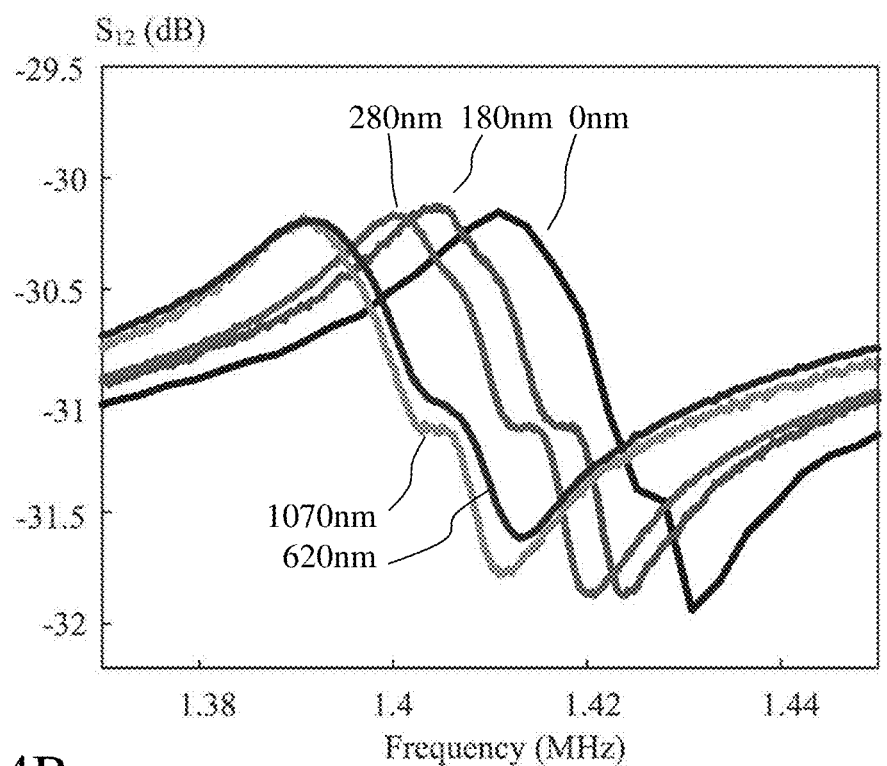

To verify the effect of adding Parylene-C, four different thicknesses were deposited using the Parylene-C deposition system. These being 180 nm, 280 nm, 620 nm and 1070 nm. Referring to FIGS. 14A and 14B the results for the first and second modes are depicted confirming that resonant frequency can effectively be tuned using Parylene-C. The deposition of 1 µm of Parylene-C allows for a reduction of resonant frequency of the first and second modes by 25 kHz and 250 kHz, respectively.

The quality factor was calculated based on the results presented in FIGS. 14A and 14B respectively. However, because the resonance curve does not reach a peak of 3 dB, the calculation was performed using the phase derivative of the impedance. Accordingly, the measurement data in FIGS. 14A and 14B for each resonator was fitted to a Butterworth van dyke equivalent circuit to determine its impedance. The quality factor was then calculated using Equation (16) where $Q_{s,p}$ is the quality factor at the resonance and anti-resonance frequencies. After depositing 1 µm of Parylene, for the first and second modes, the quality factor decreases from 10.6 to 8.7, and from 79.44 to 31.995, respectively.

$$Q_{s,p} = \frac{f}{2}\left|\frac{d\phi}{df}\right|_{f=f_s \text{ or } f_p} \quad (16)$$

As evident from FIG. 13A the measured values for the first mode of resonance are in excellent agreement with simulations. For the second mode, simulation underestimated the values compared to the measurements while exhibiting a similar slope. The discrepancies between simulation and measurement are due to the fact that an exactly symmetrical model with estimated values of over-etching was used for simulations, while the fabricated device is in fact slightly asymmetrical. Indeed, the fabricated membrane is not exactly centered over the trench. Also, an etching gradient may exist over the device which is not considered within the simulations.

2D2: Chip-to-Chip Transmission

Figure 15:
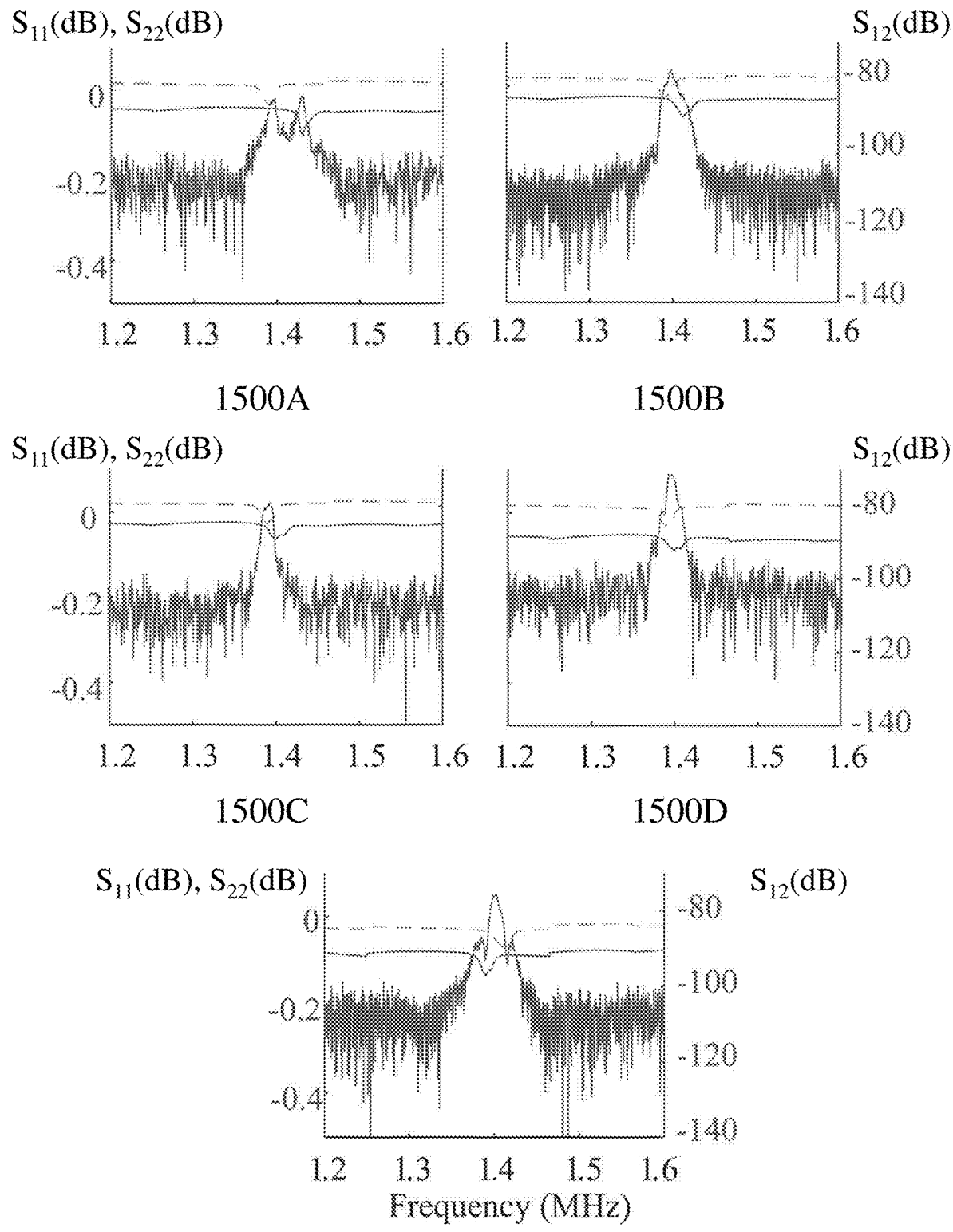
FIG. 15 depicts scattering parameter measurements for chip to chip transmission with varying Parylene-C thickness for the first mode of resonance for PMAUTs according to embodiments of the invention.
Figure 16:
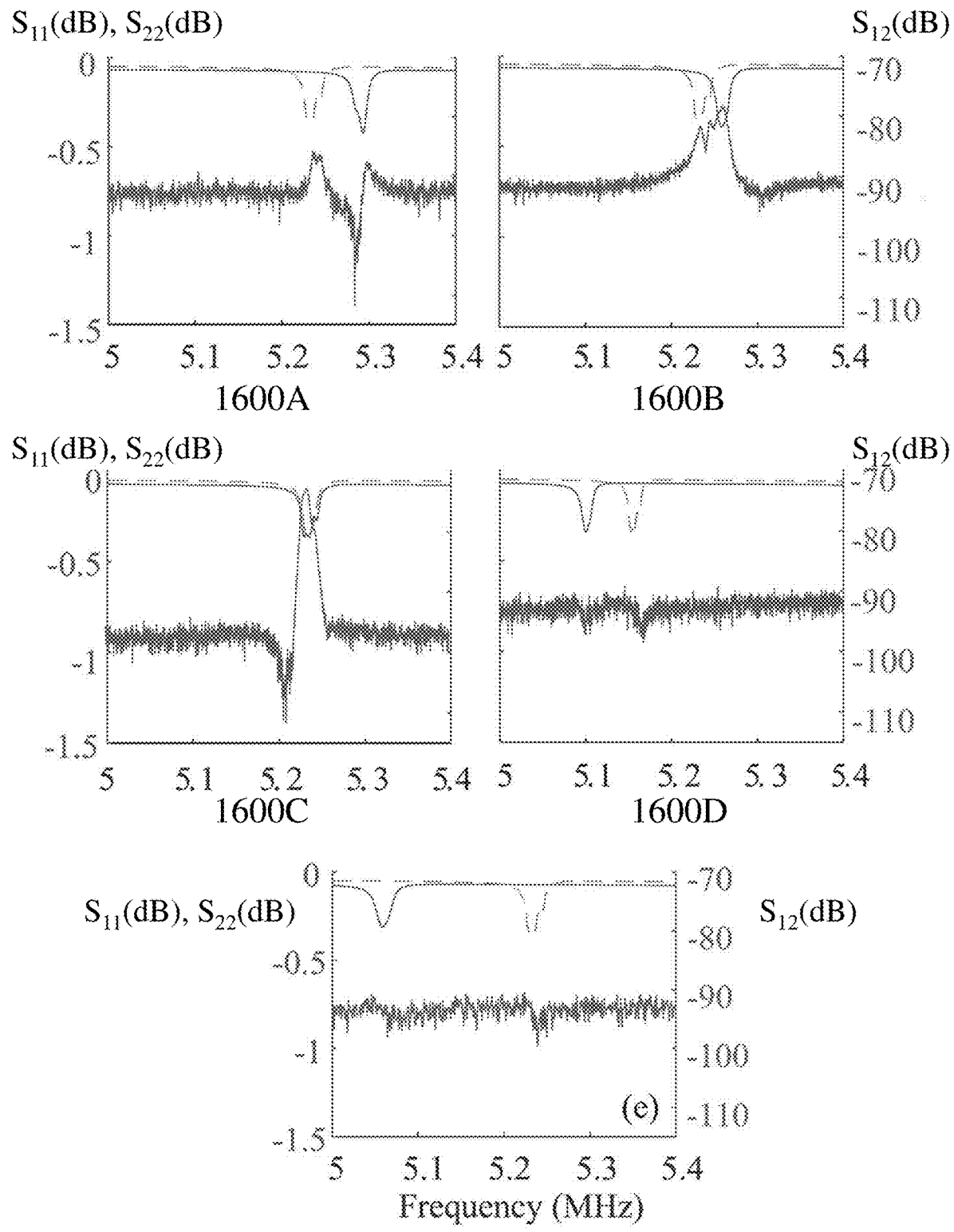
FIG. 16 depicts scattering parameter measurements for chip to chip transmission with varying Parylene-C thickness for the second mode of resonance for PMAUTs according to embodiments of the invention.

To verify that the deposition of Parylene-C can effectively increase transmission efficiency, chip-to-chip ultrasonic transmission measurements were also performed. Two sets of 4 PMAUTs (as depicted in FIG. 11C) were connected in parallel and of slightly different resonant frequencies were mounted in a 28-pin surface mount package and electrically connected through ball wire bonding. The packages were incorporated onto a test PCB and placed in front of each other at a distance of 2 mm. Using a Vector Network Analyzer (VNA) the transmission characteristics were measured for the first and second modes of resonance for all deposited Parylene-C thicknesses. These being depicted in FIGS. 15 and 16 for transmission in the first and second modes, respectively.

For the first mode, without any Parylene-C, the frequency mismatch between the PMAUT transmitter and receiver results in a large overall signal transmission loss of around 84 dB. A deposition of 180 nm and 280 nm of Parylene-C reduces the resonant frequency of the second PMAUT and increases acoustic power transfer. The deposition of 620 nm of Parylene-C further reduces the resonant frequency of the second PMAUT in such a way that both resonant frequencies are matched. In this case, the transmission loss is optimal with a value of 71 dB. Finally, when 1070 nm of Parylene-C is deposited, the resonant frequency of the second PMAUT moves lower than that of the first PMAUT, thus re-increasing the transmission loss.

Similarly, for the second mode, without any Parylene-C, signal transmission loss is around 86 dB. A deposition of 180 nm of Parylene-C reduces the resonant frequency of the second PMAUT and increases acoustic power transfer. For a deposition of 280 nm of Parylene-C, both resonant frequencies are matched. In this case, the transmission loss is optimal with a value of 72 dB. Finally, when 620 nm and 1070 nm of Parylene-C are deposited, the resonant frequency of the second PMAUT moves lower than that of the first PMAUT, thus re-increasing the transmission loss. Using this Parylene-C tuning technique, it is thus possible to maximize acoustic power transfer efficiency in chip-to-chip PMAUT communications.

Figure 17:
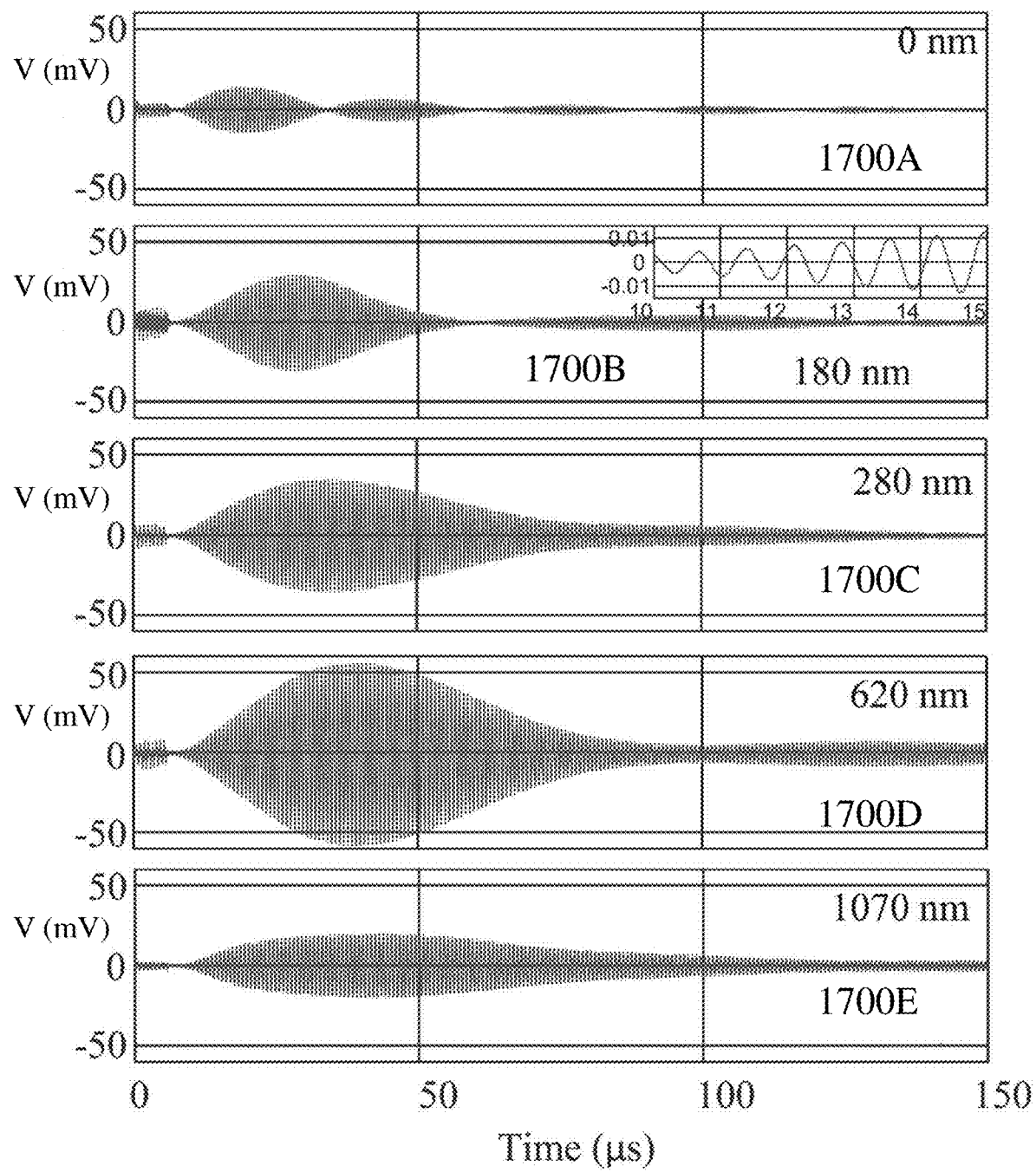
FIG. 17 depicts chip-to-chip transmission measurements in the time domain with varying Parylene-C thickness for the first mode of resonance for PMAUTs according to embodiments of the invention.
Figure 18:
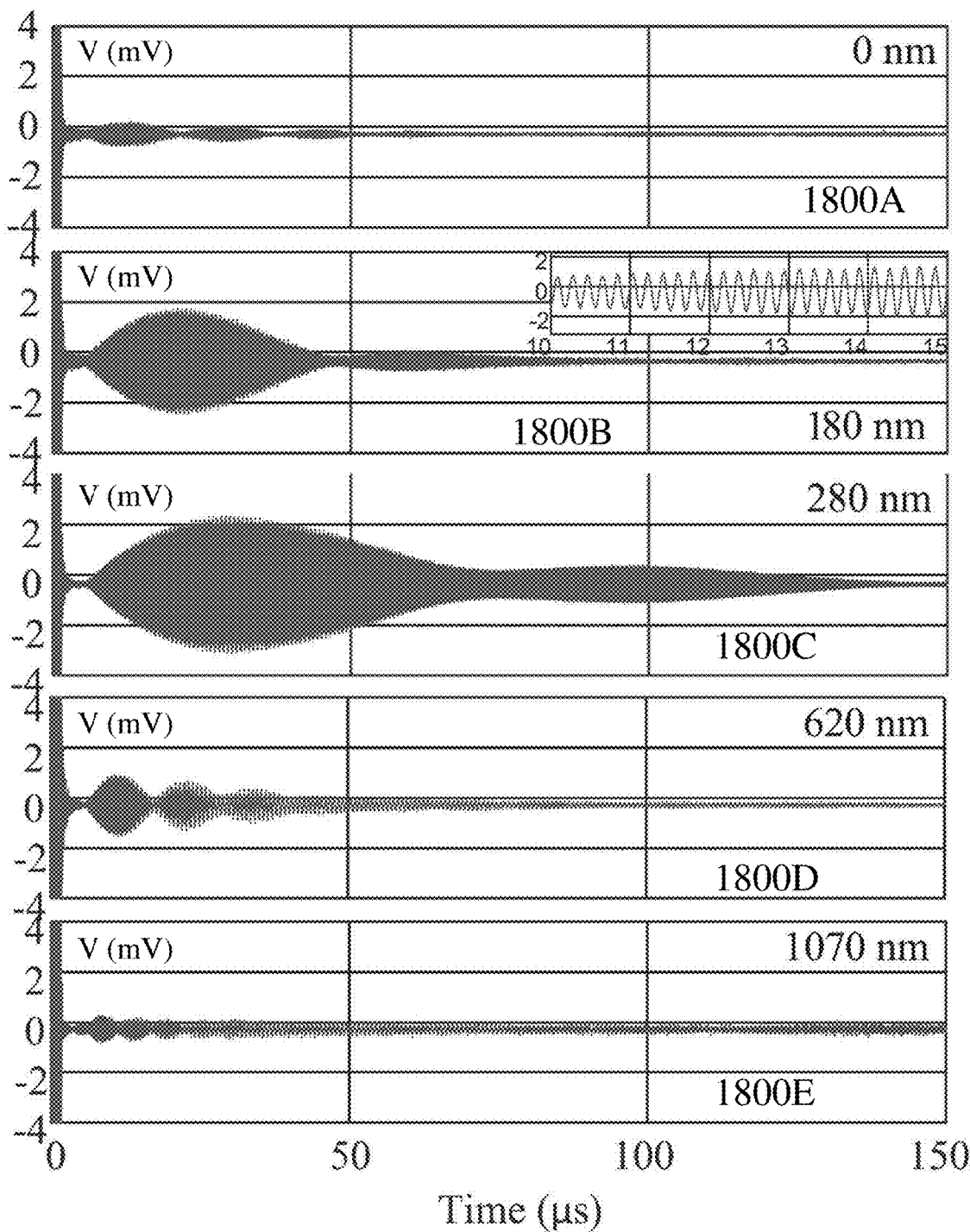
FIG. 18 depicts chip-to-chip transmission measurements in the time domain with varying Parylene-C thickness for the second mode of resonance for PMAUTs according to embodiments of the invention.
Figure 19A:
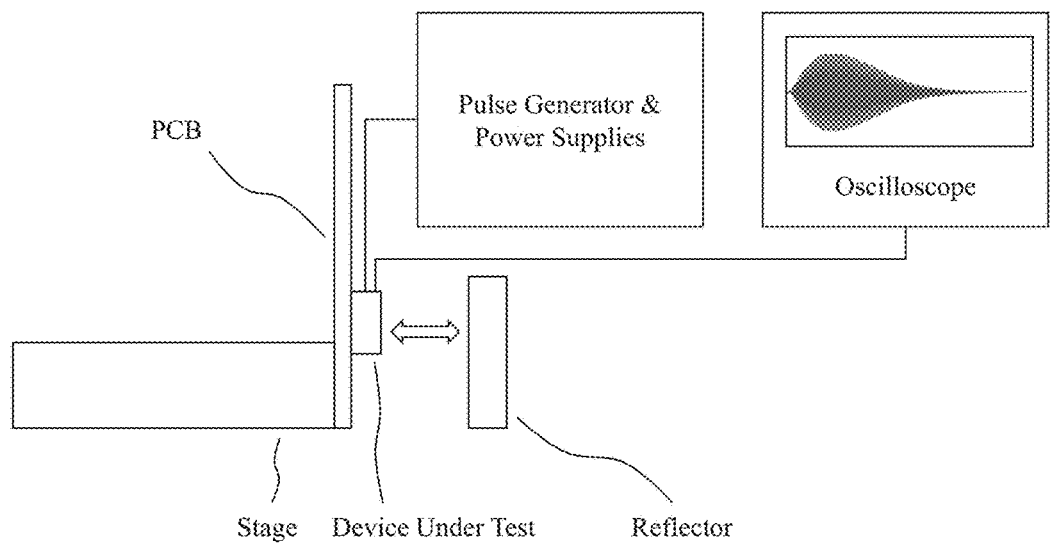
FIG. 19A depicts the measurement setup for time domain ranging measurements.
Figure 19B:
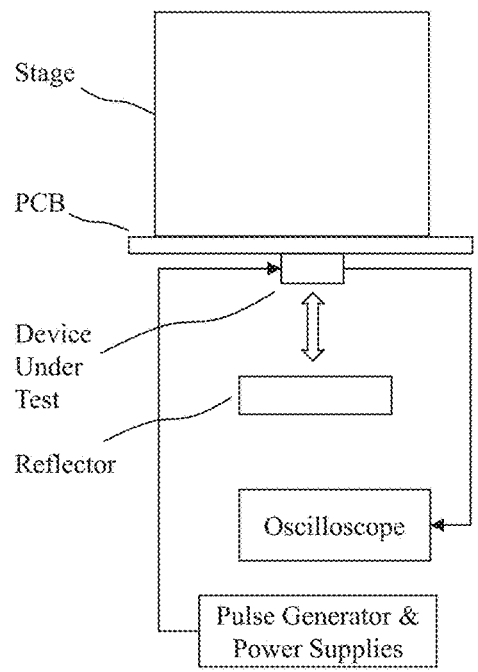
FIG. 19B depicts a close-up of the PCB for performing time domain measurements.
Figure 19C:
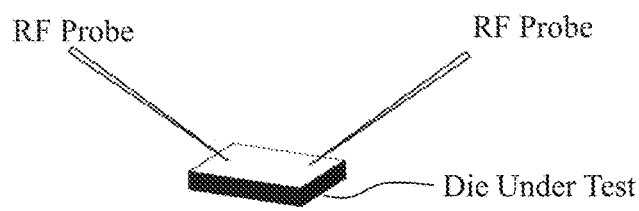
FIG. 19C depicts a close-up of the chip under frequency domain measurements.
Figure 19D:
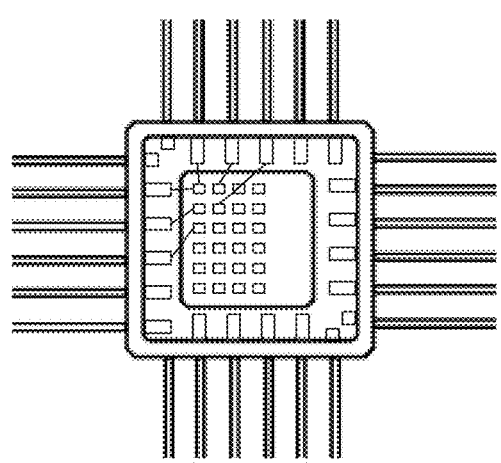
FIG. 19D depicts a close-up of the chip and package for time domain measurements.

In order to test chip-to-chip communication in the time domain for different thicknesses of Parylene-C, the same two sets of PMAUTs were placed at the same distance as for the transmission measurements. A signal generator was used to excite the first set of PMAUTs with a sinusoidal signal of 4 periods at their resonant frequency. It was observed that misalignment between emitter and receiver results in a reduction of the amplitude of the transmitted signal. Hence, it is important to be able to perform alignment in a repeatable fashion to ensure the accuracy of measurements for different Parylene-C thicknesses. To do so, the test PCBs were mounted onto a translation stage as depicted in FIG. 19A. The stage makes it possible to precisely control the alignment of the PCBs. For the measurement of the first thickness, the stage was carefully translated in X and Y until achieving the strongest transmission, corresponding to the best alignment of transmitter and receiver. After each Parylene-C deposition, the stage adjustment was maintained in order to preserve the same alignment conditions for all measurements. The acoustic signal received by the second set of PMAUTs was amplified using a transimpedance amplifier (TIA) and measured using an oscilloscope. FIGS. 17 and 18 depict the time domain measurement results. One can see that in FIG. 17 a thickness of 620 nm leads to a maximum amplitude of the received signal for the first mode of resonance whilst from FIG. 18 it is evident that for a thickness of 280 nm the amplitude of the received signal for the second mode of resonance is maximal, which agrees with the results obtained from the transmission measurements.

2D3: Ranging

With the optimal Parylene-C coating, ranging measurements were performed using a translation stage. FIGS. 19A to 19D depict the measurement setup. The test PCB was screwed onto the stage vertically whilst a copper sheet was positioned facing the PCB to act as an acoustic reflector. An excitation signal composed of an 8 period-long sine wave with a frequency of 1.4 MHz and an amplitude of 10 Vpp was applied to the transmitting PMAUTs in order to generate an acoustic wave. The receiving PMAUTs, on the same chip as the transmitting ones and at a distance of 200 were used to detect the reflected signal. The stage was gradually displaced transversely to vary the separation distance between the chip and the reflector.

Figure 20A:
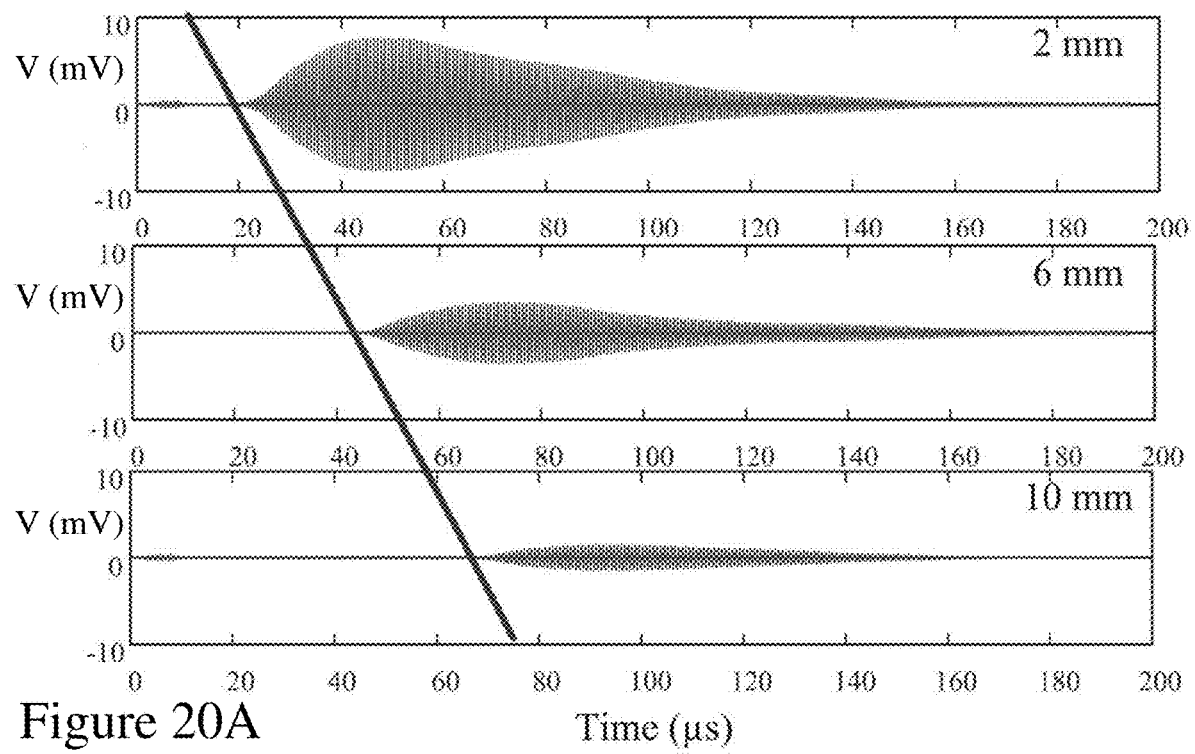
FIG. 20A depicts measurements of the received pulse for three different reflection distances, namely, 2 mm, 6 mm, and 8 mm using PMAUTs according to embodiments of the invention.
Figure 20B:
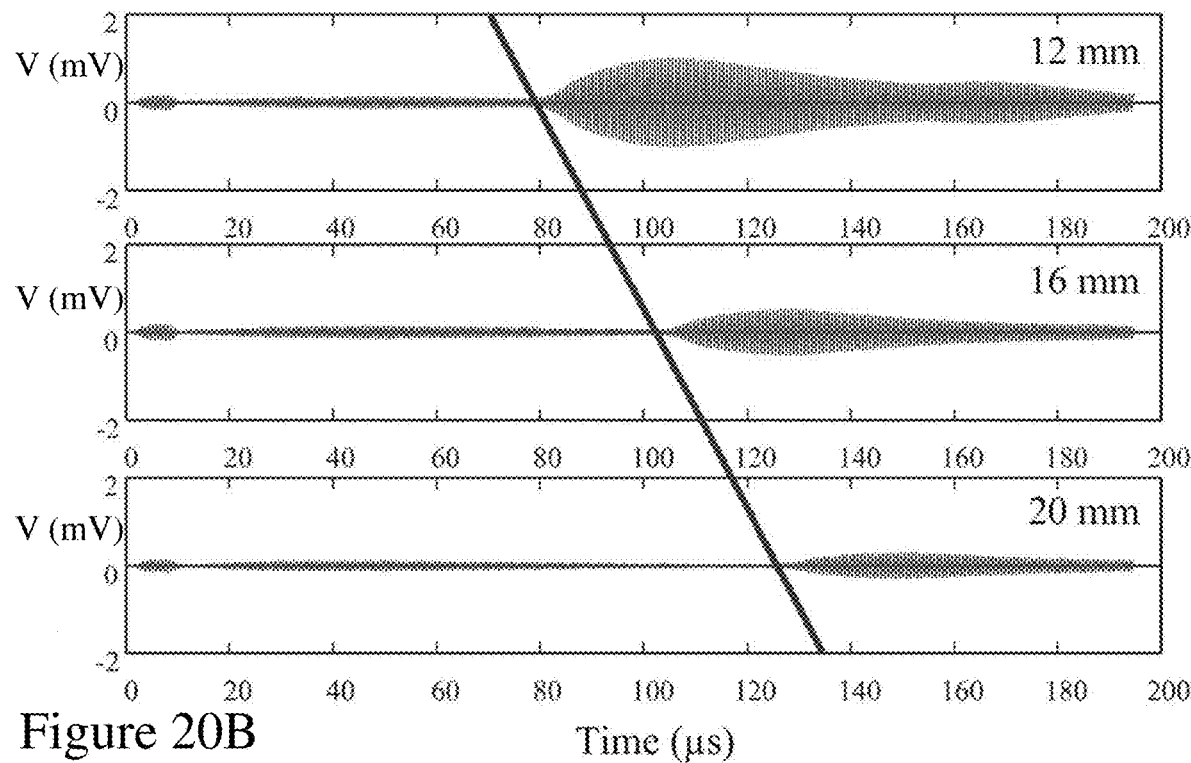
FIG. 20B depicts measurements of the received pulse for three different reflection distances, namely, 12 mm, 16 mm and 20 mm using PMAUTs according to embodiments of the invention.

Before acquiring the ranging measurements, cross-talk between the emitting and receiving PMAUT was measured and characterized. Afterwards, cross-talk was subtracted from the received signal to best represent the acoustic transmission. FIGS. 20A and 20B depict the measurements obtained for separation distances ranging from 2 mm to 20 mm. Separation distance can be calculated from measurements using Equation (17) as where c is the speed of sound and t is the travel time. The distance is divided by two to take into account the fact that the sound has to travel to the reflector and back again. Results show that the PMAUT can be used to accurately measure distances with millimeter accuracy even with an excitation signal of relatively low amplitude.

$$d = \frac{t \cdot c}{2} \tag{16}$$

Figure 20C:
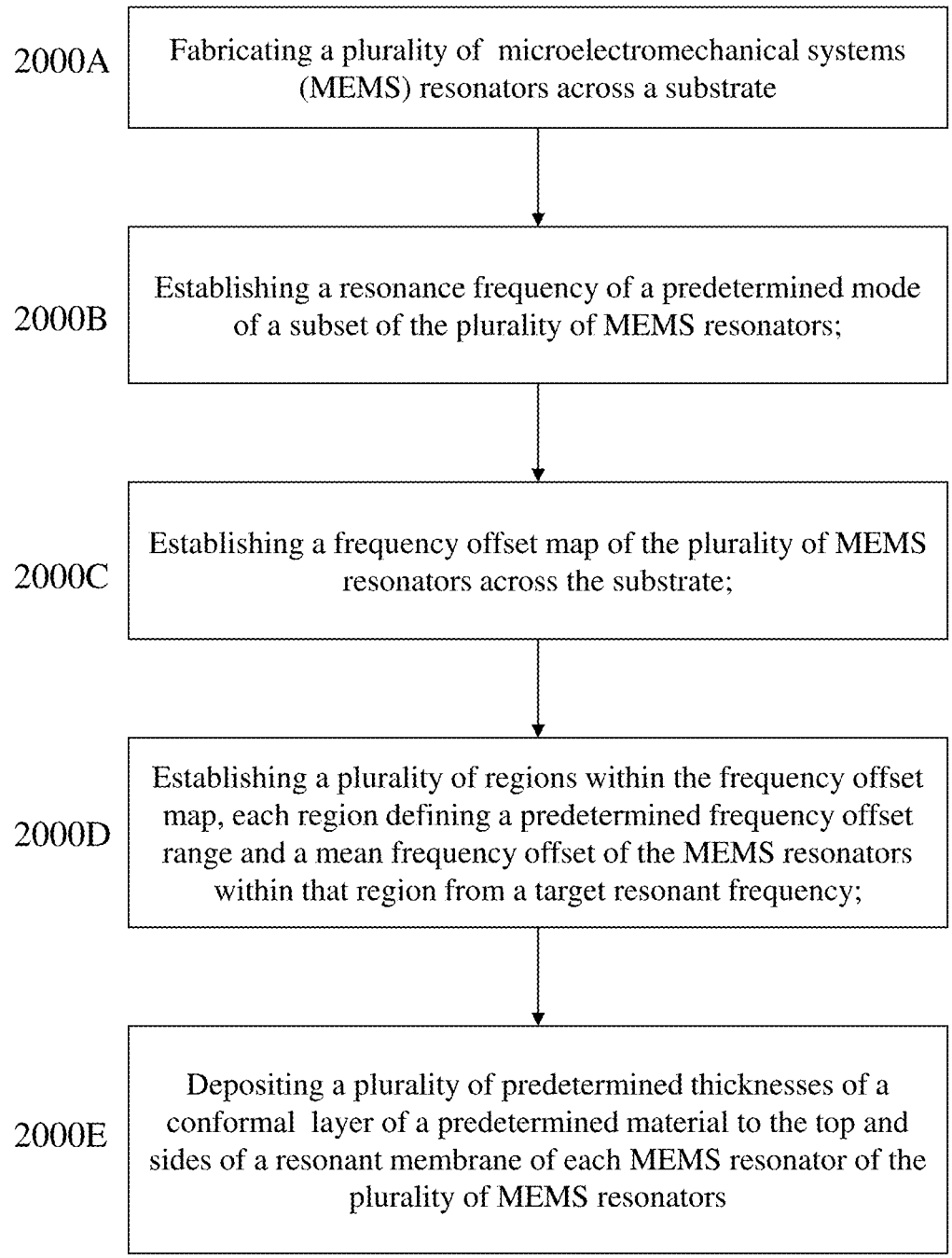
FIG. 20C depicts an exemplary process flow for defining conformal layer thicknesses to be applied to MEMS resonators across a substrate to tune them to a target resonant frequency.

As noted above in respect of the frequency tuning mechanism the conformal coating may be applied at different thicknesses across regions of a substrate based upon mapping the MEMS resonators across the substrate. This mapping may be with respect to the frequencies of the MEMS resonators, the frequency offsets of the MEMS resonators from a target frequency, or the damping of the MEMS resonators. Accordingly, this may be achieved using a process flow such as depicted in FIG. 20C comprising first to fifth steps 2100A to 2100E respectively. These being:

First step 2000A: Fabricating a plurality of microelectromechanical systems (MEMS) resonators across a substrate;

Second step 2000B: Establishing a resonance frequency of a predetermined mode of a subset of the plurality of MEMS resonators;

Third step 2000C: Establishing a frequency offset map of the plurality of MEMS resonators across the substrate;

Fourth step 2000D: Establishing a plurality of regions within the frequency offset map, each region defining a predetermined frequency offset range and a mean frequency offset of the MEMS resonators within that region from a target resonant frequency; and Fifth step 2000E: Depositing a plurality of predetermined thicknesses of a conformal layer of a predetermined material to the top and sides of a resonant membrane of each MEMS resonator of the plurality of MEMS resonators.

Accordingly, as discussed above each predetermined thickness of the plurality of predetermined thicknesses of the conformal layer is established in dependence upon a region of the plurality of regions and applied to that region of the plurality of regions and each predetermined thickness of the plurality of predetermined thicknesses of the conformal layer is established in dependence upon a difference between the mean frequency offset for that region of the plurality of regions and the target resonant frequency.

It would be evident that within other embodiments of the invention the resonator membrane may be of a different geometry. Accordingly, embodiments of the invention may be employed in conjunction with resonator membranes that are square, rectangular, elliptical, hexagonal etc. Optionally, within other embodiments of the invention piezoelectric excitation of the membrane may be replaced by another MEMS actuation methodology such as electrostatic actuation for example. Optionally, within other embodiments of the invention the MEMS resonator may be a piezoelectric bulk mode disk resonator, a clamped-clamped (C-C) beam resonator, a tuning fork resonator, or a Lame mode resonator for example. Optionally, within other embodiments of the invention the MEMS resonator may employ flexural modes, bulk modes, shear modes, or torsional modes for example. Optionally, within other embodiments of the invention the MEMS resonator may employ a single resonator or multiple coupled resonators.

3: Process Variation Tolerant Piezoelectric Acoustic Transducers

3A: Background

As noted above in Section 2A a common fabrication technology for PMAUTs within the prior art is through a silicon on insulator (SOI) wafer wherein the bottom silicon layer serves as the handle substrate and the top silicon layer is patterned as needed to form the device structural membranes. However, significant process variations arising from the long DRIE step required to release the membrane means that the device dimensions are affected by the final trench size and therein the resonator resonant frequency. Alternatively, using whilst cavity bonded SOI wafers can provide a more accurate and robust alternative with lower process variation driven impact on device dimensions but comes at a higher cost. Similarly, whilst a PMAUT can be formed through surface micromachining, wherein the vibrating membrane is deposited and released by means of etching an underlying sacrificial layer, the reduced process variations in final membrane dimensions come at the cost of realizing a high quality piezoelectric where the membrane is deposited on top of the sacrificial layer rather than crystalline silicon.

Within the prior art it has been shown that the sensitivity of the resonator's resonant frequency to process variations can be decreased by reducing the residual internal stress within the membrane. Within the prior art this has been demonstrated through a combination of introducing perforations at the perimeter of the membrane, using a ring-shaped top electrode, and removing the piezoelectric material at the center of the membrane. However, whilst the sensitivity of the resonant frequency to process variations is reduced the diameter of the membrane is still subject to variation, resulting only in a partial improvement of resonant frequency accuracy. Alternatively, within the prior art the piezoelectric layer and backside electrode additional processing to etch these elements to form rib structures results in improved reproducibility with the additional benefit of increasing the bandwidth of the PMAUT, albeit at increased cost and complexity.

As demonstrated above in Section 2 the inventors have demonstrated that post-processing tuning of the PMAUT resonant frequency tuning can be achieved through the deposition of a conformal coating onto the membrane in order to tune the mass and spring constant of the device. Whilst effective, precise and relatively simple, this technique in its simplest form of coating the entire wafer within a common thickness limits the tuning for all transducers in the same manner thereby failing to mitigate the impact of intra-wafer process variations. Whilst increased processing complexity may allow for providing different thicknesses of the conformal coating to different regions of a wafer this again comes at increased cost per PMAUT die.

Accordingly, the inventors have established an innovative PMAUT device topology with a novel anchoring pattern for the resonator membrane in order to reduce the influence of process variations on the resonant frequency of the PMAUT. As outlined below the innovative topology has been demonstrated using the PiezoMUMPs™ SOI commercial fabrication process. This commercial SOI technology, with a basic anchoring approach, yields membranes released by DRIE that suffer from the frequency matching issues detailed above. However, the innovative anchoring topology significantly reduces the impact of process variations. Within Section 3B the theoretical basis for the innovative anchoring methodology is outlined before the details and measurement results for prototype PMAUTs employing the innovative anchoring methodology are presented in Sections 3C and 3D respectively.

3B: Theoretical Background

The innovative anchoring topology is depicted in FIGS. 21A to 21E respectively. As depicted the top silicon layer of a SOI wafer is lithographically patterned to form a membrane within a toroid anchor, both connected together by several supporting arms as illustrated in FIG. 21B. Subsequently, a trench is etched into the bottom silicon layer to release the membrane using DRIE. According to the PiezoMUMPs™ design rules, this DRIE etched trench through the entire silicon wafer thickness can have dimensions that vary by as much as 50 µm. Accordingly, the diameter of the anchored toroid is exposed to significant variations, but these do not influence the support and membrane dimensions. As shown in FIGS. 21A and 21B then independent of the DRIE trench size variation, the entire circumference of the toroid anchor remains fully anchored to the silicon handle wafer. This is in contrast to the typical anchor topology within the prior art which is depicted in FIG. 21C wherein the size of the anchors now depends upon the achieved dimension of the trench. Accordingly, in the innovative anchoring scheme established by the inventors, the resonant frequency of the device is dominated by the dimensions of the top silicon layer pattern (PMAUT membrane and supports) rather than the size of the DRIE trench, making this topology less sensitive to process variations. Indeed, the support and membrane dimensions will mostly depend on the top layer patterning process that is subject to a much lower process variation of 3 µm rather than the 50 µm variation of the DRIE through wafer etching for the trench formation.

The resonant frequency of a mechanical structure can be expressed by Equation (17) where m represents its mass and k its spring constant. For the device of interest according to embodiments of the invention the mass, which is concentrated in the suspended membrane, is not affected significantly by fabrication process variations. As such, the impact of process variations on k is now the main cause for resonant frequency variations from device to device. For a device without a toroidal anchor, as illustrated in FIGS. 21C and 21E the total support spring constant is given by Equation (18) where $k_1$ is the spring constant of the nominal-length support and $\Delta k_1$ its variation caused by DRIE process variation.

$$f_0 = \frac{1}{2\pi}\sqrt{\frac{k}{m}} \quad (17)$$

$$\frac{1}{k_{tot}} = \frac{1}{k_1} \pm \frac{1}{\Delta k_1} \quad (18)$$

$$\frac{1}{\Delta k_1} \propto \frac{\Delta l_1}{w_1} \quad (19)$$

Because of Equation (19), where $l_1$ is the length and $w_1$ the width of the support, and because support lengths within prior art PMAUTs are generally of the order of a few micrometers, the effects of DRIE process variation would be expected to cause substantial variations in $k_{tot}$.

In contrast, with the PMAUT anchoring topology concept established by the inventors, as depicted in FIGS. 21B and 21D, the total spring constant $k_{tot}$ can be approximated as given by Equation (20) where $k_2$ is the spring constant of the nominal suspended portion of the toroid and $\Delta k_e$ is the variation of $k_2$ induced by DRIE process variations. Further, using the relationship defined within Equation (21) where $\Delta l_2$ is the variation in length of the suspended portion of the toroid and $w_2$ is the arc length of the toroid, and $l_2$ is the length of the toroid, then it follows that, for the scenario $l_1 \geq l_2$ and $w_2 \gg w_1$ then we obtain the result given by Equation (22). Accordingly, from Equations (19) to (22) the total spring constant can be approximated by Equation (23) which shows that the toroidal architecture can greatly reduce the influence of DRIE process variations on the accuracy of the resonant frequency.

$$\frac{1}{k_{tot}} = \frac{1}{k_1} + \frac{1}{k_2} \pm \frac{1}{\Delta k_2} \quad (20)$$

$$\frac{1}{\Delta k_2} \propto \frac{\Delta l_2}{w_2} \quad (21)$$

$$\frac{1}{k_2} \pm \frac{1}{\Delta k_2} \ll \frac{1}{k_1} \quad (22)$$

$$k_{tot} \approx k_1 \quad (23)$$

3C: Design
3C1: Fabrication Process

The PiezoMUMPs™ employed by the inventors to fabricate the prototype PMAUTs according to embodiments of the invention exploits a sequence of process stages such as previously described and depicted with respect to FIGS. 3A to 3C respectively and the steps defined by first to eleventh process stages 300A to 300K respectively. Accordingly, the manufacturing sequence is not repeated here. The PiezoMUMPs™ process employs a SOI wafer with standard 400 nm thick insulator layer and 10 µm thick conductive silicon device layer. The process further employs standard films of 200 nm pad oxide layer, a 500 nm aluminum nitride piezoelectric layer and 1 µm aluminum upper electrical layer. In common with the designs described and depicted in respect of Sections 1 and 2 the PMAUTs had a 200 µm resonator membrane diameter with 190 µm diameter upper electrode.

Figure 22A:
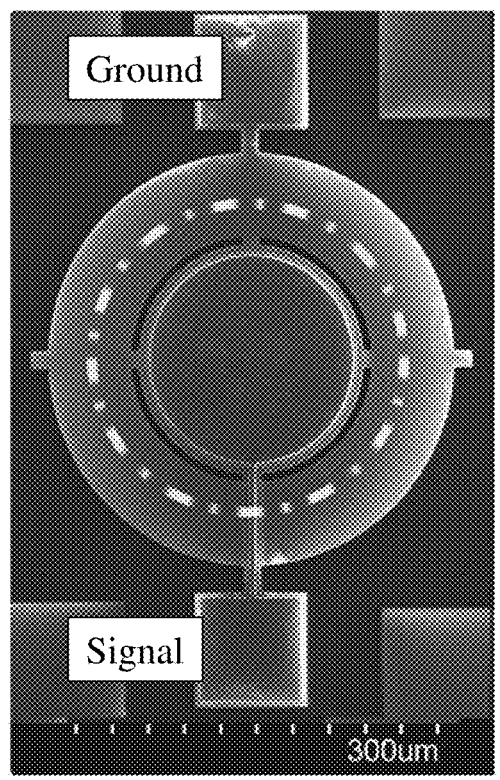
FIGS. 22A and 22B depict SEM micrographs of a fabricated PMAUT device and detail of the toroid of a PMAUT respectively exploiting the anchoring methodology depicted in FIGS. 21A and 21B.
Figure 22B:
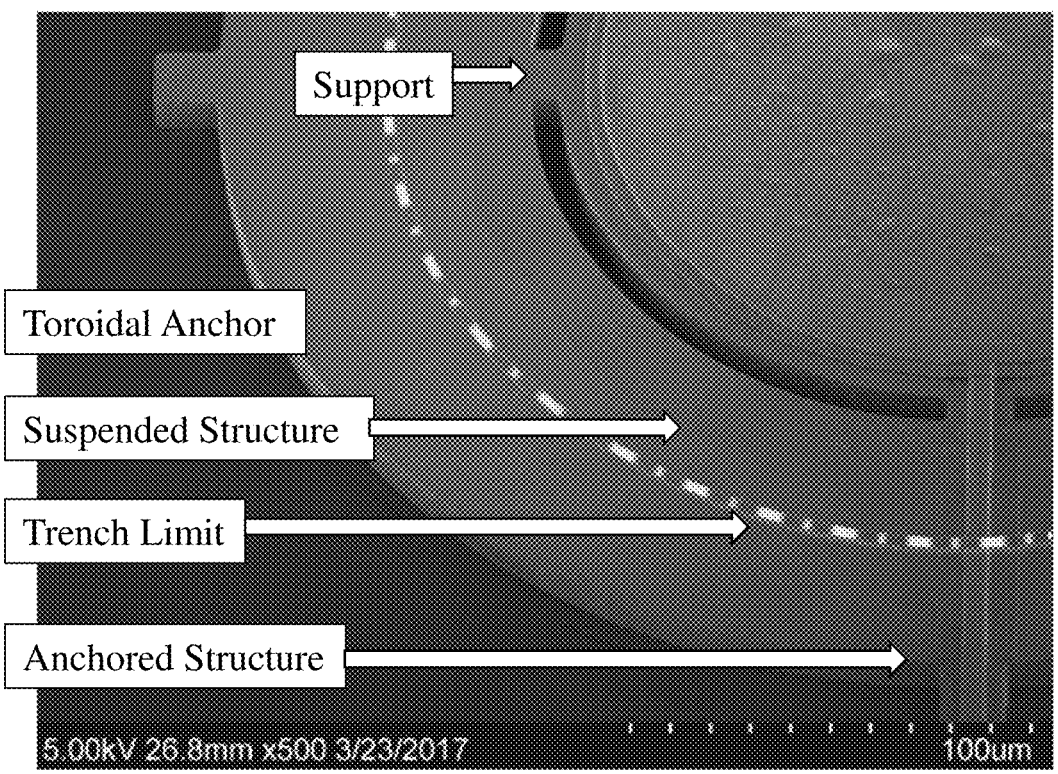

FIGS. 22A and 22B depict SEM micrographs of the fabricated device and toroid detail respectively. The PMAUT device has a membrane diameter of 200 µm, a support width of and a support length of 10 The trench has a diameter of 240 µm and the toroid has a total width of 80 µm, of which 10 µm is anchored.

3C2: Finite-Element Simulations

The finite-element simulator COMSOL Multiphysics was used for device design, and to predict the impact of process variations on the resonance frequency of the proposed PMAUT. Eigenfrequency simulations were performed using the physical parameters listed in Table 4, which, as for the thicknesses of the different layers, were selected in accordance with the PiezoMUMPs specifications.

TABLE 4

Physical Parameters Used in Eigenfrequency Simulations

| Parameter | Si | AlN | Al |
|---|---|---|---|
| $Y_n$ (GPa) | 180 | 348 | 69 |
| $v_n$ | 0.22 | 0.24 | 0.346 |
| $\rho_n$ (g/cm$^3$) | 2.329 | 3.6 | 2.7 |
| $t_n$ (µm) | 10 | 0.5 | 1 |
| $d_{31}$ (nC/N) | — | $-1.9e^{-12}$ | — |
| $\varepsilon_{33}$ | — | 9 | — |
| $e_{31,f}$ (C/m$^2$) | — | $-0.58$ | — |

Figure 23A:
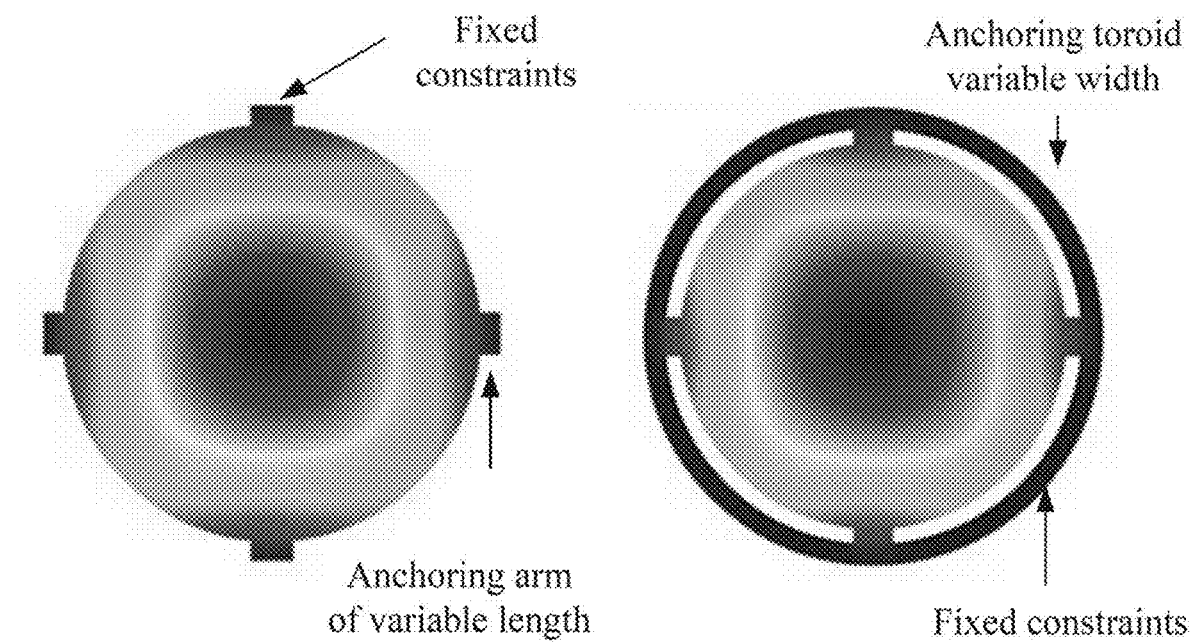
FIG. 23A depicts simulated PMAUT devices with anchoring arms and toroidal anchors respectively according to embodiments of the invention.

To assess the effectiveness of the method presented in this work, similar PMAUT devices were simulated with and without toroidal anchors. The structures simulated are presented in FIG. 23A. For both topologies, the membrane has a diameter of 400 µm and the supports have a width of 20 µm. For the PMAUT with simple anchoring, a fixed constraint is set at the extremity of the supports, whereas, for toroidal anchoring, the fixed constraint is set on the outer perimeter of the toroid. Simulations were then performed, sweeping the support length between 10 µm and 100 µm for the simple anchor, and, for the toroidal anchor, sweeping the supported toroidal width from 10 µm to 100 µm, while maintaining a support length of 10 µm. These sweep parameters make it possible to compare the impact of similar trench size variations for both device topologies.

Figure 23B:
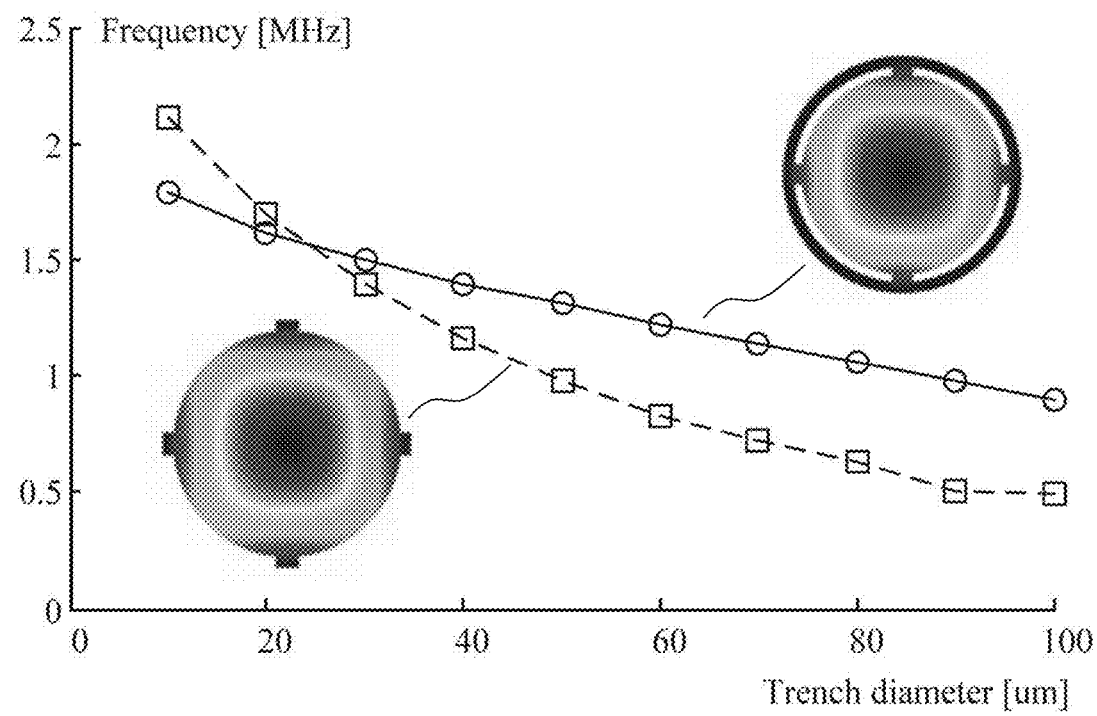
FIG. 23B depicts simulated frequency characteristics PMAUT devices with anchoring arms and toroidal anchors respectively according to embodiments of the invention as a function of trench size variations.

Accordingly, referring to FIG. 23B it is evident that trench size variation has a significant impact on the PMAUT according to the prior art with simple anchoring, where a trench size variation of 90 µm lowers the resonant frequency from 2.1 MHz to 0.49 MHz, a factor of 4.3. In contrast, for the toroidal anchoring topology according to an embodiment of the invention the same trench size variation only lowers the resonant frequency from MHz to 0.9 MHz, a factor of 2.

In these simulations, the support dimensions of the PMAUT with toroidal anchor were kept constant. Varying these parameters allows one to fine tune the toroidal anchoring topology and further optimize it to make it even more robust against process variations. Throughout simulations, for a constant support width of 20 µm, the support length was varied between 5 µm and 50 µm. The parameter ζ, defined as the ratio of the resonance frequency of a PMAUT with a trench of 10 µm to the resonance frequency of a PMAUT with a trench of 100 µm, was then plotted as a function of the support dimension of interest (in this case support length). The parameter ζ serves as a measure of robustness: a frequency invariant structure would have a ratio of 1 and a robust structure would have a ratio near that. These results are presented in FIG. 23C where it is evident that an increase in the length of the anchors leads to an increase of the robustness. Recalling Equation (23), $k_{tot}$ is equal to $k_1$ and independent of trench diameter when $k_1 \ll k_2$. Hence, increasing the support length reduces $k_1$ compared to $k_2$ and therefore increases the resonant frequency robustness.

Similarly, for a constant support length of 10 µm, the support width was varied between 5 µm and 50 µm. Then the same ratio ζ as previously was plotted as a function of support dimension of interest, in this case the support width. The results are also presented in FIG. 23C. Here, it is evident that an increase of the support width leads to a decrease of the resonant frequency robustness. The value of $k_1$ increases compared to $k_2$ leading to the opposite effect of the case above. Hence, to increase the robustness of the PMAUT resonant frequency against trench variations, the spring constant of the supports compared to the spring constant of the toroid must be decreased, which is consistent with the theory. Indeed, as stated in Equations (22) and (23), for $k_2$ significantly greater than $k_1$, $k_{tot}$ becomes approximately equal to $k_1$ and relatively unaffected by variations in $k_2$. However, it must be noted that modifying the dimensions of the supports may also have an influence on PMAUT output acoustic power, which must also be taken into consideration during device design.

3D: Measurement Results

The resonant frequency of the devices was acquired by measuring the $s_{12}$ scattering parameter between both device electrodes. Measurements were made using a probe station with GSG probes and a network analyzer. From an initial experimental fabrication run on the commercial Piezo-MUMPs™ technology 16 sourced dies were tested, which is believed by the inventors to be a sufficient number to demonstrate the benefits of the innovative device geometry with respect to mitigating inter-die performance variations. Each 5×5 mm die holds 12 PMAUT devices with toroidal anchoring and 12 PMAUT devices with regular supports.

Figure 24A:
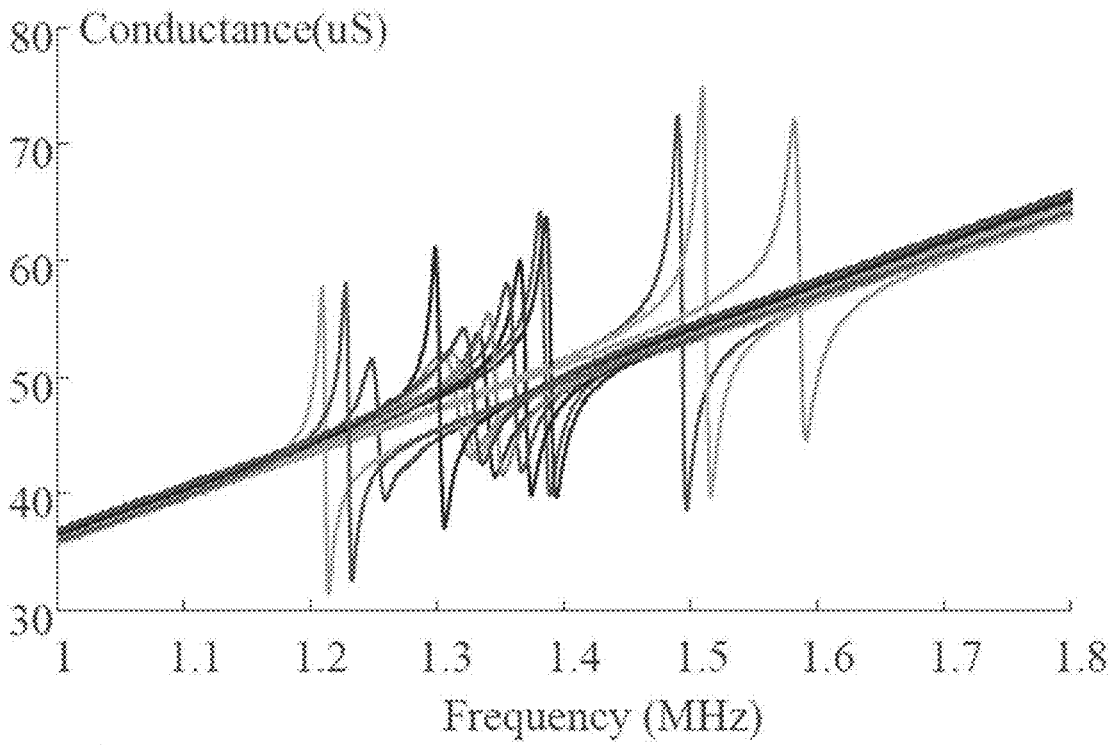
FIG. 24A depicts measured frequency responses of PMAUT devices with toroidal anchors according to an embodiment of the invention.
Figure 24B:
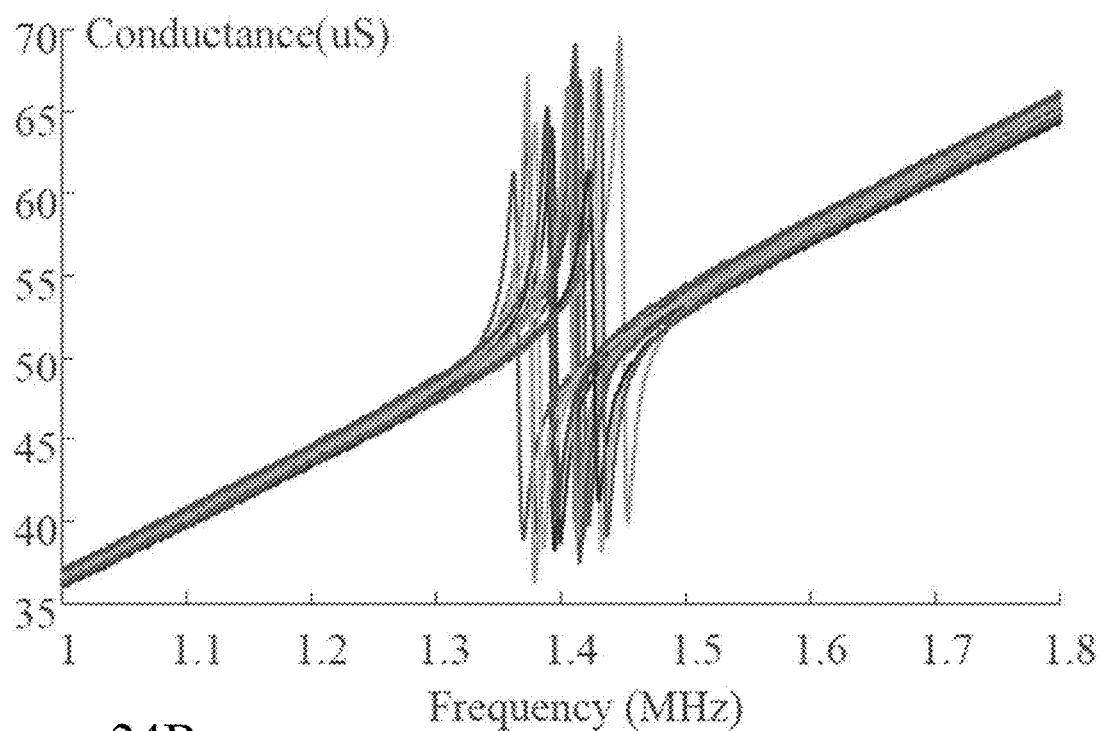
FIG. 24B depicts simulated frequency responses of PMAUT devices with toroidal anchors according to an embodiment of the invention for variations in the trench isolating the membrane from the toroidal anchor.
Figure 24C:
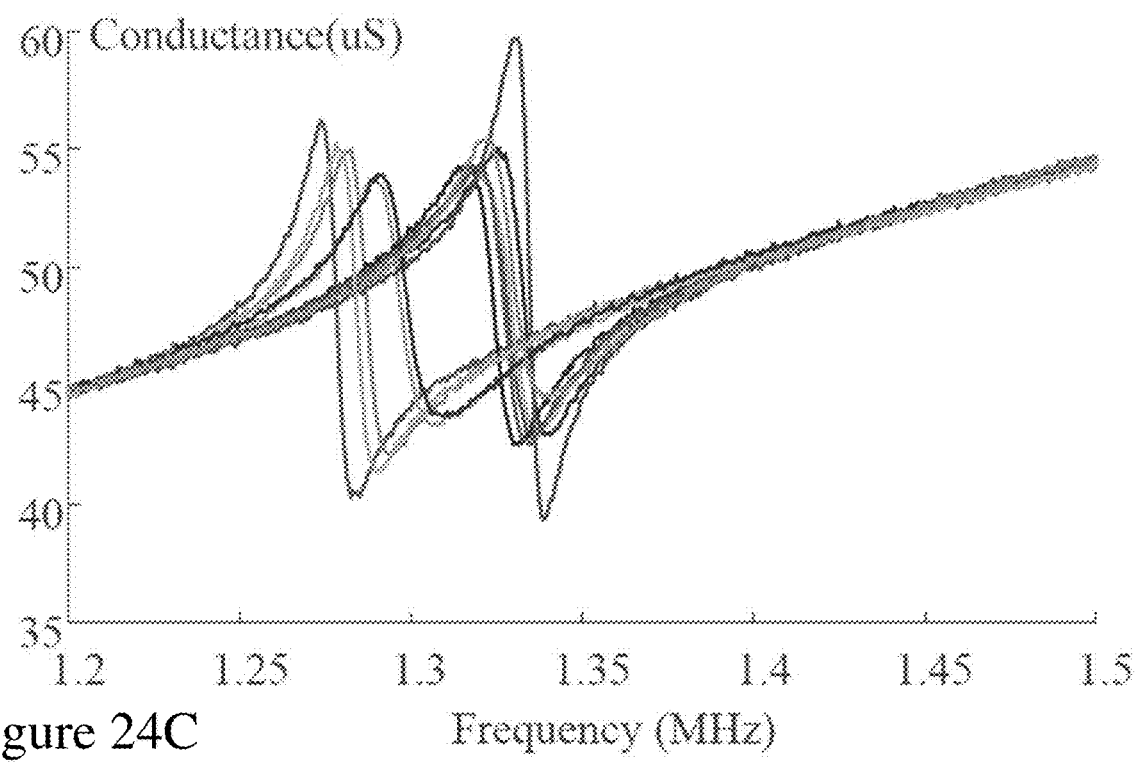
FIG. 24C depicts measured frequency responses of PMAUT devices with toroidal anchors according to an embodiment of the invention.

In order to assess inter-die variations, a PMAUT device with and without toroidal anchoring was characterized on each die. The PMAUT device has a membrane diameter of 200 µm, a support width of 20 µm, and a support length of 10 µm. The trench has a diameter of 240 µm and the toroid has a total width of 80 µm, of which 10 µm is anchored. As depicted in FIG. 24A the average resonant frequency and standard deviation for PMAUT devices according to an embodiment of the invention were respectively 1.401 MHz and 23.07 kHz. In contrast for a prior art PMAUT design with simple anchoring the average resonant frequency and standard deviation were 1.353 MHz and 101.2 kHz respectively. This represents an improvement of more than four times (4×) in resonant frequency variation reduction using the toroidal anchoring scheme according to an embodiment of the invention, which matches the theoretical expectations. Indeed, trench variation has a reduced impact on the toroidal architecture because $k_2$ is much larger than $k_2$ and, according to Equation (23), $k_{tot}$ therefore becomes approximately equal to $k_1$.

As was discussed, using the toroidal anchoring scheme provides an improvement of more than 4× in the resonant frequency variation. In order to compare this trend with simulation, the standard trench diameter variation was estimated to be about 20 µm, which would make the anchored portion of the toroid vary between 10 µm to 30 µm. From FIG. 23B a simulated variation from 10 µm to 30 µm of the anchored portion of the toroid leads to a frequency variation of 0.7 MHz (from 2.1 MHz to 1.4 MHz) for the PMAUT without toroid and of 0.3 MHz (from 1.8 MHz to 1.5 MHz) for a PMAUT according to an embodiment of the invention with toroid. This represents an improvement of 2.33× in resonant frequency variation reduction. These simulated results confirm the measured improvements through the toroidal anchoring scheme, and indicate that the actual trench diameter variation was greater than 20 µm in the process run for the experimental prototypes.

Figure 23C:
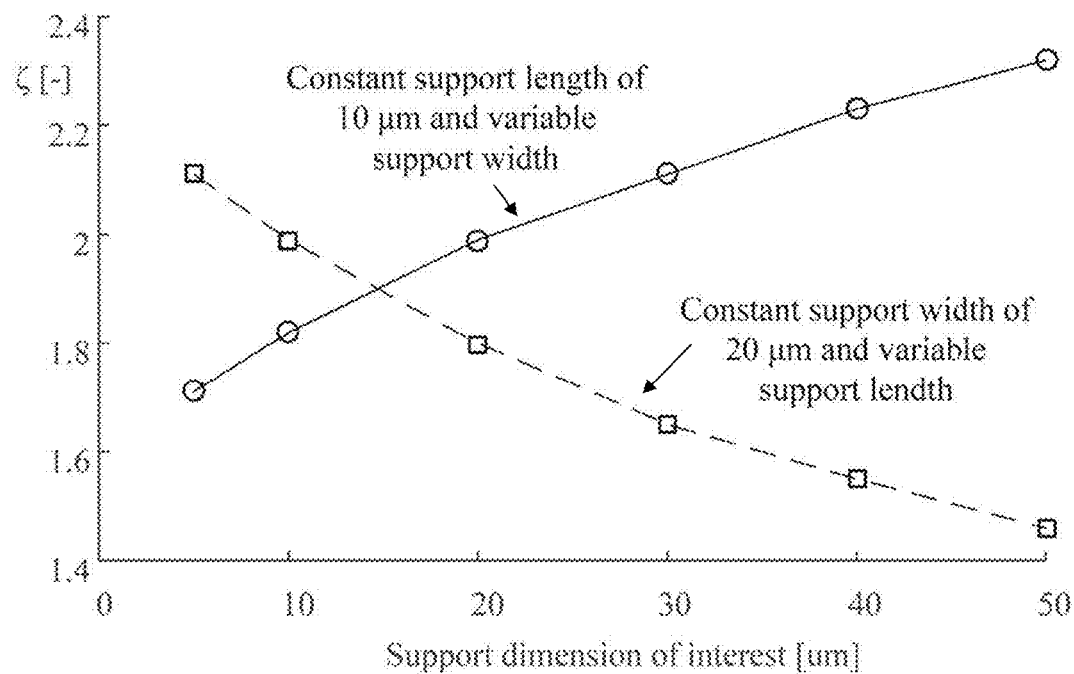
FIG. 23C depicts simulated frequency characteristics of a PMAUT device with toroidal anchor according to embodiments of the invention as the support arms are varied in length and width.
Figure 24D:
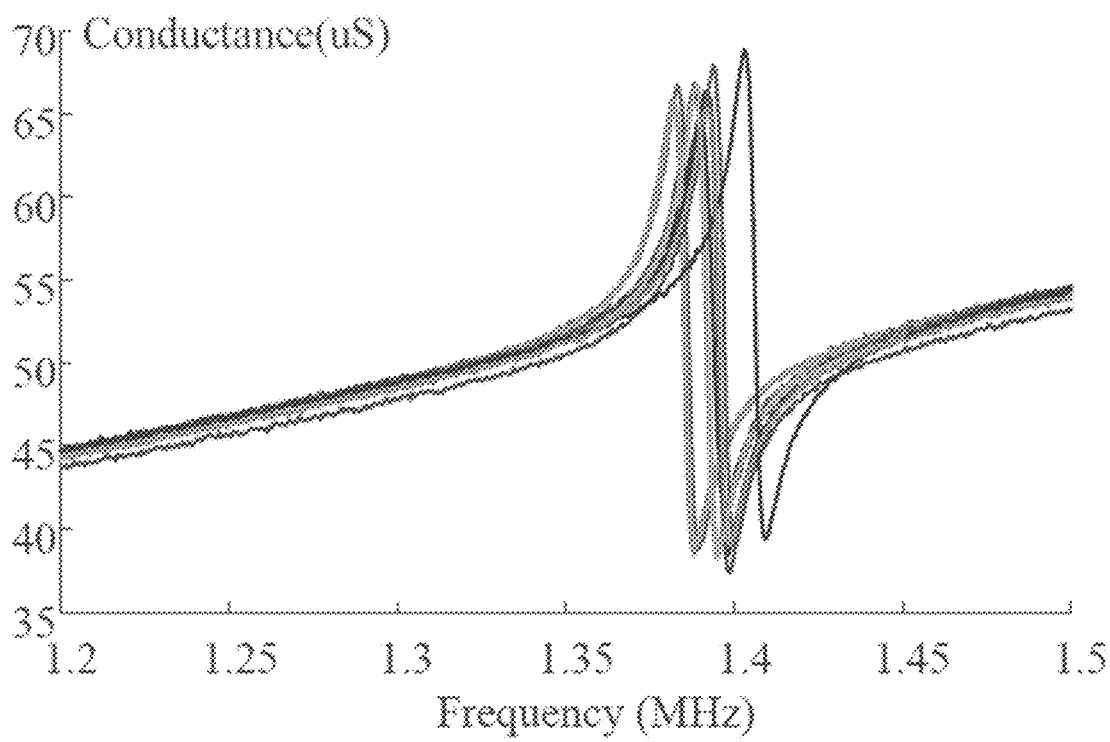
FIG. 24D depicts measured frequency responses of PMAUT devices with anchoring arms according to an embodiment of the invention.

In order to assess intra-die variations, 12 PMAUT devices with and without toroidal anchoring were characterized on the same die. As depicted in FIG. 23C the average resonant frequency and standard deviation were 1.39 MHz and 5.89 kHz respectively with toroidal anchoring according to an embodiment of the invention. In contrast using the prior art simple anchoring the average resonant frequency and standard deviation were 1.31 MHz and 20.1 kHz respectively as depicted in FIG. 24D. This represents a near 3.7× improvement in resonant frequency variation, again consistent with theory. Intra-die variations are observed to be in general smaller than inter-die variations. This can be explained by the fact that, in terms of fabrication process, trench variations within a single die, and hence within a small region of the wafer, are expected to be smaller and thus have less influence on the resonant frequency.

Figure 25A:
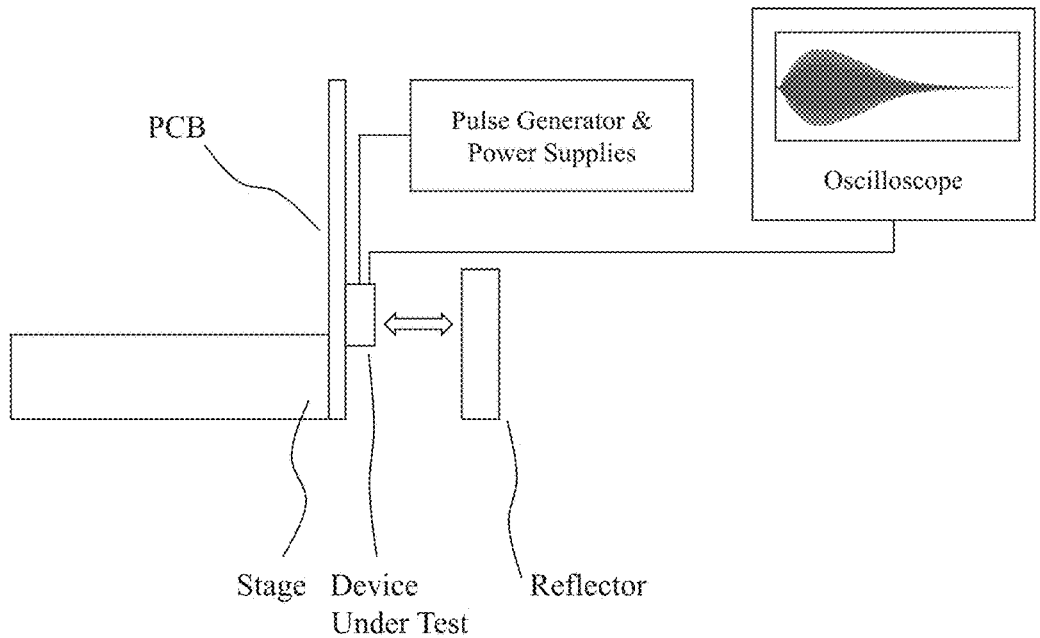
FIG. 25A depicts an experimental test configuration for performing ranging measurements with PMAUTs according to embodiments of the invention.

The improvement of intra-die resonant frequency accuracy provided by the toroidal topology makes it more feasible to use an array with multiple PMAUT elements for applications such as nondestructive testing (NDT), imaging and certain types of distance ranging. In this context, fabricated PMAUT devices from this work were used to perform ranging measurements, using the test setup shown in FIG. 25A. A translation stage was used to mount a supporting PCB in vertical position. A 4 period-long sine wave with a frequency of 1.4 MHz and an amplitude of 60 Vpp was used to drive a first PMAUT device in order to generate acoustic waves. A second PMAUT device on the same die, adjacent to the transmitting PMAUT device, was then used to detect the reflected acoustic signal. The received signal was measured using an oscilloscope.

Figure 25B:
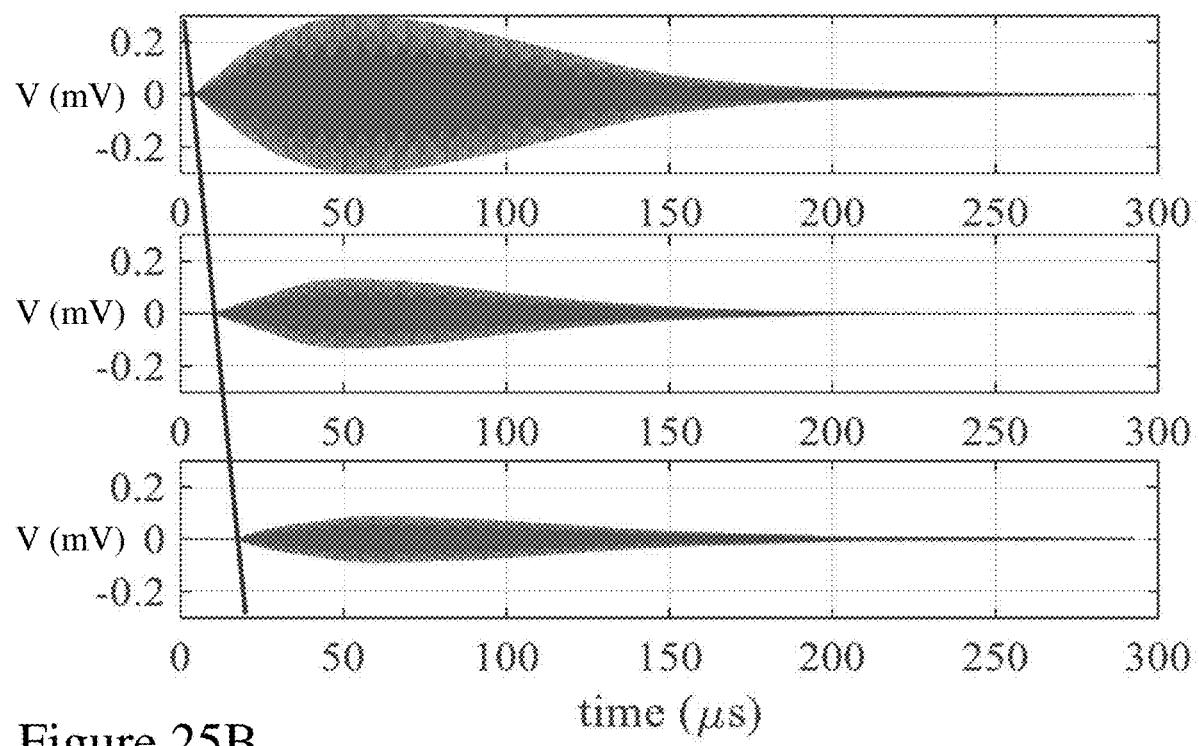
FIG. 25B depicts measurements of the received pulse for three different reflection distances, namely, 2 mm, 6 mm, and 8 mm using PMAUTs according to embodiments of the invention.
Figure 25C:
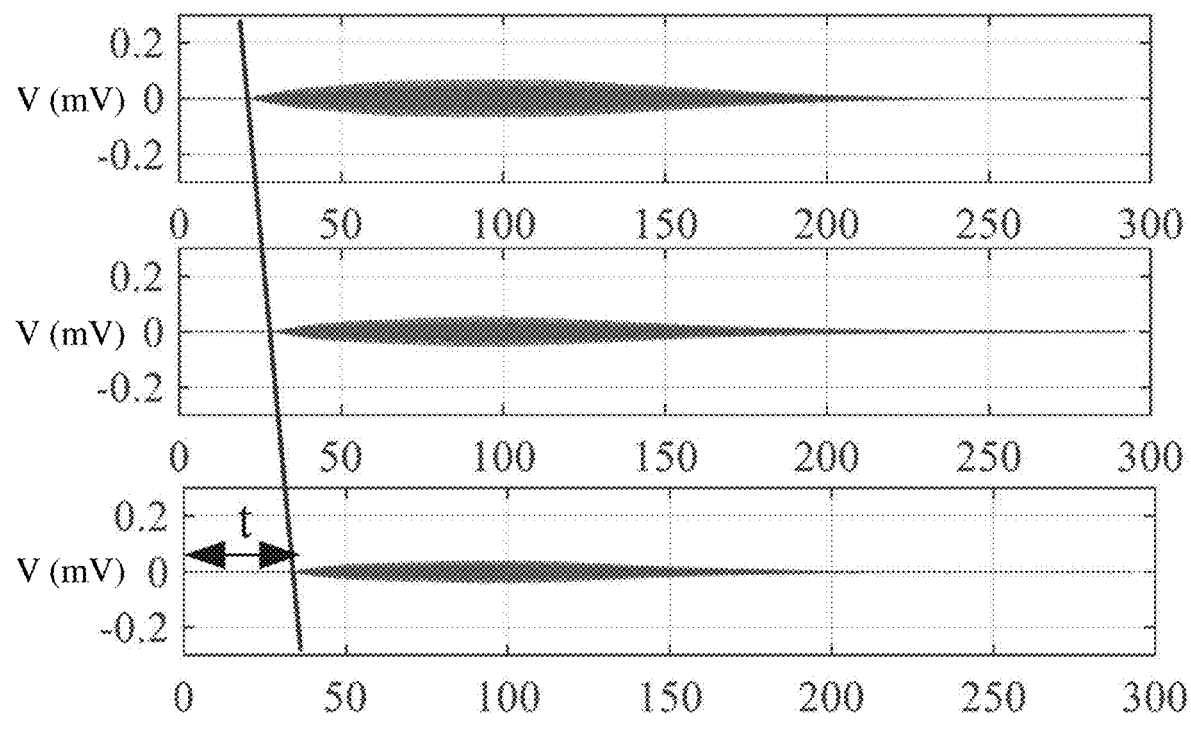
FIG. 25C depicts measurements of the received pulse for three different reflection distances, namely, 12 mm, 16 mm and 20 mm using PMAUTs according to embodiments of the invention.

The distance between transducers and reflector was varied and measurements were performed for separation distances ranging from 1 mm to 6 mm. The results are presented in FIGS. 25B and 25C with increasing separation. Travel distance can be calculated as d=((t·c)/2) where c is the speed of sound in air and t corresponds to the round trip travel time. This ranging measurement using different PMAUT devices showcases the anchoring technique effectiveness and allowing sufficiently matched resonant frequencies to enable ranging applications.

Accordingly, embodiments of the invention exploiting a toroidal anchoring technique show reduced resonant frequency dependency induced by DRIE process variations. The inter- and intra-die resonant frequency standard variations from a commercial foundry run were reduced from 101 kHz to 23 kHz and 20 kHz to 5.9 kHz respectively, by using the proposed anchoring topology.

It would be evident that within other embodiments of the invention the resonator membrane may be of a different geometry. Accordingly, embodiments of the invention may be employed in conjunction with resonator membranes that are square, rectangular, elliptical, hexagonal etc. In these situations, the inventors refer to the anchor as a peripheral anchor which is accordingly toroidal for circular membranes but may be square, rectangular, elliptical, hexagonal etc. to match resonator membranes that are square, rectangular, elliptical, hexagonal etc. Optionally, in some scenarios such as with square or rectangular membranes the peripheral anchor may employ anchors of different lengths in different orthogonal directions although this may be also be employed in other membrane geometries with different anchors in different directions relative to the membrane. Optionally, the number of anchors Optionally, within other embodiments of the invention piezoelectric excitation of the membrane may be replaced by another MEMS actuation methodology such as electrostatic actuation for example. Optionally, within other embodiments of the invention the MEMS resonator may be a piezoelectric bulk mode disk resonator, a clamped-clamped (C-C) beam resonator, a tuning fork resonator, or a Lame mode resonator for example. Optionally, within other embodiments of the invention the MEMS resonator may employ flexural modes, bulk modes, shear modes, or torsional modes for example. Optionally, within other embodiments of the invention the MEMS resonator may employ a single resonator or multiple coupled resonators.

Specific details are given in the above description to provide a thorough understanding of the embodiments. However, it is understood that the embodiments may be practiced without these specific details. For example, circuits may be shown in block diagrams in order not to obscure the embodiments in unnecessary detail. In other instances, well-known circuits, processes, algorithms, structures, and techniques may be shown without unnecessary detail in order to avoid obscuring the embodiments.

The foregoing disclosure of the exemplary embodiments of the present invention has been presented for purposes of illustration and description. It is not intended to be exhaustive or to limit the invention to the precise forms disclosed. Many variations and modifications of the embodiments described herein will be apparent to one of ordinary skill in the art in light of the above disclosure. The scope of the invention is to be defined only by the claims appended hereto, and by their equivalents.

Further, in describing representative embodiments of the present invention, the specification may have presented the method and/or process of the present invention as a particular sequence of steps. However, to the extent that the method or process does not rely on the particular order of steps set forth herein, the method or process should not be limited to the particular sequence of steps described. As one of ordinary skill in the art would appreciate, other sequences of steps may be possible. Therefore, the particular order of the steps set forth in the specification should not be construed as limitations on the claims. In addition, the claims directed to the method and/or process of the present invention should not be limited to the performance of their steps in the order written, and one skilled in the art can readily appreciate that the sequences may be varied and still remain within the spirit and scope of the present invention.

What is claimed is:

1. A method comprising:
    providing a microelectromechanical systems (MEMS) resonator for generating an acoustic signal comprising:
        providing a plurality of masses;
        providing a plurality of actuators, each of the plurality of actuators being coupled to a predetermined mass of the plurality of masses; wherein
    in a first configuration the plurality of actuators are each in a first state such the predetermined mass of the plurality of masses to which they are coupled are into physical contact with the MEMS resonator; and
    in a second configuration the plurality of actuators are each in a second state such the predetermined mass of the plurality of masses to which they are coupled are moved out of physical contact with the MEMS resonator.

2. The method according to claim 1, wherein
the plurality of actuators when transitioned from the second state to the first state reduce the time required for the acoustic output to drop by a predetermined amount relative to that obtained by terminating a drive signal to the MEMS resonator.

3. The method according to claim 1, wherein
at least one of:
    the plurality of masses engage the sides of a membrane of the MEMS resonator; and
    the plurality of masses engage at least one of the upper surface of the MEMS resonator and a lower surface of the MEMS resonator.

4. The method according to claim 1, wherein
the MEMS resonator is piezoelectrically excited.

5. The method according to claim 1, wherein said each of the plurality of actuators is coupled via a spring to the predetermined mass of the plurality of masses.

6. The method according to claim 1, wherein
the MEMS resonator further comprises:
    a membrane;
    a plurality of anchors; and
    a peripheral anchor; wherein
the membrane is disposed within the peripheral anchor;
the membrane is connected to the peripheral anchor by the plurality of anchors; and
a trench formed by etching through from a back surface of the substrate to release the membrane and the plurality of anchors extends under the peripheral anchor.

7. The method according to claim 6, wherein
the resonant frequency of the MEMS resonator has a reduced variation in resonant frequency with respect to the width of the etched trench than a MEMS resonator without the peripheral anchor.

8. The method according to claim 6, wherein
the MEMS resonator membrane comprises a piezoelectric layer disposed between a bottom electrode and a top electrode.

9. A method comprising:
fabricating a microelectromechanical systems (MEMS) resonator; wherein the
    fabricating is one of:
        fabricating the MEMS resonator by:
            establishing a resonance frequency of a predetermined mode of the MEMS resonator; and
            depositing a predetermined thicknesses of a conformal layer of a predetermined material to the top and sides of a resonant membrane of the MEMS resonator; wherein the predetermined thickness of the conformal layer of the predetermined material is established in dependence upon a difference between the established resonance frequency of the MEMS resonator and a target resonant frequency of the MEMS resonator;

fabricating the MEMS resonator as one of a plurality of MEMS resonators across a substrate and then executing a manufacturing process comprising the steps of:
  establishing a resonance frequency of a predetermined mode of a subset of the plurality of MEMS resonators;
  establishing a map relating to one or more of the frequencies, frequency offsets, and damping factors of the plurality of MEMS resonators across the substrate;
  establishing a plurality of regions within the map, each region defining one or more of a predetermined frequency offset range, a mean frequency offset, and a damping factor range of the MEMS resonators within that region from a target resonant frequency;
  depositing a plurality of predetermined thicknesses of a conformal layer of a predetermined material to the top and sides of a resonant membrane of each MEMS resonator of the plurality of MEMS resonators; wherein
  each predetermined thickness of the plurality of predetermined thicknesses of the conformal layer is established in dependence upon a region of the plurality of regions and applied to that region of the plurality of regions; and
  each predetermined thickness of the plurality of predetermined thicknesses of the conformal layer is established in dependence upon at least one of a difference between the mean frequency offset for that region of the plurality of regions and the target resonant frequency and the damping factor range for that region of the plurality of regions.

10. A device comprising:
a microelectromechanical systems (MEMS) resonator for generating an acoustic signal;
wherein
the MEMS resonator comprises:
  a plurality of masses; and
  a plurality of actuators, each of the plurality of actuators being coupled to a predetermined mass of the plurality of masses; wherein
  in a first configuration the plurality of actuators are each in a first position relative to the MEMS resonator such the predetermined mass of the plurality of masses to which they are coupled are moved into physical contact with the MEMS resonator; and
  in a second configuration the plurality of actuators are each in a second position relative to the MEMS resonator such the predetermined mass of the plurality of masses to which they are coupled are moved out of physical contact with the MEMS resonator.

11. The device according to claim 10, further comprising a plurality of springs, each spring disposed between the predetermined mass of the plurality of masses and a respective actuator of the plurality of actuators.

12. The device according to claim 10, wherein
when actuated the plurality of actuators transition from the second configuration to the first configuration such that the time required for an acoustic signal generated by the MEMS resonator to be reduced by a predetermined amount relative to that obtained by terminating a drive signal to the MEMS resonator is reduced.

13. The device according to claim 10, wherein
at least one of:
  the plurality of masses engage the sides of a membrane of the MEMS resonator; and
  the plurality of masses engage at least one of the upper surface of the MEMS resonator and a lower surface of the MEMS resonator.

14. The device according to claim 10, wherein
the MEMS resonator comprises a membrane; and
the membrane comprises at least a piezoelectric material.

15. The device according to claim 10, wherein
the MEMS resonator has a first resonance frequency of a predetermined mode of the MEMS resonator with a conformal coating forming part of a resonant membrane of the MEMS resonator; and
the MEMS resonator has a second resonance frequency of the predetermined mode of the MEMS resonator absent the conformal coating forming part of a resonant membrane of the MEMS resonator.

16. The device according to claim 15, wherein
the conformal coating is deposited upon one or more sides of the resonant membrane and an upper surface of the resonant membrane; and
the thickness of the conformal coating is established in dependence upon the difference between the second resonance frequency and the first resonance frequency.

17. The device according to claim 10, wherein
the MEMS resonator further comprises:
  a substrate;
  a membrane suspended relative to the substrate;
  a peripheral anchor surrounding a periphery of the membrane;
  a plurality of anchors coupling the membrane to the peripheral anchor at predetermined points; and
  a trench etched through the substrate beneath the membrane, the plurality of anchors and a portion of the peripheral anchor; wherein
  the trench extends laterally to a position under the peripheral anchor.

18. The device according to claim 17, wherein
a resonant frequency of the membrane is substantially independent of a tolerance to a lateral dimension of the etched final trench arising from process variations in the etching process.

19. The device according to claim 17, wherein
the trench releases the membrane and the plurality of anchors from the substrate.

20. A device comprising:
a microelectromechanical systems (MEMS) resonator for generating an acoustic signal;
wherein
the MEMS resonator has a first resonance frequency of a predetermined mode of the MEMS resonator with a conformal coating forming part of a resonant membrane of the MEMS resonator; and
the MEMS resonator has a second resonance frequency of the predetermined mode of the MEMS resonator absent the conformal coating forming part of a resonant membrane of the MEMS resonator.

21. The device according to claim 20, wherein
the conformal coating is deposited upon one or more sides of the resonant membrane and an upper surface of the resonant membrane; and
the thickness of the conformal coating is established in dependence upon the difference between the second resonance frequency and the first resonance frequency.

* * * * *